US010649048B2

(12) United States Patent
Yang et al.

(10) Patent No.: US 10,649,048 B2
(45) Date of Patent: May 12, 2020

(54) SINGLE LAYER MAGNETIC RESONANCE IMAGING (MRI) TRANSMIT/RECEIVE (TX/RX) RADIO FREQUENCY (RF) COIL WITH INTEGRATED SHIMMING

(71) Applicant: Quality Electrodynamics, LLC, Mayfield Village, OH (US)

(72) Inventors: Xiaoyu Yang, Indiana, PA (US); Haoqin Zhu, Mayfield Village, OH (US); Tsinghua Zheng, Chesterland, OH (US); Labros Petropoulos, Maple Grove, MN (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 161 days.

(21) Appl. No.: 15/964,390

(22) Filed: Apr. 27, 2018

(65) Prior Publication Data

US 2018/0313918 A1 Nov. 1, 2018

Related U.S. Application Data

(60) Provisional application No. 62/491,593, filed on Apr. 28, 2017.

(51) Int. Cl.
*G01R 33/36* (2006.01)
*G01R 33/3875* (2006.01)
(Continued)

(52) U.S. Cl.
CPC ... *G01R 33/3628* (2013.01); *G01R 33/34007* (2013.01); *G01R 33/3415* (2013.01);
(Continued)

(58) Field of Classification Search
CPC ............ G01R 33/3628; G01R 33/3875; G01R 33/3614; G01R 33/3664; G01R 33/3415;
(Continued)

(56) References Cited

U.S. PATENT DOCUMENTS 4,680,549 A 7/1987 Tanttu
4,825,162 A 4/1989 Roemer et al.
(Continued)

FOREIGN PATENT DOCUMENTS

WO 20150043612 A1 4/2015

OTHER PUBLICATIONS

Wang J., "A Novel Method to Reduce the Signal Coupling of Surface Coils for MRI", Proc. ISMRM 4:1434 (1996).
(Continued)

*Primary Examiner* — Dixomara Vargas
(74) *Attorney, Agent, or Firm* — Eschweiler & Potashnik, LLC

(57) ABSTRACT

A single-layer magnetic resonance imaging (MRI) radio frequency (RF) coil array configured to operate in a transmit (Tx) mode or in a receive (Rx) mode comprises at least one single-layer MRI RF coil array element configured to provide integrated $B_0$ field shimming. The at least one single-layer MRI RF coil array element includes a resonant LC coil, a matching Tx/Rx switch circuit, a magnitude/phase control component, and a preamplifier. The LC coil, upon resonating with a primary coil at the working frequency, generates a local amplified Tx field based on an induced current in the LC coil. The magnitude/phase control component is configured to independently adjust a magnitude or a phase of the induced current. The at least one single-layer MRI RF coil element may include a Tx field monitoring component configured to monitor the strength or phase of the local amplified Tx field.

30 Claims, 26 Drawing Sheets

(51) Int. Cl.
  *G01R 33/3415* (2006.01)
  *G01R 33/565* (2006.01)
  *G01R 33/34* (2006.01)
(52) U.S. Cl.
  CPC ......... *G01R 33/36* (2013.01); *G01R 33/3614* (2013.01); *G01R 33/3657* (2013.01); *G01R 33/3664* (2013.01); *G01R 33/3875* (2013.01); *G01R 33/5659* (2013.01); *G01R 33/34076* (2013.01)
(58) Field of Classification Search
  CPC ............ G01R 33/3657; G01R 33/5659; G01R 33/34007; G01R 33/36
  See application file for complete search history.

(56) References Cited

U.S. PATENT DOCUMENTS

| | | | |
|---|---|---|---|
| 4,987,370 A | 1/1991 | Leussler et al. | |
| 5,355,087 A | 10/1994 | Claiborne | |
| 5,386,191 A * | 1/1995 | McCarten | G01R 33/341 324/318 |
| 5,777,474 A | 7/1998 | Srinivasan | |
| 5,903,150 A | 5/1999 | Roznitsky | |
| 5,910,728 A | 6/1999 | Sodickson | |
| 6,249,121 B1 * | 6/2001 | Boskamp | G01R 33/34061 324/318 |
| 6,323,648 B1 | 11/2001 | Belt | |
| 6,529,005 B1 * | 3/2003 | Kasten | G01R 33/3873 324/319 |
| 6,791,328 B1 | 9/2004 | Nabetani | |
| 6,982,554 B2 | 1/2006 | Kurpad et al. | |
| 7,180,296 B2 | 2/2007 | Gross | |
| 7,663,367 B2 * | 2/2010 | Wiggins | A61B 5/055 324/318 |
| 9,097,769 B2 * | 8/2015 | Schillak | G01R 33/3607 |
| 9,274,189 B2 * | 3/2016 | Soutome | G01R 33/34076 |
| 9,459,331 B2 * | 10/2016 | Otake | G01R 33/365 |
| 9,541,614 B2 * | 1/2017 | Soutome | G01R 33/34076 |
| 9,638,771 B2 * | 5/2017 | Soutome | A61B 5/055 |
| 9,880,242 B2 * | 1/2018 | Darnell | G01R 33/3875 |
| 10,168,402 B2 * | 1/2019 | Gunamony | G01R 33/3415 |
| 10,261,145 B2 * | 4/2019 | Wald | G01R 33/3415 |
| 10,324,147 B2 * | 6/2019 | McNulty | G01R 33/3802 |
| 2002/0169374 A1 | 11/2002 | Jevtic | |
| 2010/0213941 A1 * | 8/2010 | Driesel | G01R 33/3415 324/322 |
| 2012/0223709 A1 * | 9/2012 | Schillak | G01R 33/3607 324/309 |
| 2012/0262173 A1 * | 10/2012 | Soutome | G01R 33/34076 324/309 |
| 2013/0119991 A1 * | 5/2013 | Soutome | A61B 5/055 324/322 |
| 2013/0314091 A1 * | 11/2013 | Otake | G01R 33/365 324/322 |
| 2015/0323628 A1 * | 11/2015 | Wald | G01R 33/341 324/309 |
| 2015/0338478 A1 * | 11/2015 | Schillak | G01R 33/3607 324/309 |
| 2016/0116556 A1 * | 4/2016 | Darnell | G01R 33/3875 324/307 |
| 2016/0209481 A1 * | 7/2016 | Gunamony | G01R 33/3415 |
| 2016/0231400 A1 * | 8/2016 | Fath | G01R 33/385 |
| 2016/0334479 A1 * | 11/2016 | Poole | A61B 5/0042 |
| 2017/0146622 A1 | 5/2017 | Yang et al. | |
| 2018/0081008 A1 | 3/2018 | Yang | |
| 2018/0275226 A1 | 9/2018 | Yang | |
| 2018/0275233 A1 | 9/2018 | Yang | |
| 2018/0275234 A1 * | 9/2018 | Han | A61B 5/4312 |
| 2018/0321339 A1 | 11/2018 | Yang | |
| 2018/0364318 A1 | 12/2018 | Yang | |

OTHER PUBLICATIONS

Jovan Jevtic, "Ladder Networks for Capacitive Decoupling in Phased-Array Coils", Proc. Intl. Soc. Mag. Reson. Med 9 (2001).
Klaas P. Pruessmann et al, "SENSE: Sensitivity Encoding for Fast MRI", Magnetic Resonance in Medicine 42:952-962 (1999).
Ulrich Katscher et al, "Transmit SENSE", Magnetic Resonance in Medicine 49:144-150 (2003).
U.S. Appl. No. 16/009,546, filed Jun. 15, 2018.
Notice of Allowance dated Apr. 10, 2019 in connection with U.S. Appl. No. 15/583,345.
W. Wang, et al., "Inductive Coupled Local TX Coil Design", Proc. Intl. Soc. Mag. Reson. Med. 18 (2010).
International Search Report and Written Opinion dated Nov. 9, 2017 in connection with International Patent Application No. PCT/US2017/042590.
U.S. Appl. No. 15/706,005, filed Sep. 15, 2017.
U.S. Appl. No. 15/583,345, filed May 1, 2017.
U.S. Appl. No. 15/933,860, filed Mar. 23, 2018.
U.S. Appl. No. 15/923,437, filed Mar. 16, 2018.
U.S. Appl. No. 15/971,075, filed May 4, 2018.
Non-Final Office Action dated Nov. 8, 2018 in connection with U.S. Appl. No. 15/583,345.
Non-Final Office Action dated Nov. 18, 2019 in connection with U.S. Appl. No. 15/706,005.

* cited by examiner

SINGLE LAYER MAGNETIC RESONANCE IMAGING (MRI) TRANSMIT/RECEIVE (TX/RX) RADIO FREQUENCY (RF) COIL WITH INTEGRATED SHIMMING

RELATED APPLICATIONS

This application claims priority to and the benefit of U.S. Provisional Patent Application 62/491,593, filed Apr. 28, 2017.

BACKGROUND

A magnetic resonance imaging (MRI) system generates a static magnetic field $B_0$. The magnetic field $B_0$ produced by the MRI system will suffer from a degree of inhomogeneity. The homogeneity of the magnetic field $B_0$ may vary due to design limitations of the MRI system, or compromises made in the manufacturing of the MRI system. A patient being imaged by an MRI system introduces further inhomogeneity to the $B_0$ field due to variations in tissue composition within a region of tissue being imaged. For example, the degree of inhomogeneity may increase due to susceptibility differences at tissue boundaries within the region of tissue being imaged. The degree of inhomogeneity may also increase due to physiological processes that may occur within the region of tissue being imaged during an MRI procedure, including respiration, cardiac motion, and other physiological processes. These $B_0$ field inhomogeneities may cause a variety image artifacts which reduce the image quality of the image acquired. As the $B_0$ field strength increases, (e.g., from 1.5 T to 7 T) these issues may become more severe.

To address the inhomogeneities in the static $B_0$ field, an MRI system is fitted with additional $B_0$ field correction coils to correct the inhomogeneities in the $B_0$ field. This is called "shimming" and the field correction coils are called $B_0$ shimming coils. There are several approaches to implementing $B_0$ shimming coils. A first conventional approach is to build $B_0$ shimming coils into the MRI system itself. Most commercial MRI systems have $B_0$ shimming coils built into the MRI system near the system gradient coils. This approach may be termed "global shimming". A disadvantage to this global shimming approach is that the $B_0$ shimming coils built into the MRI system near the system gradient coils are large and relatively far away from anatomy being imaged, and thus require a high electric current to effectively shim the $B_0$ field. Furthermore, large built-in $B_0$ shimming coils are difficult to dynamically control due to their size, and are not interchangeable from patient to patient.

A second conventional approach to addressing the inhomogeneity of the static $B_0$ field is to use a small dedicated shimming coil placed just outside an RF coil used to image a particular anatomy. This second approach requires less electrical current than the first approach, but, since most commercial MRI systems already have the built-in $B_0$ shimming coils, this reduction in electrical current may be offset by that used by the built-in $B_0$ shimming coils. Additionally, this approach requires a large number of shimming coils that will often completely cover the target anatomy, resulting in a claustrophobic situation for the patient being imaged. Thus, this approach is less than optimal in a clinical situation.

A third conventional approach is to use each RF coil element in an RF coil (e.g., a transmit/receive (Tx/Rx) coil) as a $B_0$ shimming element. In this approach, a shimming current is allowed to flow in the same current path of the Tx/Rx coil, and the shimming current of each RF coil element is controlled by the MRI system to achieve an improved $B_0$ field homogeneity. This third approach improves on the second approach by eliminating some of the excess structure required in the second approach, thereby reducing the cost. Additionally, since the $B_0$ shimming coil shares the same current path as the RF coil, the opening of the RF coil can be kept unchanged, thus mitigating the claustrophobic conditions created by the second approach. However, this approach has drawbacks. First, this approach requires its own dedicated Tx power amplifiers for use in a parallel Tx (pTx) application. Alternately, this approach needs a higher RF power for the associated whole body coil (WBC) used by the MRI system in a non-pTx application.

An MRI system may include two kinds of MRI RF coils. The first kind of MRI RF coil is a transmit (Tx) coil. A Tx coil, while operating in Tx mode, transmits high power RF energy into the anatomy of the subject being imaged to excite nuclei spins in the tissue being imaged. The second kind of MRI RF coil is a receive (Rx) coil. An Rx coil, while operating in Rx mode, detects weak signals from nuclei spins of the anatomy being imaged. A conventional MRI system uses a built-in WBC as a Tx coil. In a conventional MRI system, due to the geometric size of the WBC, the WBC applies RF energy to a much larger region of tissue than is required to image a given region of interest. For example, when a head scan is performed and a WBC is used, not only the head, but also the shoulders and chest also receive a high level of RF energy. This creates a high level specific absorption rate (SAR) issue which limits the clinical utility of MRI systems that use a conventional WBC/Rx coil approach. As a result, a local Tx coil is frequently used to mitigate the SAR problem.

A local Tx coil is designed to apply RF energy into only the anatomy being imaged. There are two conventional approaches to transmitting energy from a power source to a local Tx coil. A first conventional approach is to use a direct connection between the power source to the Tx coil using wires. A direct connection using wires is energy efficient because the energy loss in the connection wires is trivial. A disadvantage of direct connection using wires is that dedicated wiring is required, which increases the cost and complexity of the coil.

A second conventional approach to transmitting energy from a power source to a local Tx coil is to use inductive coupling. In the inductive coupling approach, a primary coil is directly connected to a power source. The primary coil may be a WBC or another large coil. The primary coil is a resonant LC circuit. A smaller second coil (i.e., a local coil) is also used. The second coil is another resonant circuit and is inductively coupled to the primary coil. Thus, energy can be transferred from the primary coil to the second coil. The second coil can be used to excite nearby anatomy more efficiently than the WBC because the second coil is smaller and closer to the nearby anatomy than the WBC. Compared to the first approach using a direct connection with wires, the inductive coupling approach may be less energy efficient than direct wiring but is still more efficient than a conventional WBC. One benefit of the inductive coupling approach is that no special wiring is required. However, conventional inductive coupling approaches require the use of multiple coils. For example, a conventional inductively coupled knee coil uses two layers of RF coils. The first (inner) layer includes a plurality of Rx coil elements which detect signals from the anatomy while operating in Rx mode, and which are decoupled from the transmitting field while operating in Tx mode. The second (outer) layer is typically a standard birdcage coil that inductively couples to a WBC to create a local amplified transmitting field in Tx mode and which is disabled in Rx mode. However, this conventional inductively coupled dual layer coil has drawbacks. For example, all the individual Rx coil elements in a conventional dual layer coil need associated circuits for decoupling the Rx coil and the local Tx coil while operating in Tx mode. Conventional inductively coupled dual layer coils also require circuits for switching off the Tx coil while operating in Rx mode, which requires complex and expensive control circuitry. This leads to complex and expensive coils. These multiple decoupling circuits and complex control circuits can also decrease the signal to noise ratio (SNR), thereby reducing image quality. Furthermore, the outer layer, by its proximity to the inner layer, will create additional noise when the inner layer is operating in Rx mode.

A challenge in implementation of single-layer MRI RF coils is the absolute control of the SAR in any given scenario. Since a single-layer MRI RF coil is inductively coupled to the WBC, SAR patterns may be unpredictable. This unpredictability may increase if a single-layer MRI RF coil array element that is part of a single-layer MRI RF coil array is damaged.

DETAILED DESCRIPTION

Figure 1:
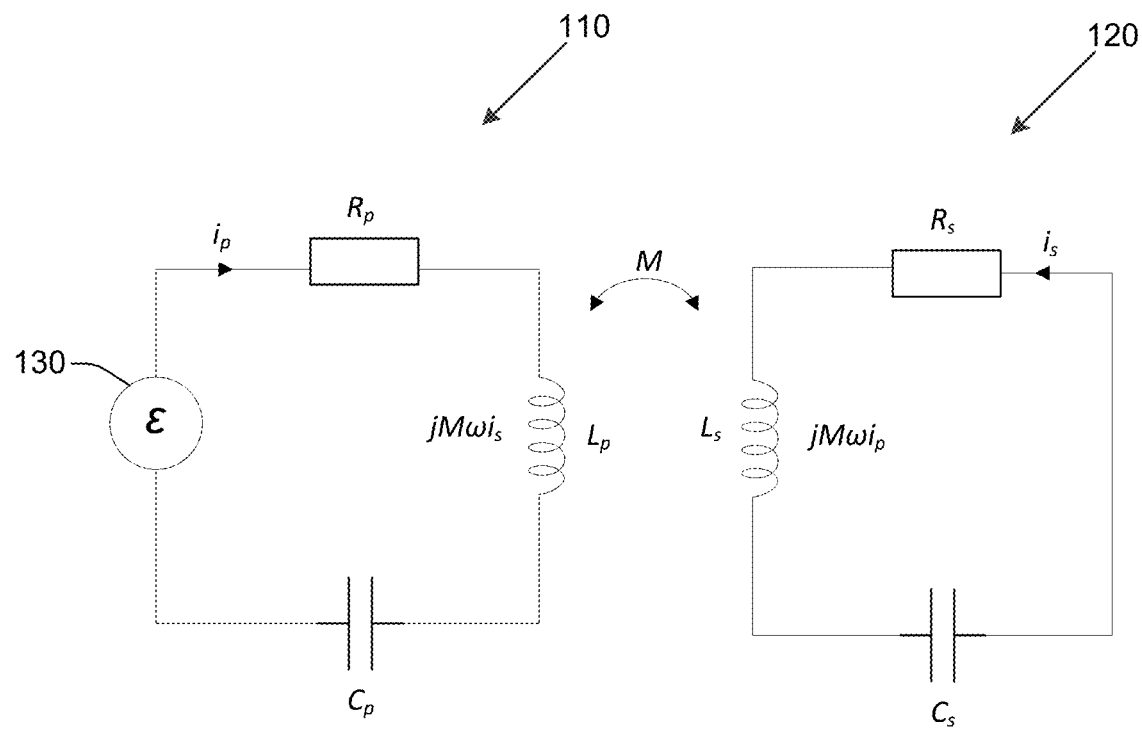
FIG. 1 illustrates inductively coupled resonant RF coils.

Embodiments described herein include single-layer MRI RF coil arrays and coil array elements configured to generate an amplified local Tx field using inductive coupling between a WBC and a local single-layer MRI RF coil array or single-layer MRI RF coil array element, and to provide integrated $B_0$ field shimming to reduce $B_0$ field inhomogeneities. Embodiments employ RF chokes connected in parallel with breaking point capacitors in a single-layer MRI RF coil array element. The RF chokes connected in parallel with the breaking point capacitors permit a pulsed shimming current to pass through a current path provided by the single-layer MRI RF coil array element. Embodiments inject a $B_0$ shimming current into the MRI RF coil array element at an injection point. Embodiments control the $B_0$ shimming current such that the $B_0$ shimming current does not flow to a transmit/receive switch of the MRI RF coil array element, so that the $B_0$ shimming current does not interfere with transmit/receive switch current. In one embodiment, the $B_0$ shimming current is prevented from flowing to the transmit/receive switch by a DC blocking capacitor connected between the transmit/receive switch and the $B_0$ shimming current path. Embodiments achieve a lower Tx power requirement than conventional approaches, a higher Rx SNR, and higher $B_0$ field uniformity.

Embodiments described herein include an MRI RF coil assembly configured to operate in a Tx mode or an Rx mode. The MRI RF coil assembly includes a housing having a volume. In one embodiment, the MRI RF coil assembly includes a housing having a substantially cylindrical shape. In one embodiment, the housing may have an inner circumference and an outer circumference that define a volume between the inner circumference and the outer circumference. The MRI RF coil assembly includes a single-layer MRI RF coil array mounted within the volume defined by the inner circumference and the outer circumference of the housing. The single-layer MRI RF coil array includes at least one single-layer MRI RF coil array element that may inductively couple with a primary coil. Upon the at least one single-layer MRI RF coil array element resonating with a primary coil, the single-layer MRI RF coil array generates a local amplified Tx field based on an induced current in the at least one single-layer MRI RF coil array element. The induced current is generated by inductive coupling between the at least one single-layer MRI RF coil array element and the primary coil. The MRI RF coil assembly includes a localized $B_0$ field shim set mounted with the single-layer MRI RF coil array. The localized $B_0$ field shim set may be mounted on the outer circumference of the single-layer MRI RF coil array. The localized $B_0$ field shim set is configured to generate a localized $B_0$ magnetic field upon injection of a DC shimming current into the localized $B_0$ field shim set.

Embodiments described herein may also include hardware monitoring of a $B_1$ field generated by example MRI RF coil arrays during a Tx mode. A challenge with single-layer MRI RF coil arrays and single-layer MRI RF coil array elements is controlling SAR, including the absolute SAR, in different scenarios. Since single-layer MRI RF coil arrays and single-layer MRI RF coil array elements are inductively coupled to the WBC and generate the transmit $B_1$ field through the inductive coupling, the SAR patterns may be difficult to predict. The level of unpredictability may increase to unmanageable levels if one or more of the MRI RF coil array elements in an MRI RF coil array is damaged. In clinical situations, it is desirable to know the magnitude and phase of the $B_1$ field generated by each MRI RF coil array element during the Tx mode. Additionally, there is a safety issue to stop the transmission upon detection of threshold levels of current or $B_1$ field.

In one embodiment that includes hardware monitoring of a $B_1$ field, an MRI RF coil array element includes a Tx field monitoring component that may include a pickup loop. For example, an MRI RF coil element may be configured as a printed circuit board (PCB), and a butterfly pickup loop may be integrated with the PCB design of the MRI RF coil element. For a given $B_1$ field, an induced voltage or current is generated on the butterfly pickup loop. The butterfly pickup loop is electrically connected to a monitoring device, which may be connected to an MRI system. The value of the induced voltage or current is monitored by the monitoring device. If the value of the induced current or voltage meets or exceeds a threshold value (e.g., 1V, 2V, or other value), the monitoring device may signal the controlling MRI system to stop transmission or to shut down the MRI system. The threshold value may be based on the size of the pickup loop. For example, for an average $B_1$ field amplitude picked up by the pickup loop with an area A, where the working angular frequency is represented by $\omega_0$, then the induced voltage in the pickup loop is $B_1 * \omega_0 * A * \cos(\alpha)$ where $\alpha$ is the angle between $B_1$ and the area vector. In one example, the induced voltage may be 1V, 2V, or another voltage based on particular properties of the MRI RF coil element, the MRI RF coil array, the MRI system, or the imaging procedure. In one embodiment, an attenuator and an RF switch are connected in series between the butterfly pickup loop and the monitoring device. The attenuator prevents damage to the MRI system by the induced voltage or current. The attenuator may be, for example a 30 dB attenuator. The RF switch activates the butterfly pickup loop during transmission. In other embodiments, other types of pickup loops may be employed, including a simple loop pickup coil.

In one embodiment, the Tx field monitoring component is further configured to monitor the phase of the induced current. In parallel transmission (pTx), both signal amplitude (strength or magnitude) and phase are important to each channel. Embodiments described herein may be used for pTx applications. Amplitude and phase of the induced current are therefore information that may be important to safe operation of an MRI system. The induced signal from the pickup loop is an AC signal. The induced signal thus already includes both magnitude and phase. To confirm that the B1 field is correct or within acceptable parameters, embodiments may be configured to confirm that both magnitude and phase are correct or within desired parameters.

A discussion of exemplary single layer MRI RF coil arrays and single layer MRI RF coil array elements suitable for use by embodiments described herein now follows.

FIG. 1 illustrates an RF coil 110 and an RF coil 120. Coil 110 and coil 120 are resonant RF coils and are inductively coupled to each other. Coil 110 and coil 120 may be part of an MRI system. In this example, coil 110 operates as a primary coil and is driven by RF amplifier ε 130. Coil 120 operates as a secondary coil. Secondary coil 120 is inductively coupled to the primary coil 110 by mutual inductance M. Secondary coil 120 is driven by the mutual inductively coupled RF power from the primary coil 110. The primary coil 110 is, in this example, a WBC, while the secondary coil 120 is a local inductively coupled smaller coil. For the primary coil 110, $R_p$, $C_p$, and $L_p$ are defined as the coil loss resistance, the equivalent coil breaking point capacitance, and the equivalent total coil inductance respectively. The RF amplifier ε 130 is defined as an equivalent RF voltage source from an RF power amplifier through a matching circuit, which is not illustrated for clarity. The resistive loss from the RF amplifier ε 130 is absorbed by $R_p$, which may be pre-defined for simplicity of calculation. The mutual inductance between primary coil 110 and secondary coil 120 is defined as M. The resistive loss, the equivalent breaking point capacitance, and the total inductance of secondary RF coil 120 are defined as $R_s$, $C_s$, and $L_s$ respectively. The RF current through primary coil 110 is defined as $i_p$, and the RF current through secondary coil 120 is defined as $i_s$. Mutual inductance between primary RF coil 110 (e.g. $L_p$) and secondary RF coil 120 (e.g. $L_s$) generates an induced voltage on primary coil 110 $L_p$, which may be expressed as $+/-j\omega M i_s$. The sign of $j\omega M i_s$ is determined by the polarity between primary coil 110 and secondary coil 120. For clarity of exposition, the positive sign is used in this example. Similarly, the mutual inductance between secondary coil 120 and primary coil 110 generates an induced voltage on secondary coil 120, which may be expressed as $+/-j\omega M i_p$. The sign is the same for both primary coil 110 and secondary coil 120.

Using Kirchhoff's law, primary coil 110 and secondary coil 120 represented in FIG. 1 may be described by equation 1 below:

for primary coil 110: $Z_p i_p + j\omega M i_s = \varepsilon$ for secondary coil 120: $j\omega M i_p + Z_s i_s = 0$ (Eq. 1), where $$Z_p = R_p + j\left(\omega L_p - \frac{1}{\omega C_p}\right) \text{ and } Z_s = R_s + j\left(\omega L_s - \frac{1}{\omega C_s}\right),$$

where Z represents impedance.

Equation 1 may be re-written in matrix format, resulting in:

$$\begin{pmatrix} Z_p & j\omega M \\ j\omega M & Z_s \end{pmatrix} \begin{pmatrix} i_p \\ i_s \end{pmatrix} = \begin{pmatrix} \varepsilon \\ 0 \end{pmatrix} \quad \text{(Eq. 2)}$$

Thus, the solution to equation 2 is:

$$\begin{pmatrix} i_p \\ i_s \end{pmatrix} = \frac{1}{Z_p Z_s + \omega^2 M^2} \begin{pmatrix} Z_s \varepsilon \\ -j\omega M \varepsilon \end{pmatrix} \quad \text{(Eq. 3)}$$

where $$i_p = \frac{Z_s \varepsilon}{(Z_p Z_s + \omega^2 M^2)} \text{ and } i_s = \frac{-j\omega M \varepsilon}{(Z_p Z_s + \omega^2 M^2)}.$$

If both the primary coil 110 and the secondary coil 120 resonate at the same frequency, then $Z_p = R_p$, and $Z_s = R_s$. Thus $$i_p = \frac{R_s \varepsilon}{(R_p R_s + \omega^2 M^2)} \text{ and } i_s = \frac{-j\omega M \varepsilon}{(R_p R_s + \omega^2 M^2)}.$$

Recall that the phase of $i_s$ is opposite to the phase of $i_p$, per Lenz's Law. The ratio between $i_s$ and $i_p$ is $-j\omega M/R_s$. The secondary coil 120's quality factor (Q) may be high, i.e., the value of $R_s$ may be small. Therefore the ratio between current $i_s$ and $i_p$ may be large. Furthermore, because secondary coil 120 is smaller than primary coil 110 and is also closer to the imaging area than primary coil 110, the same magnitude of RF current generates a larger magnetic transmitting field at the area being imaged. Thus, a local inductive coil is significantly more power efficient than a large WBC coil and the local inductive coil's current is dominant compared to the primary coil's current even though their phases are opposite to each other. Furthermore, if a local inductive coil such as secondary coil 120 does not resonate at the frequency of primary coil 110, then the induced current $i_s$ in secondary coil 120 can be written as:

$$i_s = \frac{-j\omega M \varepsilon}{\left(R_p R_s + \omega^2 M^2 + jR_p\left(\omega L_s - \frac{1}{\omega C_s}\right)\right)} \quad \text{(Eq. 4)}$$

As shown in Eq. 4, the frequency deviation of secondary coil 120 from primary coil 110 can reduce the magnitude of $i_s$ and change the phase of $i_s$. This approach may be used by embodiments described herein to reduce the local coil 120's RF power efficiency if a particular MRI application requires it. For example, as demonstrated by Eq. 4, the induced current $i_s$ is a function of a coil loss resistance of primary coil 110, a coil loss resistance of secondary coil 120, or a difference between a working frequency of primary coil 110 and a resonant frequency of secondary coil 120. Thus, embodiments described herein may independently adjust a magnitude of the induced current in a local coil (e.g. secondary coil 120), or a phase of the induced current in a local coil (e.g. secondary coil 120) by adjusting the coil loss resistance of the primary coil (e.g. primary coil 110), the coil loss resistance of the secondary coil (e.g. secondary coil 120), or the difference between the working frequency and the resonant frequency. Embodiments described herein may therefore also adjust the magnitude of local Tx field generated by a single layer MRI RF coil operating in Tx mode.

Embodiments described herein include a single-layer MRI RF coil array that employs a single-layer approach to achieve a local inductively coupled Tx transmitter from a plurality of Rx receivers. An example single-layer MRI RF coil array may operate in a Tx mode or an Rx mode. In Rx mode the single-layer MRI RF coil array functions as a plurality of Rx receivers. In Tx mode multiple PIN diodes may be used to re-configure all or less than all the plurality of Rx receivers so that either all or less than all of the plurality of Rx receivers may inductively couple to the WBC and amplify the transmit field. Under this single-layer approach there are multiple approaches that may be employed by embodiments described herein to create a Tx field with a local inductively coupled coil.

Figure 2:
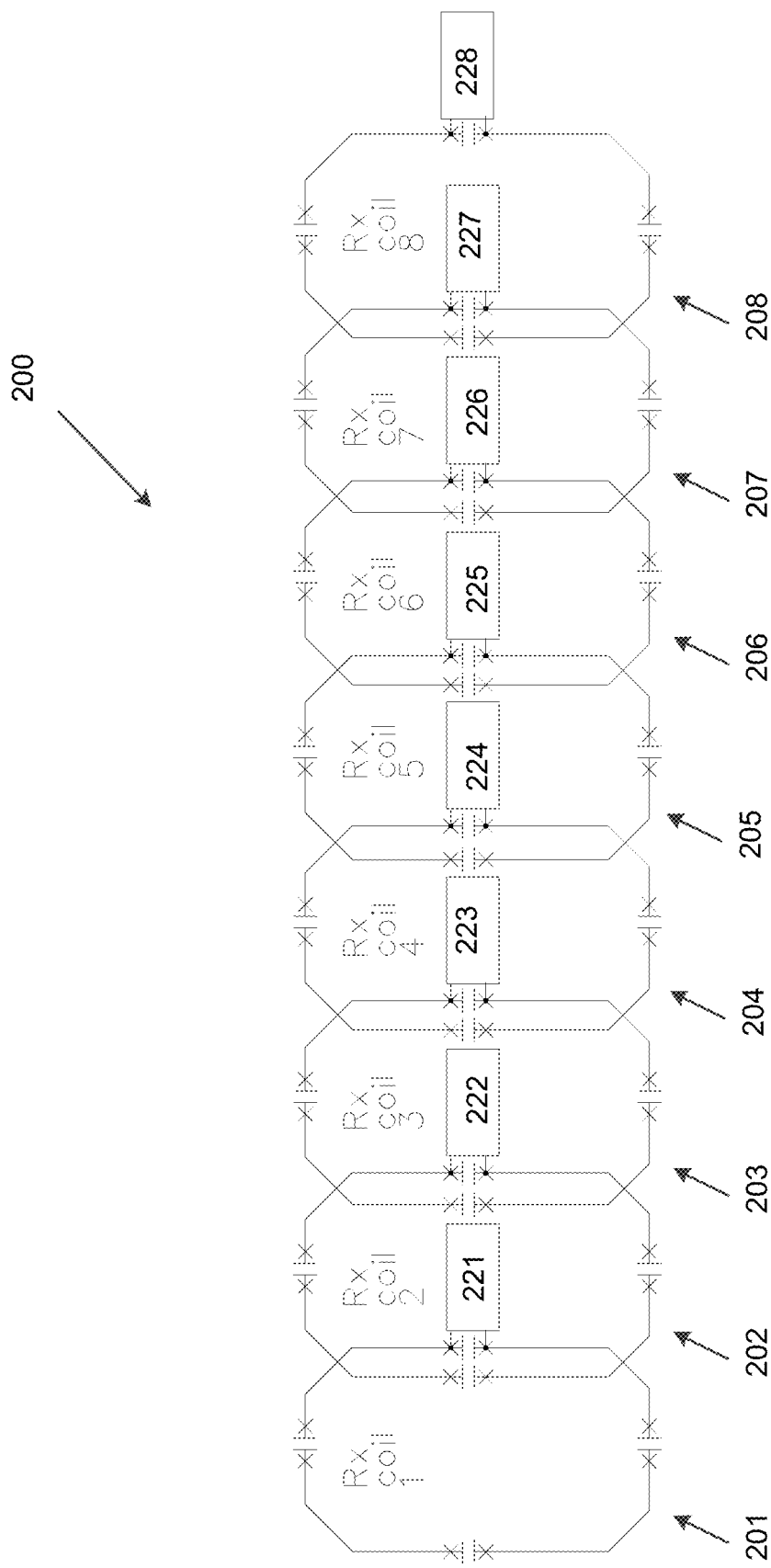
FIG. 2 illustrates a circuit diagram of an eight-rung birdcage coil.

A first single-layer approach is to use PIN diodes to configure a plurality of Rx coils together to create a local volume coil, such as a birdcage coil, and to inductively couple the local volume coil to a larger WBC. This first approach may be demonstrated by an example Rx coil that includes 8 loops configured as independent receivers on a cylindrical former. In examples described herein, a loop is considered to be an RF coil element, or RF coil array element. FIG. 2 is a diagram of an example 8-loop coil 200 in Rx mode. 8-loop coil 200 includes loops 201-208. In this example, a loop serves as an independent receiver, and includes receive electronics 221-228 respectively. Between directly neighboring loops (e.g. loops 202, 203, 204), the directly neighboring loops overlap each other to achieve good isolation, i.e., minimum mutual inductance. Good isolation between loops can also be achieved by using capacitors.

Figure 3:
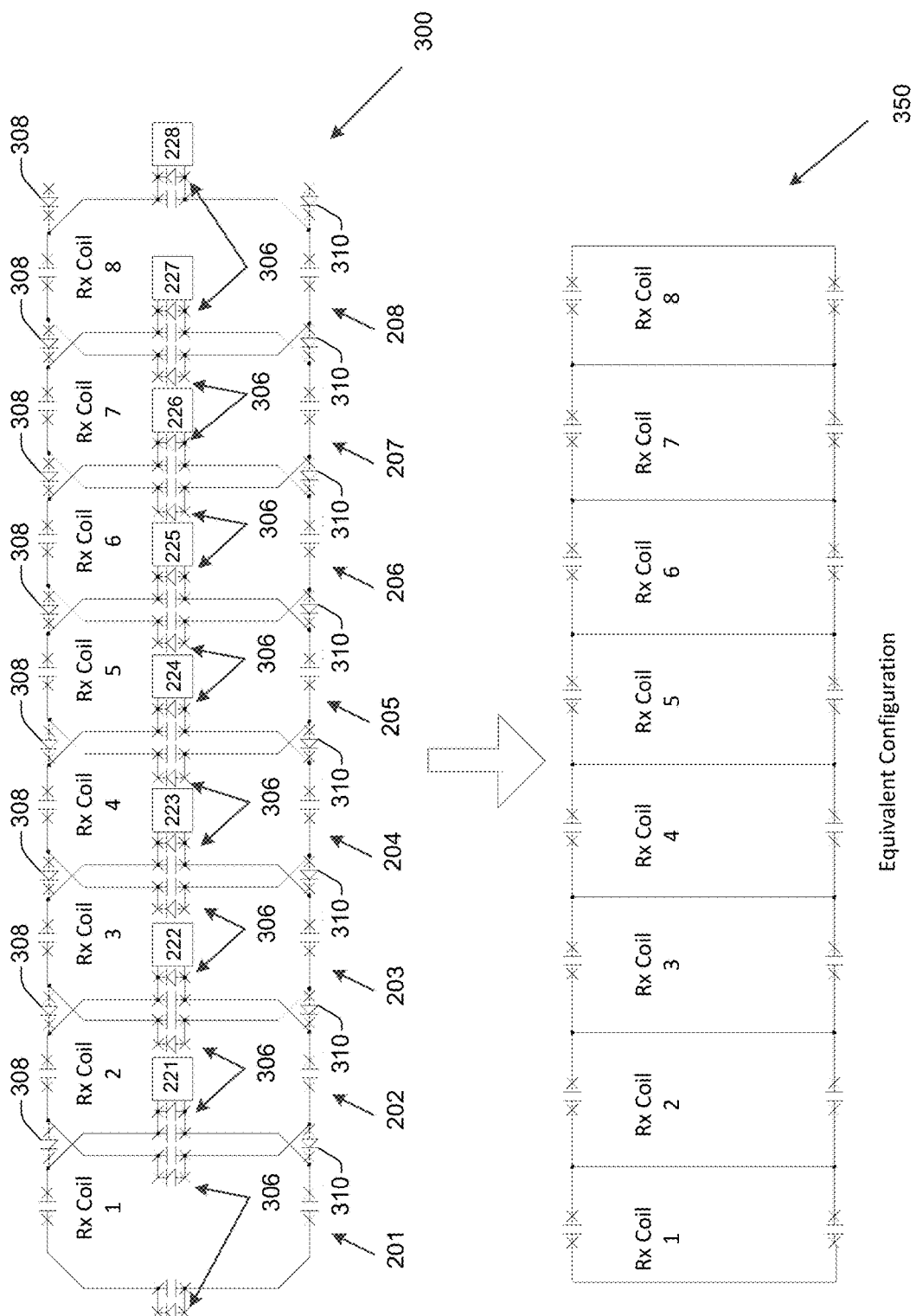
FIG. 3 illustrates a circuit diagram of an eight-rung birdcage coil and equivalent circuit.

FIG. 3 illustrates an Rx coil 300 that is similar to Rx 8-loop coil 200 illustrated in FIG. 2, but with additional elements and details. Rx coil 300 includes multiple PIN diodes 306, 308, and 310. A PIN diode has low impedance (e.g. is shorted) when it is forward biased by a DC power supply. In Tx mode the PIN diodes 306, 308, and 310 are forward biased. The circuitry supporting the PIN diodes 306, 308, and 310, such as RF chokes, is not illustrated in FIG. 3 for clarity. If all PIN diodes 306, 308, and 310 are shorted due to the application of a forward bias, then the circuit of the coil 300 is changed to the equivalent circuit 350. The equivalent circuit 350 illustrates an 8-rung birdcage coil that will inductively couple to a WBC in Tx mode and amplify the transmitting field and increase the efficiency of the WBC. In summary, the first approach of single-layer technology uses PIN diodes to reconfigure all or some of the Rx coil elements in a plurality of Rx coil elements into a local volume coil to increase WBC efficiency using inductive coupling, and to electrically link Rx coil elements together as one larger inductively coupled Tx coil. This first, conventional approach may be sub-optimal for two reasons. A first reason is that many diodes are required to link different Rx coils together. This increases the complexity of the coils. Therefore, this first, conventional approach may be expensive. The other reason is that even though PIN diodes are considered to be shorted when a forward bias is applied to the PIN diodes, the resistive losses of the PIN diodes are not trivial. A typical value of a forward biased PIN diode is 0.5 Ohm. This 0.5 Ohm could be larger than the coil loss itself for some high Q coils. This additional PIN diode resistive loss reduces the local inductively coupled RF coil's power efficiency.

Example embodiments described herein employ a second, different single-layer approach that uses PIN diodes to facilitate switching an Rx coil element into Tx mode so that all or part of all the Rx elements in a plurality of Rx elements can inductively couple to a WBC individually. In this approach, unlike in the first conventional approach, there are no PIN diodes between Rx elements (e.g., loops, RF coil elements) to link the Rx elements together. When forward-biased, a PIN diode may produce a negligible resistance (e.g., ~0.1Ω), which is essentially a short-circuit. When reverse-biased, a PIN diode may produce a high resistance (e.g., ~200 kΩ) in parallel with a low capacitance (e.g., ~2 pF), which is essentially an open-circuit.

An analysis of the induced current in the Rx elements of an array when operating in Tx mode illustrates the operation of the second approach employed by embodiments described herein. In this analysis it is assumed that the couplings among Rx elements are small and can be ignored. The couplings between Rx elements and the WBC are dominant. For example, the WBC field will induce voltage in one element and generate current flow in that element. That current flow will generate its own field. This additional field will induce voltage on this element's neighbors, including direct or indirect neighbors. This additional induced voltage is ignored in this analysis for clarity of exposition because of the assumption that the couplings among Rx elements are small.

Figure 4:
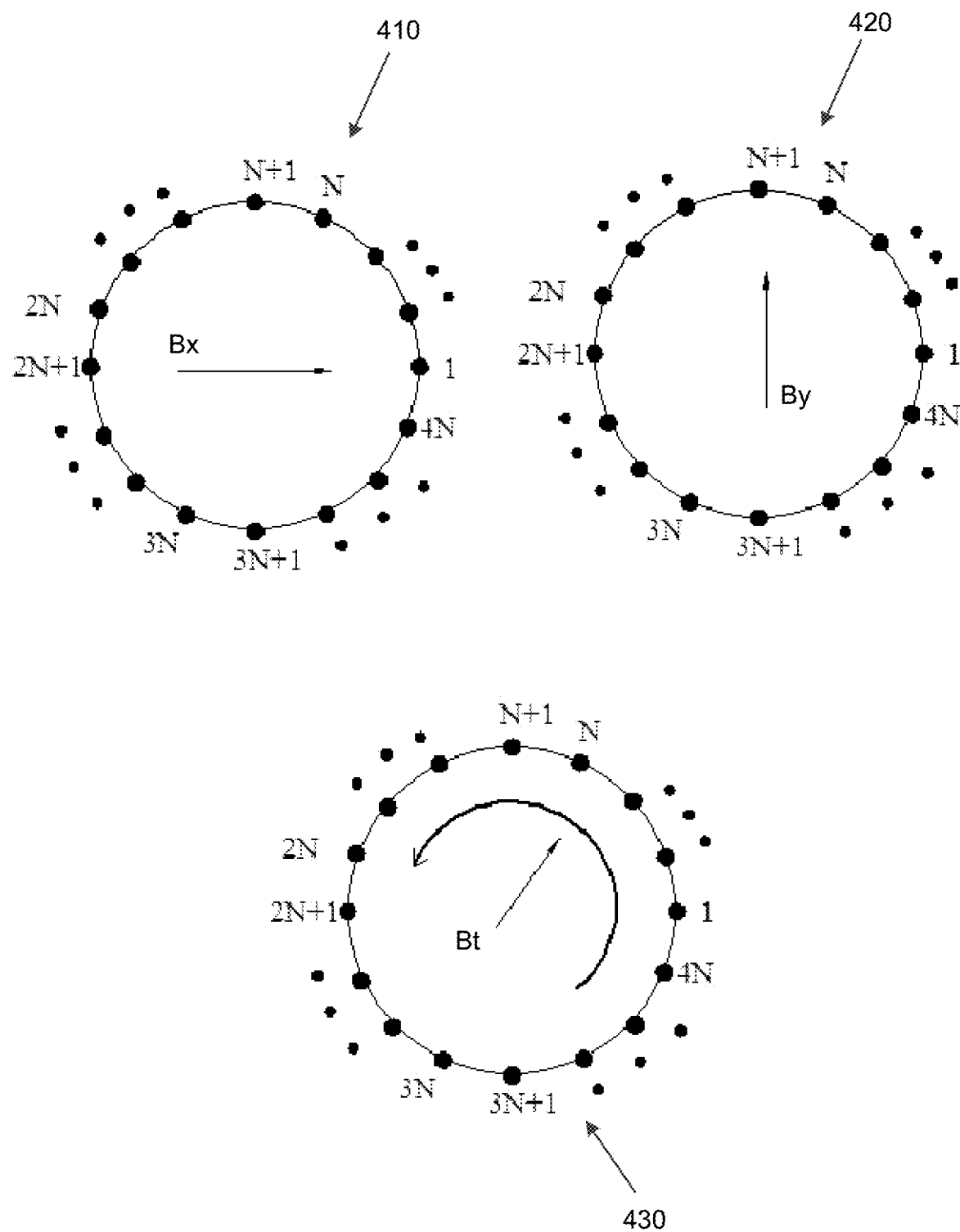
FIG. 4 illustrates current distribution through a birdcage coil.

FIG. 4 illustrates current distribution through rungs of a 4N-rung birdcage coil in circular polarized (CP) mode. Current distribution for a B field in the horizontal direction ($B_x$) is illustrated at 410. For a B field in the horizontal direction ($B_x$) the current through a rung k can be written as:

$$I_{kx} = I_0 \sin\left(\frac{2\pi}{4N}k\right)\sin(\omega_0 t) \quad \text{(Eq. 5)}$$

where k is the rung number (k=1, . . . , 4N) and $\omega_0$ is the working frequency.

Current distribution for a B field in the vertical direction ($B_y$) is illustrated at 420. For a B field in the vertical direction ($B_y$) the current through a rung k can be written as $$I_{ky} = \pm I_0 \cos\left(\frac{2\pi}{4N}k\right)\cos(\omega_0 t) \quad \text{(Eq. 6)}$$

For current distribution for a B field in the vertical direction ($B_y$), the time domain function is cosine instead of sine due to the circular polarized mode requirement. Furthermore, the "±" symbol indicates that the direction of $B_y$ may be upward or downward. This affects the rotational direction of the final circular polarized B field, illustrated at 430, by making the final circular polarized B field rotate either clockwise or counterclockwise. The total current through a rung k is the sum of the two currents described in equation 5 and equation 6. Therefore:

$$I_k = \quad \text{(Eq. 7)}$$
$$I_0 \sin\left(\frac{2\pi}{4N}k\right)\sin(\omega_0 t) \pm I_0 \cos\left(\frac{2\pi}{4N}k\right)\cos(\omega_0 t) = I_0 \cos\left(\omega_0 t \pm \frac{2\pi}{4N}k\right)$$

In this example, a first rung has the same current magnitude $I_0$ and angular frequency $\omega_0$ as another, different rung. The currents in different rungs differ with respect to phase. Thus, a typical high pass, low pass, or bandpass WBC's current distribution in its rungs can be described by Eq. 7.

Figure 5:
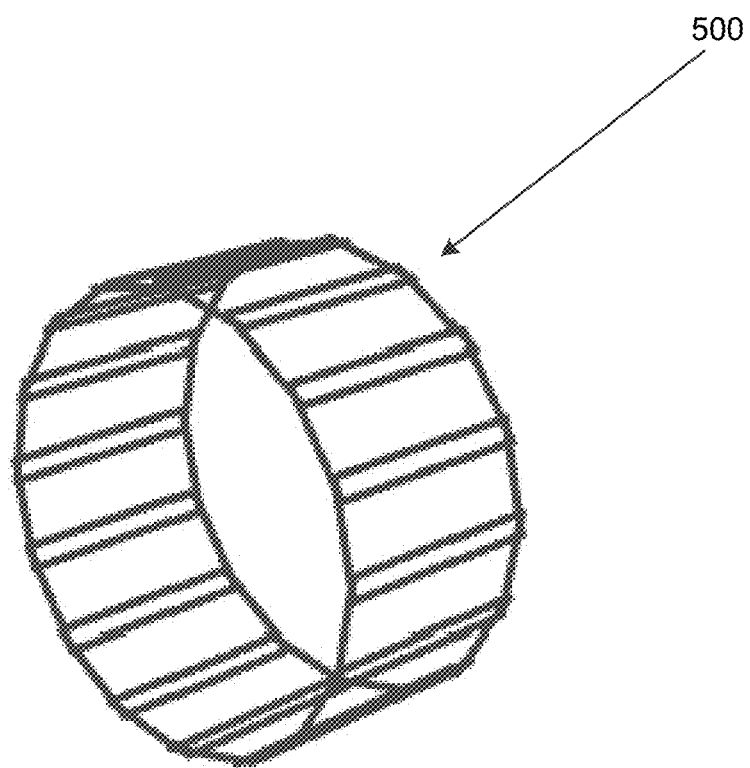
FIG. 5 illustrates an example birdcage coil.

Consider a 4N loops Rx coil that is put inside this circular polarized uniform B field, where the circular polarized uniform B field is generated by a birdcage coil or WBC. FIG. 4, element 430 illustrates current distribution for a B field generated from a birdcage coil or WBC in this situation. In this example, good isolation among all loops is assumed. Furthermore, in this example, each loop is identical, the loops use overlap to isolate the directly neighboring elements, all loops are in the same row, and the loops are wrapped around a cylindrical former. FIG. 5 illustrates an example 16 loop coil 500 configured as a birdcage coil.

In transmit mode the CP $B_1$ field from a birdcage coil (e.g. a WBC) induces voltage in each loop. The induced voltage for a loop can be written as $$V_{induced} = \frac{d(\vec{B_1} \cdot \vec{A_k})}{dt} \quad \text{(Eq. 8)}$$

where $\vec{A_k}$ is the area vector, where the magnitude is the area of the $k_{th}$ loop and the direction is the direction perpendicular to the area towards the outside of the coil.

The $B_1$ field and area vector $\vec{A_k}$ can be written as:

$$\vec{B_1} = B_1(\cos(\omega_0 t)\hat{x} + \sin(\omega_0 t)\hat{y}) \quad \text{(Eq. 9)}$$

$$\vec{A_k} = A_0\left(\cos\left(\frac{2\pi}{8N} + (k-1)*\frac{2\pi}{4N}\right)\hat{x} + \sin\left(\frac{2\pi}{8N} + (k-1)*\frac{2\pi}{4N}\right)\hat{y}\right) \quad \text{(Eq. 9a)}$$

where $A_0$ is the area of a loop. Loops in this example have identical dimensions and thus have the same areas. In particular embodiments, loops may have different areas, and calculations may be adjusted accordingly.

Then, equation 8 can be re-written as:

$$V_{induced} = A_0 B_1 \omega_0 \left(-\sin(\omega_0 t)\cos\left(\frac{2\pi}{8N} + (k-1)*\frac{2\pi}{4N}\right) + \cos(\omega_0 t)\sin\left(\frac{2\pi}{8N} + (k-1)*\frac{2\pi}{4N}\right)\right) = \quad \text{(Eq. 10)}$$
$$A_0 B_1 \omega_0 \sin\left(\frac{2\pi}{8N} + (k-1)*\frac{2\pi}{4N} - \omega_0 t\right)$$

Therefore, the current through the equivalent $k_{th}$ rung position is $$I_{induced\_no\_coupling\_k} = \quad \text{(Eq. 11)}$$
$$\frac{V_k - V_{k-1}}{R} = \frac{A_0 B_1 \omega_0}{R} * 2 * \sin\left(\frac{2\pi}{8N}\right) * \cos\left((k-1)*\frac{2\pi}{4N} - \omega_0 t\right)$$

where R is the impedance of a loop. At the resonant frequency the reactive part of the impedance is self-cancelled and only the real part is left. As demonstrated by both equation 11 and equation 7, a uniform circular $B_1$ field results. The final $B_1$ field $B_t$ inside the loops is the sum of both. As a result the final $B_1$ field $B_t$ inside a small cylinder may be uniform.

In one embodiment, the isolations between coil elements are very small. If the isolations are not small and the mutual inductance is defined as $M_{kj}$ between the $k_{th}$ and $j_{th}$ elements, high order coupling among elements may be ignored, and thus:

$$V_{kj} = M_{kj}\frac{d(I_j)}{dt} \quad \text{(Eq. 12)}$$

Therefore, the $k_{th}$ element will see additional coupled voltage from the $j_{th}$ element.

Summing all of the coupled voltages of the $k_{th}$ element results in:

$$V_k = A_0 B_1 \omega_0 \sin\left(\frac{2\pi}{8N} + (k-1)*\frac{2\pi}{4N} - \omega_0 t\right) - \quad \text{(Eq. 13)}$$
$$\sum_{j=1 \text{ and } j \neq k}^{4N} \left(M_{kj} * A_0 B_1 \omega_0^2 \cos\left(\frac{2\pi}{8N} + (j-1)*\frac{2\pi}{4N} - \omega_0 t\right)\right)$$

Taking the same approach as illustrated in equation 11, then the induced current at the kth rung position can be written as $$I_{induced\_coupled\_k} = \qquad \text{(Eq. 14)}$$

$$I_{induced\_no\_coupling\_k} - \sum_{j=1 \text{ and } j\neq k \text{ or } j\neq k-1}^{4N} \left( (M_{kj} - M_{(k-1)j}) * A_0 B_1 \omega_0^2 \cos\left( \frac{2\pi}{8N} + (j-1) * \frac{2\pi}{4N} - \omega_0 t \right) \right) / R$$

As demonstrated by equation 14 above, the second term in the right side of equation 14 still creates a uniform $B_1$ field. Therefore, compared to the non-coupled case described in equation 11, the coupled case still creates a uniform $B_1$ field. The difference here is that the couplings create the coupled $B_1$ field which makes the whole coil array less power efficient than the non-coupled case. However, as long as this uniform coupled field is still more efficient than the primary coil, (i.e., the WBC) the coil elements may still be used to resonate to improve RF power efficiency and reduce SAR.

Figure 6:
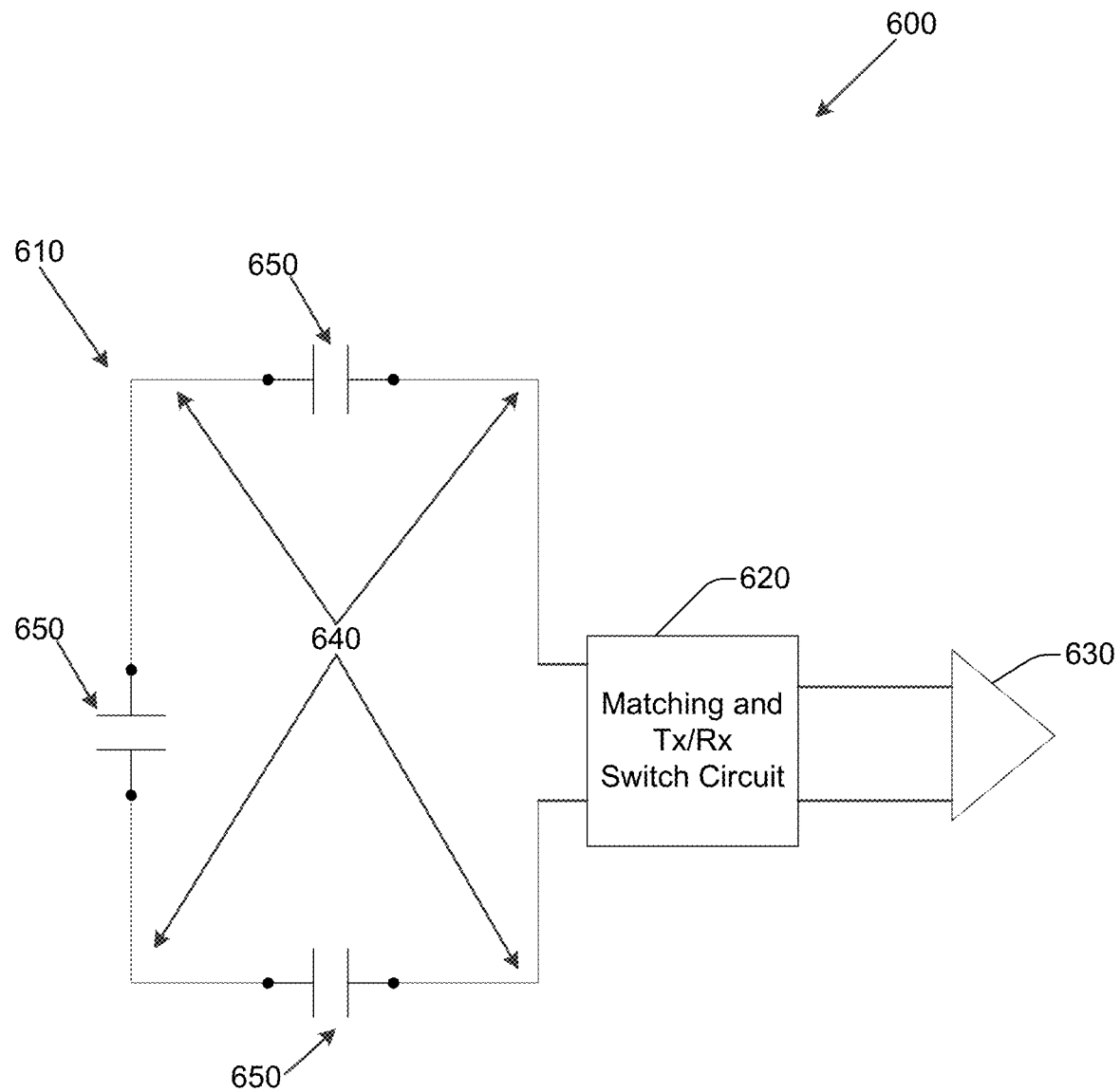
FIG. 6 illustrates an example single-layer MRI RF coil element.

FIG. 6 illustrates an example embodiment of an MRI RF coil element 600 that may be part of a single-layer MRI RF coil array. MRI RF coil element 600 employs the second approach to generate a local Tx field. In FIG. 6, the configuration illustrated includes one Rx element only, for clarity. Employing a MRI RF coil element 600 as part of a single-layer MRI RF coil array using the second approach is simpler than the first approach because fewer PIN diodes are required to switch between Tx mode and Rx mode. Example embodiments thus improve on conventional approaches by saving space within the bore of an MRI apparatus because less hardware is used to construct example embodiments, by avoiding electromagnetic (EM) interference that may be caused by unnecessary hardware, and by reducing manufacturing costs by requiring less hardware, including PIN diodes, than conventional approaches. Example embodiments therefore offer at least one measurable improvement on conventional approaches in addition to providing improved SNR and more uniform fields.

FIG. 6 illustrates an MRI RF coil element 600 configured to operate in a transmit (Tx) mode or in a receive (Rx) mode. In one embodiment, MRI RF coil element 600 may be part of a single-layer MRI RF coil array. A single-layer MRI RF coil array comprises at least one RF coil element (e.g., MRI RF coil element 600). The single-layer MRI RF coil array may be arranged in an anatomy-specific shape or configuration, including a closed-shape configuration (e.g. a birdcage coil), or arranged in an open-shape configuration (e.g. in a "C" or "U" shape), or other shaped configuration. In one embodiment, the single-layer MRI RF coil array may be a birdcage coil array. For example, FIG. 5 illustrates an example birdcage coil array 500. Birdcage coil array 500 is a sixteen loop, single-row coil array comprising sixteen MRI RF coils. A member of the sixteen MRI RF coils may be, for example, MRI RF coil element 600. In another embodiment, an element of the single-layer MRI RF coil array is configured in a saddle-like configuration. In another embodiment, a first element of the single-layer MRI RF coil array is configured in a saddle-like configuration, while a second, different element of the single-layer MRI RF coil array is configured as a loop.

The at least one RF coil element 600 includes an LC coil 610, a matching and Tx/Rx switch circuit 620, and a preamplifier 630. LC coil 610 includes at least one inductor 640 and at least one capacitor 650. The at least one inductor 640 and the at least one capacitor 650 resonate at a first frequency (i.e., a resonant frequency). The at least one inductor 640 may be, for example, a co-axial cable, a copper wire, a copper foil soldered to a circuit board, or other conductor.

RF coils for MRI may need to be tuned and matched. Tuning involves establishing or manipulating the capacitance in a coil so that a desired resistance is produced. Matching involves establishing or manipulating the capacitance in a coil so that a desired reactance is achieved. When tuning, the impedance z may be described by $Z=R+jX=1/(1/(r+jL\omega)+jC\omega)$. Tuning may be performed to achieve a desired tuning frequency for a coil. $\omega_0$ identifies the desired tuning frequency. $\omega_0$, may be, for example, 63.87 MHz at 1.5 T. The size of a conventional coil facilitates estimating inductance L. With an estimate of L in hand, values for capacitors can be computed to produce a desired resonant peak in an appropriate location with respect to $\omega_0$. Once capacitors are selected, the resonant peak can be observed and a more accurate L can be computed. The capacitors can then be adjusted to produce the desired resistance. Once the desired resistance is achieved, then capacitance can be adjusted to cancel reactance.

The matching and Tx/Rx switch circuit 620, when operating in Tx mode, electrically isolates the LC coil 610 from the preamplifier 630 upon the LC coil 610 resonating with a primary coil (not illustrated) at a working frequency of the primary coil. The matching and Tx/Rx switch circuit 620 electrically isolates the LC coil 610 from the preamplifier 630 by providing a threshold level of impedance between the LC coil 610 and the preamplifier 630. The primary coil may be, for example, a WBC or other primary coil that is larger than RF coil element 600. The LC coil 610, upon resonating with the primary coil at the working frequency, generates a local amplified Tx field based on an induced current in the LC coil 610. The induced current has a magnitude and a phase. The magnitude of the induced current or the phase of the induced current may be independently adjustable. For example, the induced current is a function of at least a coil loss resistance of the WBC, a coil loss resistance of the LC coil 610, or a difference between a working frequency of the WBC and a resonant frequency of the LC coil 610. In this embodiment, the frequency of the induced current is the same as the working frequency of the current in the primary coil or WBC, even though the resonant frequency of the LC coil 610 may be different. Embodiments described herein facilitate adjusting the coil loss resistance of the WBC, the coil loss resistance of the LC coil 610, or the difference between the working frequency of the WBC and the resonant frequency of the LC coil 610. The magnitude of the induced current or the phase of the induced current are configured to be varied over a range of magnitudes or phases respectively. Example embodiments thus facilitate independently adjusting the magnitude of an induced current in LC coil 610, or a phase of the induced current.

Matching and Tx/Rx switch circuit 620, when operating in Rx mode, electrically connects the LC coil 610 with the preamplifier 630 by providing low impedance between the LC coil 610 and the preamplifier 630. Preamplifier 630 may be a low input impedance low noise amplifier (LNA). In one embodiment, matching and Tx/Rx switch circuit 620 may be a capacitive matching and Tx/Rx switch circuit. In another embodiment, matching and Tx/Rx switch circuit 620 may be an inductive matching and Tx/Rx switch circuit.

Figure 7:
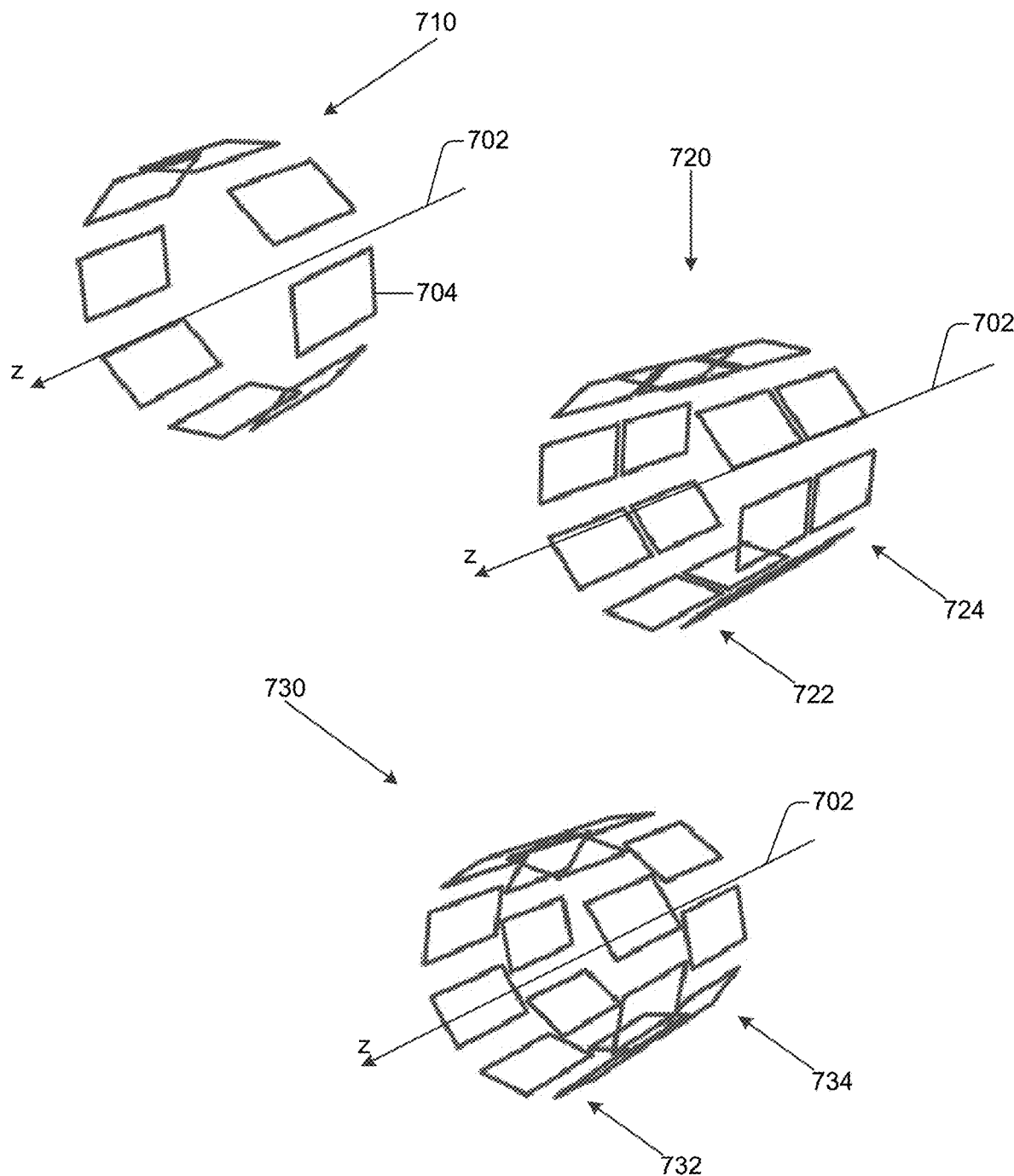
FIG. 7 illustrates example single-layer MRI RF coil arrays.

Example single-layer MRI RF coil array elements, MRI RF coil arrays, MRI RF coils, apparatus, and other embodiments, may be configured, for example, as bird cage coils. FIG. 7 illustrates one embodiment of a single-layer MRI RF coil array 710 that includes at least one MRI RF coil elements 704 arranged in a single-row birdcage configuration. The at least one MRI RF coil elements may include, for example, MRI RF coil element 600, 800, 900, 1000, 1100, 1200, 1500, 2000, 2100, or 2200. FIG. 7 also illustrates an example embodiment of a single-layer MRI RF coil array 720 that includes at least one example single-layer MRI RF coil elements arranged in a two-row configuration. Single-layer MRI RF coil array 720 includes a first row 722 aligned with a second row 724. First row 722 includes at least four RF coil elements. Second row 724 includes at least four RF coil elements. FIG. 7 further illustrates another, single-layer MRI RF coil array 730. Single layer MRI coil array 730 is similar to single-layer MRI RF coil array 720, except the first row 732 is not aligned with second row 734. For example, first row 732 may be rotated a number of degrees around a central axis (e.g. z axis) shared with second row 734, while 734 is not rotated, or is rotated a different number of degrees. In different embodiments, first row 732 may be aligned to within a threshold level of alignment with second row 734.

In one embodiment, MRI RF coil array 720 includes a first plurality of RF coil elements (e.g. first row 722) and a second plurality of RF coil elements (e.g. second row 724). The first plurality of RF coil elements and the second plurality of RF coil elements are radially disposed about a longitudinal axis 702. The first plurality and the second plurality may be longitudinally offset a threshold distance greater than zero along the longitudinal axis 702. In one embodiment, an element of the first plurality of RF coil elements is axially offset a threshold amount from a respective element of the second plurality of RF coil elements. For example, an element of the first plurality of RF coil elements may be axially offset 15 degrees, 30 degrees, or another, different number of degrees, from a respective element of the second plurality of RF coil elements. The first plurality and the second plurality may include the same number of RF coil elements, or may include different numbers of RF coil elements. For example, in one embodiment, the first plurality may include eight RF coil elements, while the second plurality may include nine RF coil elements. Other, different numbers of RF coil elements may be employed.

In another embodiment, the at least one RF coil elements is arranged in a three-row configuration. For example, a three-row single layer MRI RF coil array may include a first row that includes at least five RF coil elements, a second row that includes at least five RF coil elements, and a third row that includes at least five RF coil elements. In this embodiment, the first row, second row, and third row may be aligned axially, or may be unaligned axially. In another embodiment, other different numbers of rows, number of RF coil elements, or combinations of alignments may be employed.

For example, in one embodiment, MRI RF coil array 720 includes a first plurality of RF coil elements 722, a second plurality of RF coil elements 724, and a third plurality of RF coil elements (not illustrated). In this embodiment, the first plurality of RF coil elements 722, the second plurality of RF coil elements 724, and the third plurality of RF coil elements are radially disposed about a longitudinal axis. The first plurality 722, the second plurality 724, and the third plurality are longitudinally offset a threshold amount along the longitudinal axis. In one embodiment, an element of the first plurality 722 of RF coil elements is axially offset a threshold amount from a respective element of the second plurality 724 of RF coil elements or the third plurality of RF coil elements. The first plurality 722, the second plurality 724, and the third plurality may include the same number of RF coil elements, or may include different numbers of RF coil elements. For example, in one embodiment, the first plurality 722 may include eight RF coil elements, the second plurality 724 may include nine RF coil elements, and the third plurality may include seven RF coil elements. In another embodiment, the first plurality 722, the second plurality 724, or the third plurality may include other, different numbers of RF coil elements. Single layer MRI RF coil arrays 710, 720, or 730 may be configured with single-layer MRI RF coil elements 2000, 2100, or 2200 to provide integrated $B_0$ field shimming.

Figure 8:
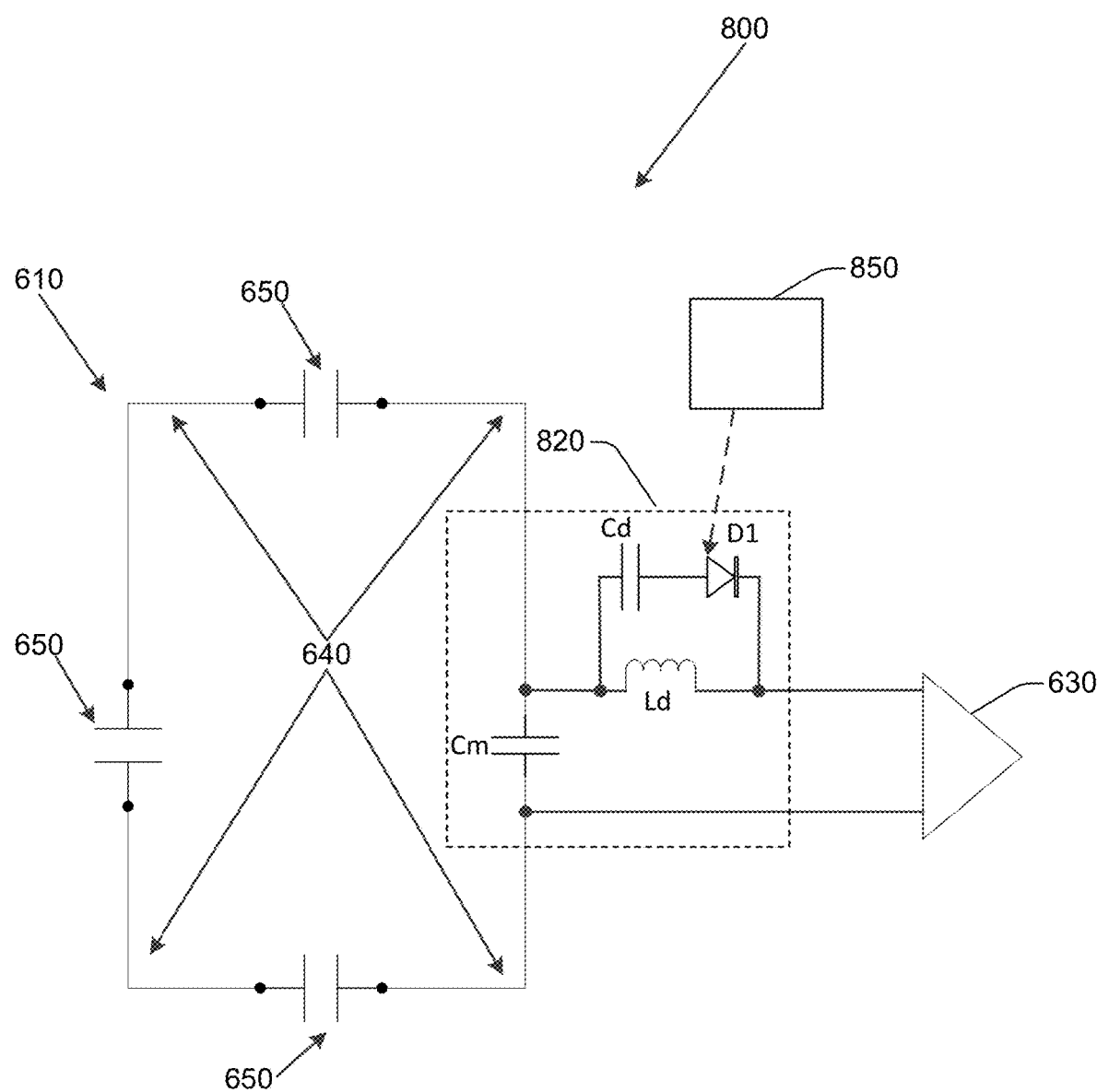
FIG. 8 illustrates an example single-layer MRI RF coil element.

FIG. 8 illustrates an MRI RF coil element 800. MRI RF coil element 800 is similar to MRI RF coil element 600, but includes additional elements and details. MRI RF coil element 800 may be part of a single-layer MRI RF coil array. The single-layer MRI RF coil array comprises at least one RF coil element 800. In one embodiment, MRI RF coil element 800 includes a matching and Tx/Rx switch circuit 820 configured to operate as a capacitive matching and Tx/Rx circuit. In this embodiment, matching and Tx/Rx switch circuit 820 includes a matching capacitor Cm, a first diode D1, a capacitor Cd, and a first inductor Ld. First diode D1 may be a PIN diode. The first diode D1, capacitor Cd, and first inductor Ld create a resonant tank circuit in Tx mode when first diode D1 is forward biased. This resonant tank circuit isolates input to the LNA preamplifier 630 from an induced high current or voltage in LC coil 610. The resonant tank circuit further facilitates LC coil 610, including capacitors 650, inductors 640, and matching capacitor Cm, to resonate at a high Q without preamplifier 630 being electrically connected to the RF coil.

In this embodiment, matching capacitor Cm has a first terminal and a second terminal. Matching capacitor Cm is connected, at a first terminal, to a first terminal of first inductor Ld. First inductor Ld is connected at a first terminal, to a capacitor Cd, at a first terminal. Capacitor Cd is connected, at a second terminal, to first diode D1, at a first terminal. First diode D1 is connected, at a second terminal to first inductor Ld, at a second terminal. First inductor Ld is connected, at a second terminal, to a first input terminal of preamplifier 630. Preamplifier 630 is connected, at a second input terminal, to the second terminal of matching capacitor Cm. In Rx mode, first diode D1 is backward biased (i.e., first diode D1 has a high impedance in Rx mode), so that effectively only Ld is presented between Cm and Preamplifier 630. While in this example first inductor Ld, first diode D1, and capacitor Cd are illustrated on a connection path between the first terminal of matching capacitor Cm and a first input terminal of preamplifier 630, in another embodiment, first inductor Ld, first diode D1, and capacitor Cd may be connected instead between the second terminal of matching capacitor Cm and the second input terminal of preamplifier 630.

In one embodiment, MRI RF coil element 800 further includes a PIN diode control circuit 850. PIN diode control circuit 850 facilitates selective control of first diode D1. For example, PIN diode control circuit 850 controls a forward bias applied to first diode D1. PIN diode control circuit 850 may be operably connected to, for example, first diode D1. In another embodiment, PIN diode control circuit 850 facilitates selective control of other, different diodes, including shunt diodes, or PIN diodes that comprise a magnitude/phase control component.

Figure 9:
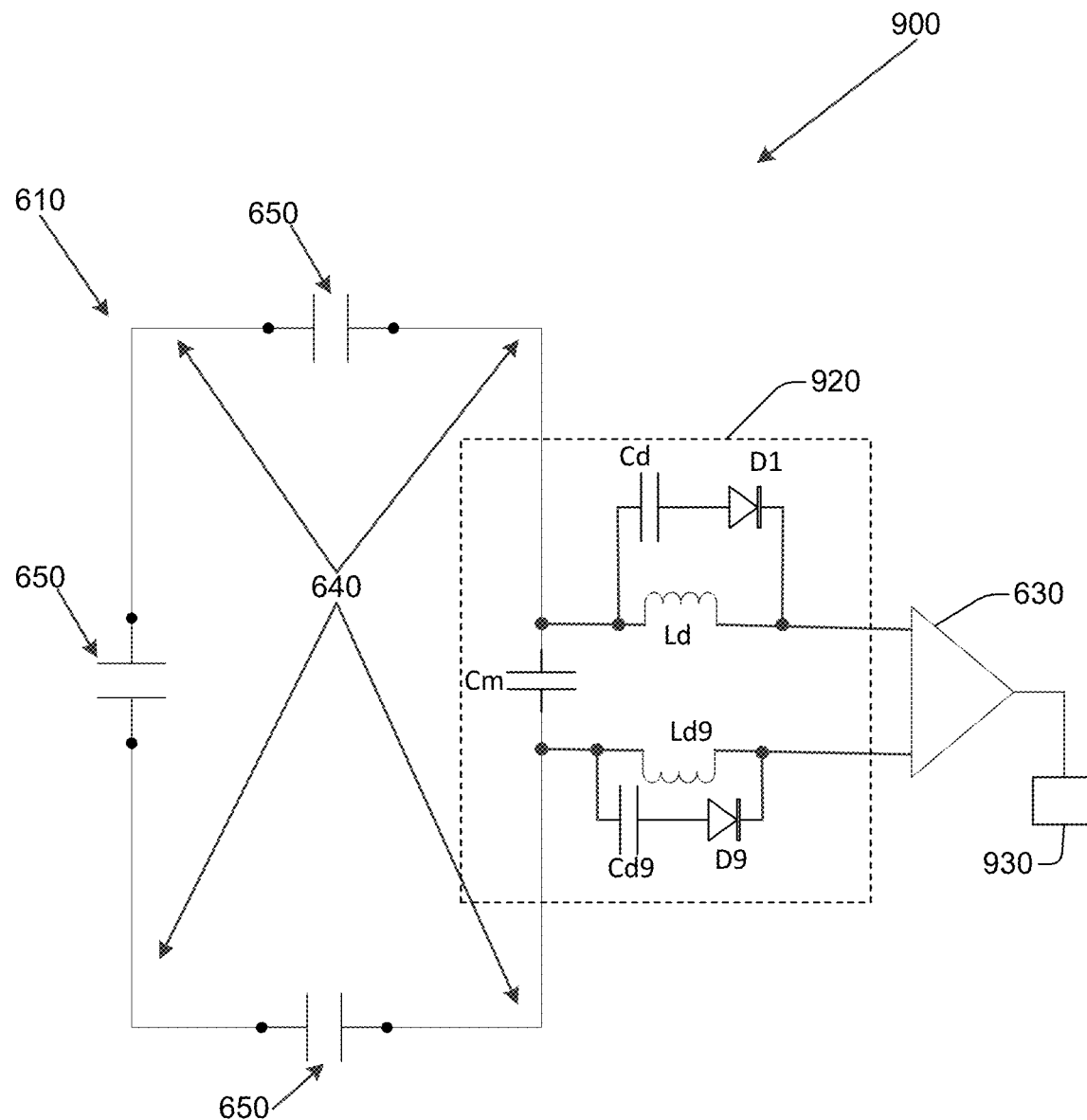
FIG. 9 illustrates an example single-layer MRI RF coil element.

FIG. 9 illustrates an MRI RF coil element 900. MRI RF coil element 900 is similar to MRI RF coil element 800, but includes additional elements and details. MRI RF coil element 900 includes matching and Tx/Rx switch circuit 920. In this embodiment, matching and Tx/Rx switch circuit 920 includes matching capacitor Cm, first diode D1, first capacitor Cd, and first inductor Ld. Matching and Tx/Rx switch 920 also includes second diode D9, second capacitor Cd9, and second inductor Ld9. Second diode D9 may be a PIN diode. The first diode D1, first capacitor Cd first inductor Ld, and second diode D9, second capacitor Cd9, and second inductor Ld9 create a resonant tank circuit in Tx mode when first diode D1 or second diode D14 is forward biased. This resonant tank circuit isolates input to preamplifier 630 from an induced high current or voltage in LC coil 610. The resonant tank circuit further facilitates LC coil 610, including capacitors 650, inductors 640, and matching capacitor Cm, resonating at a high Q without preamplifier 630 being electrically connected to the RF coil.

In this embodiment, matching capacitor Cm has a first terminal and a second terminal. Matching capacitor Cm is connected, at a first terminal, to a first terminal of first inductor Ld. First inductor Ld is attached at a first terminal, to first capacitor Cd, at a first terminal. First capacitor Cd is attached, at a second terminal, to first diode D1, at a first terminal. First diode D1 is attached, at a second terminal to a second terminal of first inductor Ld. First inductor Ld is connected, at a second terminal, to a first input terminal of preamplifier 630. Matching capacitor Cm is connected, at a second terminal, to a first terminal of second inductor Ld9. Second inductor Ld9 is connected, at a first terminal, to second capacitor Cd9, at a first terminal. Second capacitor Cd9 is connected, at a second terminal, to second diode D9, at a first terminal. Second diode D9 is connected, at a second terminal, to a second terminal of second inductor Ld9. Second inductor Ld9 is connected, at a second terminal, to a second input terminal of preamplifier 630.

In one embodiment, MR RF coil element 900 further includes a balun 930. In this embodiment, balun 930 is connected, at a first coaxial or two-connection terminal, to a first coaxial or two-connection output terminal of preamplifier 630. In another embodiment, balun 930 is connected between matching and Tx/Rx switch 920 and preamplifier 630. Balun 930 reduces a common mode current flowing in transmission lines that may connect MRI RF coil element 900 with an MRI system (not illustrated).

Figure 10:
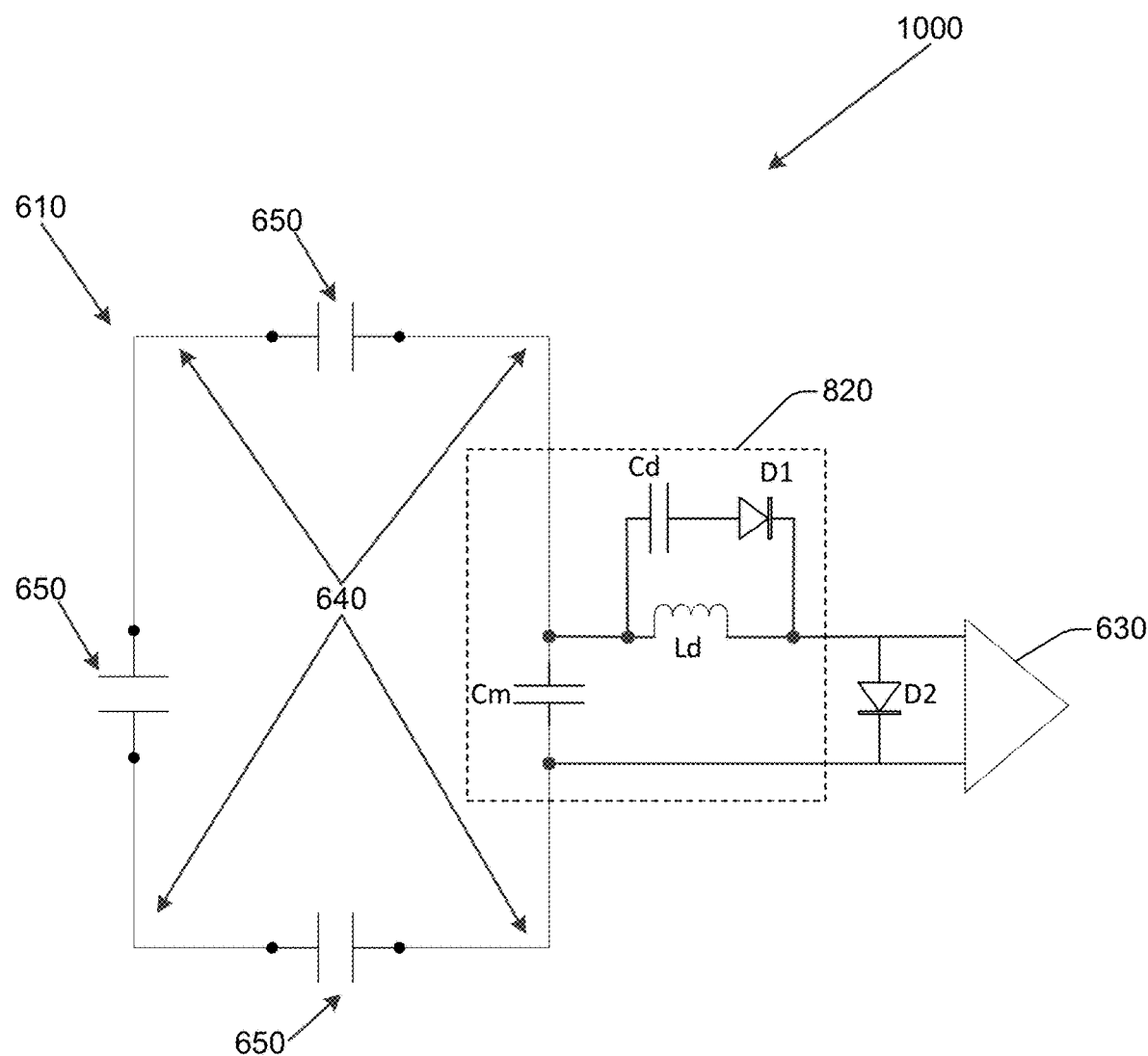
FIG. 10 illustrates an example single-layer MRI RF coil element.

FIG. 10 illustrates an MRI RF coil element 1000. MRI RF coil element 1000 is similar to MRI RF coil element 800, but includes additional elements and details. MRI RF coil element 1000 may be part of a single-layer MRI RF coil array. The single-layer MRI RF coil array comprises at least one RF coil element 1000. MRI RF coil element 1000 includes shunt diode D. Shunt diode D2 may be a PIN diode. Shunt diode D2 has a first terminal and second terminal. Shunt diode D2 is connected, at a first terminal, to the first input terminal of preamplifier 630. Shunt diode D2 is connected, at a second terminal, to the second input terminal of preamplifier 630. To further improve isolation between high induced current in LC coil 610 and LNA preamplifier 630, shunt diode D2 provides additional shunt protection for the LNA preamplifier 630.

Figure 11:
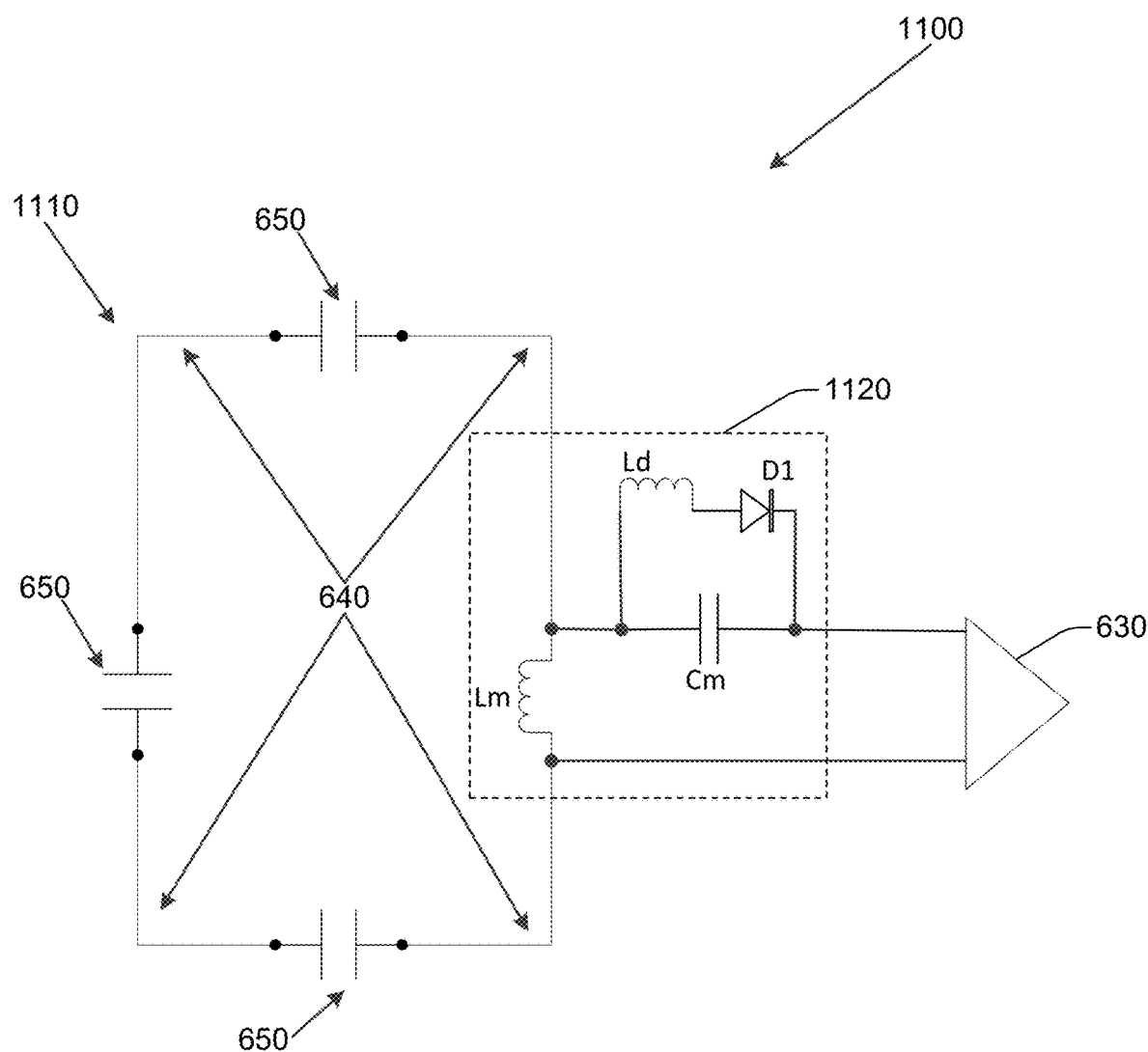
FIG. 11 illustrates an example single-layer MRI RF coil element.

FIG. 11 illustrates an MRI RF coil element 1100. MRI RF coil element 1100 is similar to MRI RF coil element 600, but includes additional elements and details. MRI RF coil element 1100 may be part of a single-layer MRI RF coil array. The single-layer MRI RF coil array comprises at least one RF coil element 1100. RF coil element 1100 includes an LC coil 1110. LC coil 1110 is similar to LC coil 610 but includes a matching inductor Lm having a first terminal and a second terminal. LC coil 1110 also includes at least one conductor 640 having a first end connected to the first terminal of the matching inductor Lm, and a second end connected to the second terminal of the matching inductor Lm.

In this embodiment, matching and Tx/Rx switch 1120 operates as an inductive matching circuit. Matching and Tx/Rx switch 1120 is connected to matching inductor Lm. Matching and Tx/Rx switch 1120 includes first inductor Ld having a first terminal and a second terminal, first diode D1 having a first terminal and a second terminal, and matching capacitor Cm having a first terminal and a second terminal. Matching inductor Lm is connected at a first terminal with the first terminal of matching capacitor Cm. Matching capacitor Cm is connected at a first terminal with the first terminal of first inductor Ld. First inductor Ld is connected at a second terminal with the first terminal of first diode D1. First diode D1 is connected at a second terminal with the second terminal of matching capacitor Cm. Matching capacitor Cm is connected at a second terminal with a first input terminal of pre-amplifier 630. Matching inductor Lm is connected, at a second terminal, with a second input terminal of pre-amplifier 630. The first diode D1, matching capacitor Cm, and first inductor Ld isolate input to the preamplifier 630 from an induced high current or voltage in LC circuit 1110 when first diode D1 is forward biased. While in this example first inductor Ld, first diode D1, and matching capacitor Cm are illustrated on a connection path between the first terminal of matching inductor Lm and a first input terminal of preamplifier 630, in another embodiment, first inductor Ld, first diode D1, and matching capacitor Cm may be connected instead between the second terminal of matching inductor Lm and the second input terminal of preamplifier 630.

Figure 12:
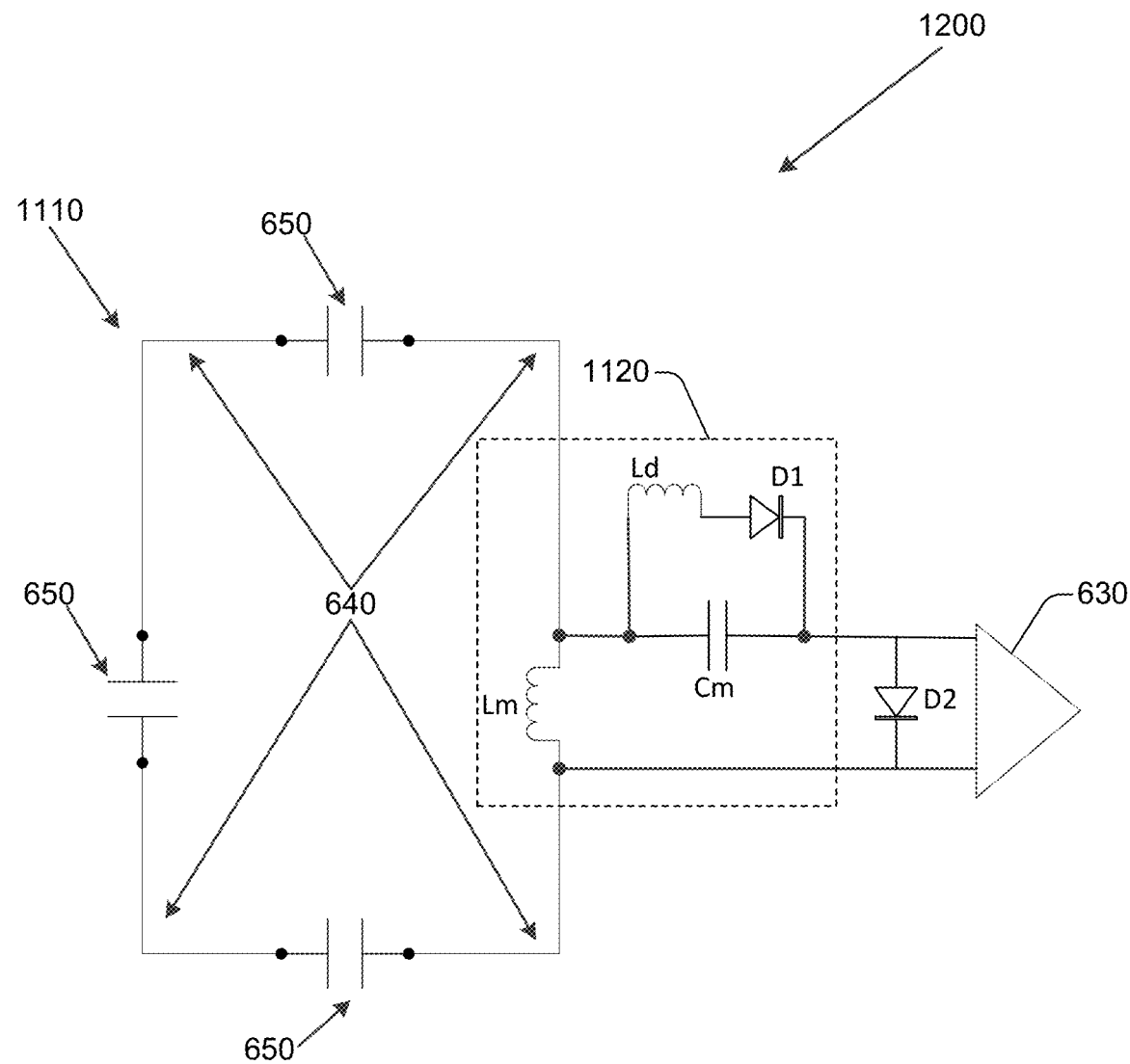
FIG. 12 illustrates an example single-layer MRI RF coil element.

FIG. 12 illustrates an MRI RF coil element 1200. MRI RF coil element 1200 is similar to MRI RF coil element 1100, but includes additional elements and details. MRI RF coil element 1200 may be part of a single-layer MRI RF coil array. The single-layer MRI RF coil array comprises at least one RF coil element 1200. MRI RF coil element 1200 includes shunt diode D2. Shunt diode D2 has a first terminal and second terminal. Shunt diode D2 is connected, at a first terminal, to a first input terminal of preamplifier 630. Shunt diode D2 is connected, at a second terminal, to a second input terminal of preamplifier 630. To further improve isolation between high current induced in LC coil 1110 and LNA preamplifier 630, shunt diode D2 provides additional shunt protection.

Embodiments described herein may include single-layer MRI RF coil arrays configured in shapes other than the cylindrical shape described above. For example, other shapes, including elliptical, rectangular, square, or other different shapes, may be used to build an Rx coil or single-layer MRI RF coil array for particular applications. For those shapes the concepts of the cylindrical case describe above are still applicable. Non-cylindrical shaped single-layer MRI RF coils may differ from cylindrical single-layer MRI RF coils in that the induced $B_1$ field of the other, non-cylindrical shapes is not as uniform as the induced $B_1$ field of the cylindrical case, but is still more than uniform enough for a Tx field in a clinical environment. The non-cylindrical shapes or cross sections discussed above are enclosed shapes or closed-shape configurations. Embodiments are not only applicable to an enclosed shape but may also be implemented as opened shapes, including MRI RF coil elements arranged on a single plane, on two parallel planes, on two planes that are within a threshold of parallel, or MRI RF coil elements arranged in an enclosed shape with a side not present, for example, a "C" shape or a "U" shape.

One embodiment of a single-layer MRI RF coil array that employs an opened shape includes a plurality of loops, saddles, or other MRI RF coil elements arranged on two parallel planes, or on non-parallel planes that are within a threshold tolerance of being parallel to each other, located at least a threshold distance apart, and that face each other directly. A threshold tolerance of being parallel may be, for example, a 1% tolerance, a 10% tolerance, or other, different tolerance. For example, a first point on a first MRI RF coil element may be located 20 cm from a corresponding first point on a facing, second MRI RF coil element, while a second point on the first MRI RF coil element may be located 22 cm from a corresponding second point on the second MRI RF coil element. In this embodiment, the size of the loops may be identical, or may be within a threshold margin of difference. For example, a first loop may describe an area of x cm², while a second loop may describe an area of 0.9×cm². In one embodiment, a plurality of different sized loops may be located on a first plane, while a second plurality of different sized loops may be located on a second, parallel plane, or on a second plane that is within a threshold tolerance of being parallel with the first plane.

Figure 13:
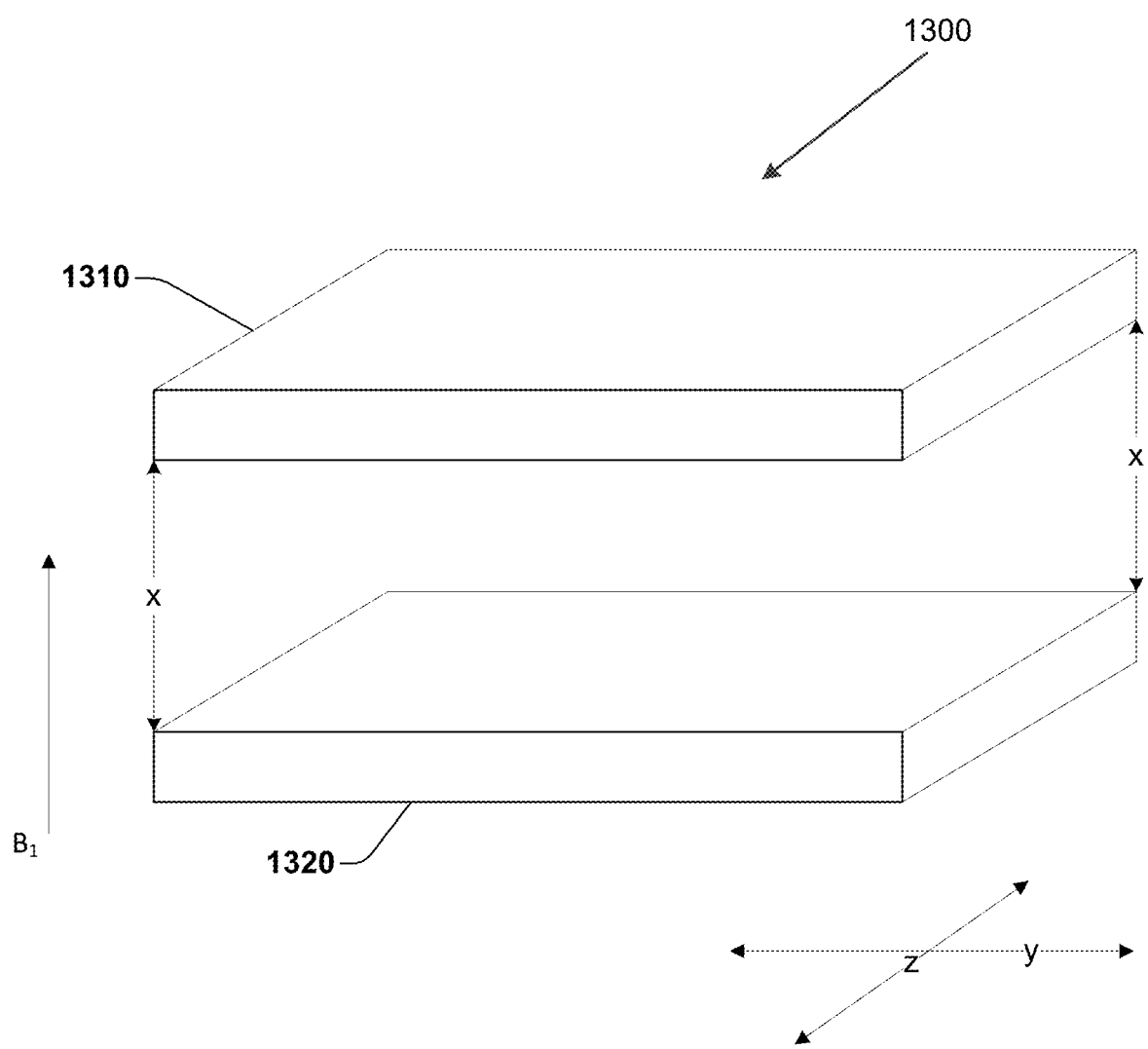
FIG. 13 illustrates an example open shape configuration single-layer MRI RF array.

FIG. 13 illustrates one embodiment of a single layer MRI RF coil array 1300 that includes at least two RF coil elements. While in this embodiment, only two RF coil loops are illustrated, in another embodiment, other, different numbers of RF coil loops may be employed. The at least two RF coil elements includes a first RF coil element 1310 and a second RF coil element 1320. First RF coil element 1310 and second RF coil element 1320 may include a single layer MRI RF coil element, including MRI RF coil element 600, 800, 900, 1000, 1100, 1200, 1500, 2000, 2100, or 2200, or other single-layer MRI RF coil elements described herein. First RF coil element 1310 is arranged on a first plane, while second RF coil element 1320 is arranged on a second, different plane parallel to the first plane. FIG. 13 illustrates an example open shape configuration. The first plane and the second plane may be parallel to each other, and are located at least a threshold distance from each other. The threshold distance is a distance greater than zero. The threshold distance may be a function of a volume to be imaged, for example, the size or shape of a human knee, wrist, or head. In this example, the at least a threshold distance is indicated by "x" in FIG. 13. The first plane and the second plane may, in another embodiment, be within threshold of parallel from each other. The first RF coil element 1310 and the second RF coil element 1320 may be offset laterally from each other a distance greater than zero, or may be directly aligned. For example, the first RF coil element 1310 and second RF coil element 1320 may be located 30 cm from each other in the x axis, and laterally offset 3 cm in the y axis or z axis. In other embodiments, other offsets may be employed.

First RF coil element 1310 and second RF coil element 1320 inductively couple to each other since they face each other. If both first RF coil element 1310 and second RF coil element 1320 are tuned independently to the same frequency without the presence of the other coil, their resonant frequency will split into two frequencies: a lower frequency and a higher frequency. The lower frequency is for the current of both RF coil element 1310 and RF coil element 1320 flowing in the same direction. The higher frequency is for the current of both RF coil element 1310 and RF coil element 1320 flowing in opposite directions. The frequencies may be written as $$f = \frac{1}{2\pi\sqrt{(L \pm M)C}},$$

where L is the inductance of the coil, C is the capacitance, and M is the mutual inductance between RF coil element 1310 and RF coil element 1320.

When both first RF coil element 1310 and second RF coil element 1320 are placed inside a WBC and the WBC generates a circular polarized (CP) uniform or a uniform $B_1$ field perpendicular to the planes of the coils, then the current induced in one of first RF coil element 1310 or second RF coil element 1320 by the WBC directly may be expressed as $$i_{1\_WBC} = \frac{\omega_0 A * B_1}{R} \quad \text{(Eq. 15)}$$

where A is the area of the loop, $B_1$ is the magnitude of WBC field, and R is the coil loss. In an example embodiment in which first RF coil element 1310 or second RF coil element 1320 includes RF coil element 600, 800, 900, 1000, 1100, 1200, 1500, or ..., then the area A of the loop corresponds to the area of LC coil 610 or LC coil 1110. Here, R is the only term in the denominator of Eq. 15 because $$j\omega_0 L - j\frac{1}{\omega_0 C} = 0$$

at the resonant frequency $\omega_0$. The same current is also true for the other coil. For clarity, herein only the $B_1$ field perpendicular to the first plane and second plane is described. However, a $B_1$ field that is not perpendicular to the first plane and second plane may be described similarly. This is shown in equation 16 below.

$$i_{2\_WBC} = \frac{\omega_0 A * B_1}{R} \quad \text{(Eq. 16)}$$

Recall that both currents are flowing in the same direction. Because there is mutual inductance between first RF coil element 1310 and second RF coil element 1320, the final current $i_t$ of the first RF coil element 1310 includes the additional current caused by mutual inductance coupling. The final currents $i_1$ and $i_2$ can be written as:

$$i_1 = \frac{\omega_0 A * B_1}{R} - \frac{M\frac{d(i_{2\_WBC})}{dt}}{R} = \frac{\omega_0 A * B_1}{R} - M\frac{j(\omega_0^2 A * B_1)}{R^2} \quad \text{(Eq. 17)}$$

$$i_2 = \frac{\omega_0 A * B_1}{R} - \frac{M\frac{d(i_{1\_WBC})}{dt}}{R} = \frac{\omega_0 A * B_1}{R} - M\frac{j(\omega_0^2 A * B_1)}{R^2} \quad \text{(Eq. 18)}$$

Both $i_1$ and $i_2$ flow in the same direction and have the same current magnitude. In this example, the coupling or mutual inductance between the first loop or first RF coil element 1310 and the second loop or second RF coil element 1320 causes a Tx efficiency loss. Thus, the sign before M in equation 17 and equation 18 is "−", (i.e., negative sign). This embodiment thus may function as the equivalent of a two-turn solenoid or a saddle coil which generates a transmitting field that has a uniformity suitable for clinical use. The Tx efficiency loss may be minimized by shifting the tuning frequency of both coils such that the two-turn solenoid mode frequency is close to or the same as the working frequency in Tx mode only. In another embodiment, other, different configurations of coils may be employed.

In one embodiment of single-layer MRI RF coil array 1300, a member of the at least two RF coil elements (e.g. first RF coil element 1310, second RF coil element 1320) includes an LC coil, a matching and Tx/Rx switch circuit, and a preamplifier. In this embodiment, the LC coil includes at least one inductor and at least one capacitor. The at least one inductor and the at least one capacitor resonate at a first frequency. The LC coil is connected with the matching and transmit Tx/Rx switch circuit. The matching and transmit Tx/Rx switch circuit is connected to the preamplifier. The matching and Tx/Rx switch circuit, when operating in Tx mode, electrically isolates the LC coil from the preamplifier upon the LC coil resonating with a primary coil at the first frequency. The LC coil, upon resonating with the primary coil at the first frequency, generates a local amplified Tx field based on an induced current in the LC coil. A magnitude of the induced current or a phase of the induced current is independently adjustable. For example, the magnitude or phase of the induced current may be variable over a range of magnitudes or phases respectively, by varying the coil loss resistance of the primary coil, the coil loss resistance of first RF coil element 1310 or second RF coil element 1320, or the difference between the working frequency of the primary coil and the resonant frequency of first RF coil element 1310 or second RF coil element 1320. The matching and Tx/Rx switch circuit, when operating in Rx mode, electrically connects the LC coil with the preamplifier. In one embodiment, the matching and Tx/Rx switch circuit is a capacitive matching and Tx/Rx switch circuit. In another embodiment, the matching and Tx/Rx switch circuit is an inductive matching and Tx/Rx switch circuit. In one embodiment, the LC coil includes a shunt PIN diode or protection PIN diode that provides further shunt protection to the preamplifier.

Figure 14:
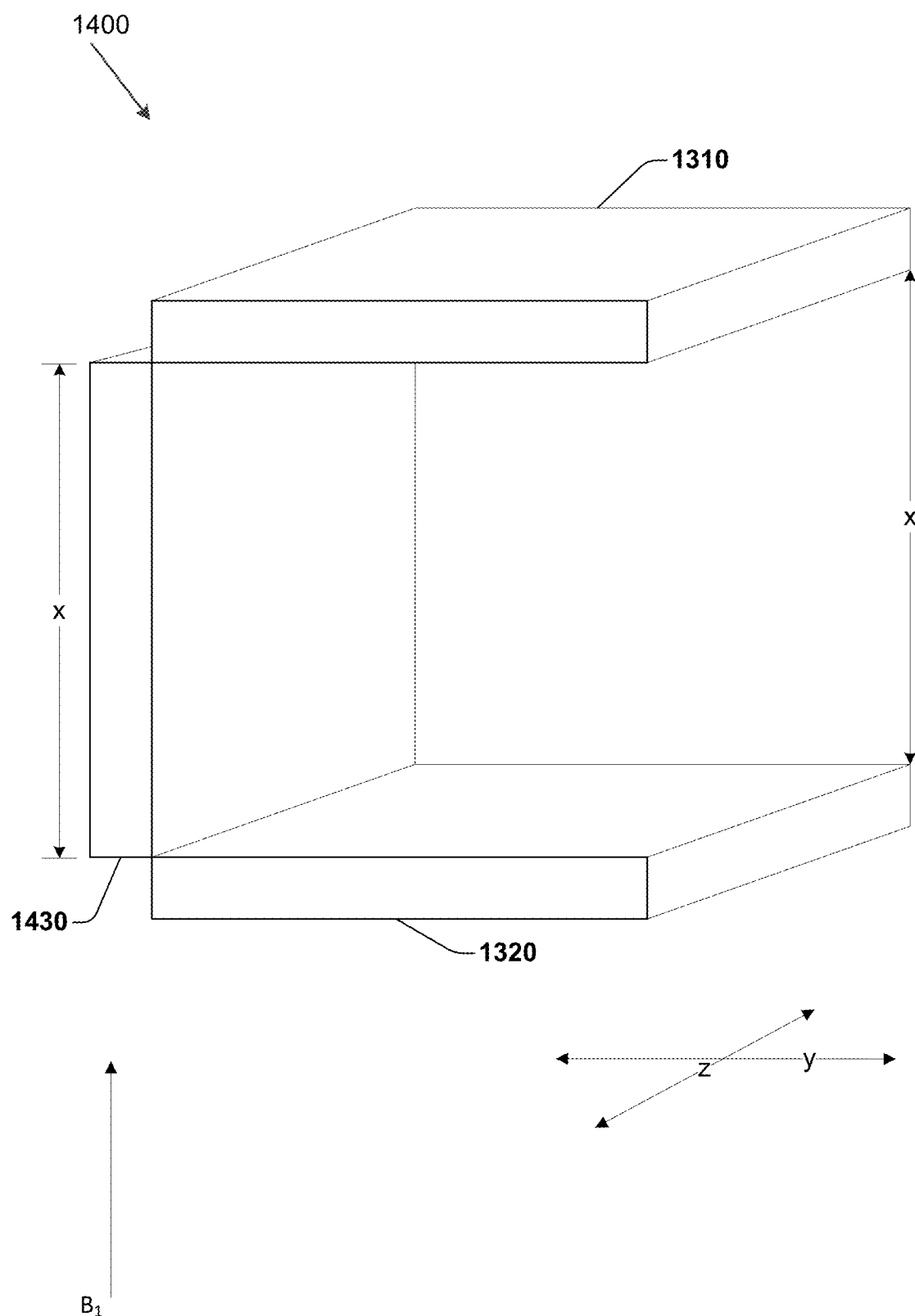
FIG. 14 illustrates an example open shape configuration single-layer MRI RF array.

FIG. 14 illustrates a single-layer MRI RF coil array 1400 that is similar to single-layer MRI RF coil array 1300 but that includes additional details and elements. Single-layer MRI RF coil array 1400 includes first RF coil element 1310, second RF coil element 1320, and also includes a third RF coil element 1430. FIG. 14 illustrates first RF coil element 1310, second RF coil element 1320, and third RF coil element 1430 disposed in an open shape configuration. In this embodiment, the RF coil elements 1310, 1320, and 1430 of MRI RF coil array 1400 are arranged approximately in the shape of a "C" or "U". First loop or RF coil element 1310 is arranged on a first plane, while second loop or RF coil element 1320 is arranged on a second, different plane. The first plane and the second plane may be parallel or slightly non-parallel to each other, and are located at least a threshold distance from each other. The threshold distance is a non-zero distance greater than zero. In this example, the at least a threshold distance is indicated by "x" in FIG. 14. In one embodiment, third RF coil element 1430 is arranged on a third plane that is perpendicular to the first plane and the second plane. In another embodiment, third RF coil element 1430 is arranged on a third plane that is within a threshold degree of parallel with the first plane or the second plane. For example, in one embodiment configured for a first anatomy to be imaged, the third RF coil element 1430 is arranged on a third plane that is perpendicular with the first plane and the second plane. In another embodiment configured for a second, different anatomy, the third RF coil element 1430 is arranged on a third plane that is not perpendicular with the first plane and the second plane. In one embodiment, an angle formed by the intersection of the third plane with the first plane or the second plane is user adjustable.

In one embodiment, third RF coil element 1430 is offset from the first R coil element 1310 or the second RF coil element 1320 a non-zero amount along a y axis or a z axis. For example, the first RF coil element 1310 and second RF coil element 1320 may be located 30 cm from each other in the x axis, and laterally offset 3 cm in the y axis. The third RF coil element 1430 may be laterally offset 2 cm in the z axis from the first RF coil element 1310 and the second RF coil element 1320. In other embodiments, other offsets may be employed.

Third RF coil element 1430, like first RF coil element 1310 and second RF coil element 1320, may include an MRI RF coil element described herein, including single-layer MRI RF coil elements 600, 800, 900, 1000, 1100, 1200, 1500, 2000, 2100, or 2200. While three RF coil elements are illustrated, in another embodiment, other, different numbers of RF coil elements may be employed.

In one embodiment of single-layer MRI RF array coil 1400, a member of the at least three RF coil elements (e.g. first RF coil element 1310, second RF coil element 1320, third RF coil element 1430) includes an LC coil, a matching and transmit (Tx)/receive (Rx) switch circuit, and a preamplifier. In this embodiment, the LC coil includes at least one inductor and at least one capacitor. The at least one inductor and the at least one capacitor resonate at a first frequency. The matching and Tx/Rx switch circuit, when operating in Tx mode, electrically isolates the LC coil from the preamplifier upon the LC coil resonating with a primary coil at the first frequency. The LC coil, upon resonating with the primary coil at the first frequency, generates a local amplified Tx field based on an induced current in the LC coil. A magnitude of the induced current or a phase of the induced current is independently adjustable. The matching and Tx/Rx switch circuit, when operating in Rx mode, electrically connects the LC coil with the preamplifier. In one embodiment, the matching and Tx/Rx switch circuit is a capacitive matching and Tx/Rx switch circuit. In another embodiment, the matching and Tx/Rx switch circuit is an inductive matching and Tx/Rx switch circuit. In one embodiment, the LC coil includes a shunt PIN diode or protection PIN diode that provides further shunt protection to the preamplifier.

Embodiments described herein may also be described using a mode approach. For example, two identical coils facing each other may both resonate at the same frequency if the other coil does not exist. Due to mutual inductance the two coils create two intrinsic resonant modes. The first mode is the lower frequency mode which is called saddle mode or corotation mode, where both coils' currents flow in the same direction. The other mode has a higher frequency and is called anti-saddle mode or counter-rotation mode in which the currents of the coils flow in opposite directions. If a uniform external field or a circular polarized uniform external field is applied to the coils, only the saddle mode configuration will have induced voltage because its net flux is non-zero while the anti-saddle mode's net flux is zero. As a result two identical coils, or coils having sufficient similarity, facing each other will generate an amplified $B_1$ field by the local saddle mode which has a level of uniformity suitable for clinical use. The external uniform field serves as a selector for modes. The larger the net magnetic flux the mode has, the more energy from the external field is coupled. The frequency of a mode determines the Tx efficiency of the mode. The closer the frequency of the mode is to the working frequency, the more efficient the coupling between the WBC and the mode.

This discussion can also be extended to embodiments that employ a plurality of MRI RF coil elements. For example, in an embodiment with N coil elements in which some or all of the N coil elements' isolations may not be good (i.e., the isolation may not be within a threshold tolerance), the N coil elements will couple to each other and create M Eigenresonant modes in which a mode is a sum of some or all coil elements with different weighting coefficients and phases, where N and M are integers. In this embodiment, a mode is excited proportionally by the net magnetic flux of each mode from the WBC. The most uniform mode among all modes has the largest net magnetic flux from the WBC. For example, a two-element embodiment will be more uniform among modes. Therefore, the most uniform mode among the modes is the strongest mode excited by the WBC. If other less uniform modes' net magnetic fluxes from the WBC are not zero, they will be also excited but the induced fields from them are weaker than the most uniform mode, on average. The other less uniform modes make the final combined induced field more uniform than the induced field from the most uniform mode only. Thus, the final combined induced field is sufficiently uniform for use in clinical MRI applications. To achieve a higher Tx efficiency the most uniform mode frequency should be close to the WBC frequency in Tx mode only.

In summary, a plurality of single-layer MRI RF coils or MRI RF coil array elements configured as a single-layer MRI RF coil array, resonating with a WBC coil in Tx mode will induce a local amplified Tx field. A coil array element may have the magnitude and phase of an induced current adjusted independently of another, different coil array element. The local amplified Tx field has a threshold level of uniformity and the single-layer MRI RF coil array is used as a transmitter coil. This amplified Tx field improves the WBC power efficiency and reduces the SAR compared to conventional approaches because non-related anatomy areas will not experience a high Tx field from the WBC. Because the Tx field is adjustable via independent phase or magnitude control, a region of tissue being imaged may be subjected to a more uniform Tx field at different locations within the region of tissue. In one embodiment, MRI RF array coils that connect to an MRI system can be connected through cables or may be connected wirelessly with no cables.

Embodiments described herein are configured such that the magnitude of the induced current or the phase of the induced current is variable over a range of magnitudes or phases respectively. Example embodiments adjust the magnitude and phase of the induced current $i_s$ of a coil in Tx mode such that the image quality is still acceptable for clinical MRI. When a single-layer MRI RF coil array operates in Rx mode, it operates as a phased array receiving coil with a frequency tuned to the working frequency for optimum SNR. Embodiments described herein provide magnitude and phase adjustment for an RF coil operating in Tx mode. Different approaches to adjust a coil's magnitude and phase are now described herein.

Recall from equation 3 that the local inductively coupled coil current can be written as:

$$i_s = \frac{-j\omega M \varepsilon}{(R_p R_s + \omega^2 M^2)} \quad \text{(Eq. 3.1)}$$

where $i_s$ is the induced current of local RF coil, $R_p$ is the coil loss resistance of the WBC, $R_s$ is the coil loss resistance of the local RF coil, M is the mutual inductance between the WBC and the local RF coil and $\varepsilon$ is the driving voltage of the WBC. The Eq. 3.1 immediately above assumes that both the WBC and the local RF coil resonate at the same working frequency. Because the local coil is smaller than the WBC, the magnetic field generated by $i_s$ is significantly larger than the magnetic field generated from the WBC. Therefore the Tx field is dominated by the local coil. The WBC is part of the MRI system and its frequency is fixed at the nominal working frequency. Typically, the working frequency of the WBC cannot be changed, and typically, a WBC cannot be removed from an MRI system in normal clinical practice.

Embodiments are configured to adjust the magnitude and phase of the induced $i_s$ of a coil (e.g., a loop, a coil array element) in a single-layer MRI RF coil array while operating in Tx mode. When a coil in a single-layer MRI RF coil array is operating in Rx mode, the single-layer MRI RF coil array operates as a phased array Rx coil where a coil's frequency is tuned to the working frequency for optimum SNR.

Figure 15:
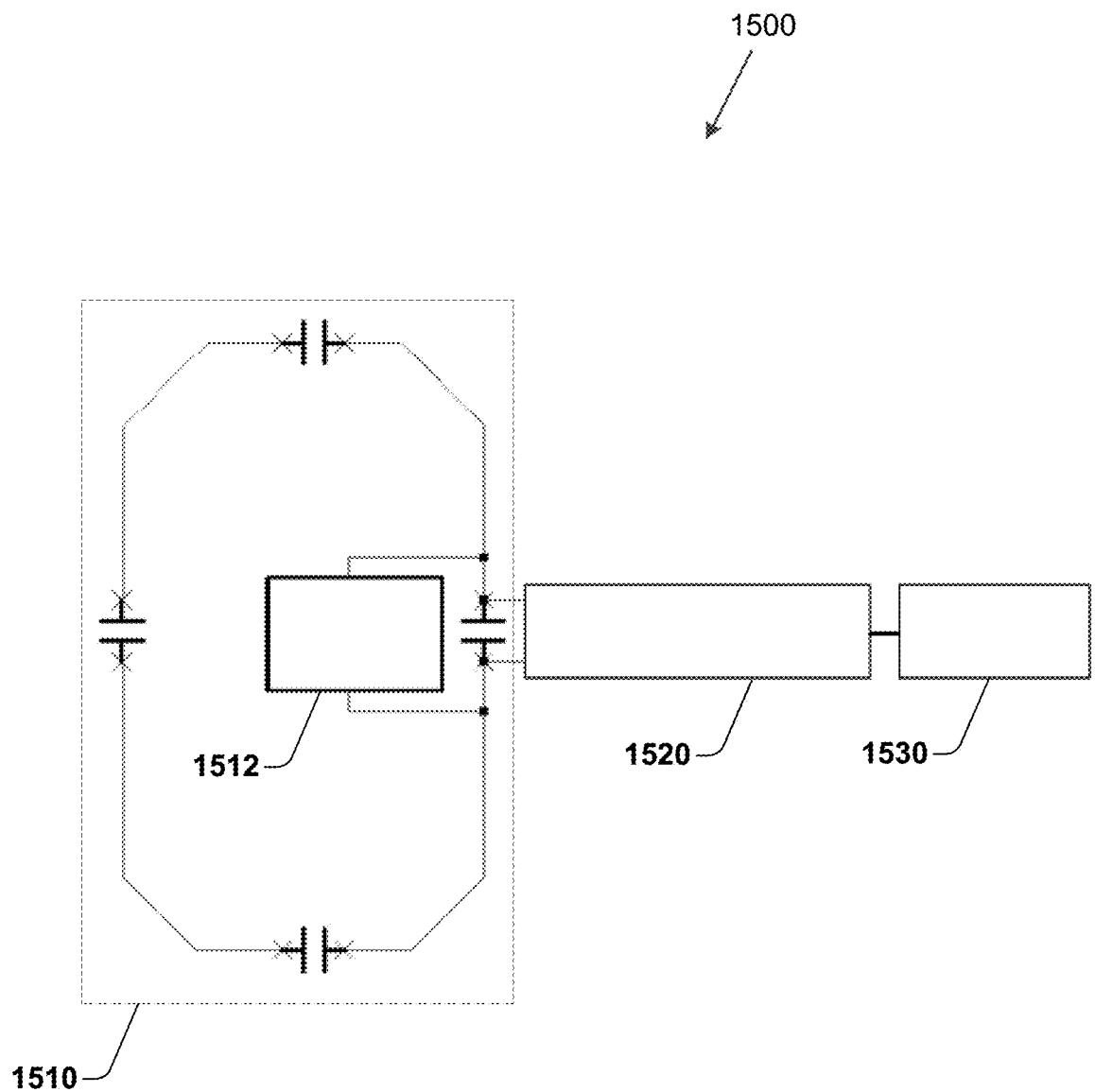
FIG. 15 illustrates an example single-layer MRI RF coil element.

FIG. 15 illustrates an example single-layer MRI RF coil array element 1500 configured to operate in a Tx mode and an Rx mode. Single-layer MRI RF coil array element 1500 includes an LC coil 1510, a matching and Tx/Rx switch circuit 1520 operably connected to the LC coil 1510, and a preamplifier or other Rx electronics 1530 operably connected to the matching and Tx/Rx circuit 1520. LC coil 1510 further includes a magnitude/phase control component 1512 operably connected to LC coil 1510.

LC coil 1510 includes at least one inductor and at least one capacitor, where the at least one inductor and the at least one capacitor resonate at a first frequency. The first frequency may be, for example, the working frequency. In one embodiment, LC coil 1510 may be configured as LC coil 610 illustrated in FIG. 6, 8, 9, or 10. In another embodiment, LC coil 1510 may be configured as LC coil 1110 as illustrated in FIG. 11 or 12.

In one embodiment, LC coil 1510 includes at least one conductor. The at least one conductor may be a flexible co-axial cable. Thus, LC coil 1510 may be configured as a flexible LC coil, and single-layer MRI RF coil array element 1500 may be configured as a flexible single-layer MRI RF coil array element.

The matching and Tx/Rx switch circuit 1520, when operating in Tx mode, electrically isolates LC coil 1510 from preamplifier 1530 upon LC coil 1510 resonating with a primary coil (not illustrated). The primary coil has a working frequency.

In one embodiment, the matching and Tx/Rx switch circuit 1520 is a capacitive matching and Tx/Rx switch circuit. For example, matching and Tx/Rx switch circuit 1520 may be configured as matching and Tx/Rx switch circuit 820 illustrated in FIG. 8. In another embodiment, matching and Tx/Rx switch circuit 1520 may be configured as matching and Tx/Rx switch circuit 920 illustrated in FIG. 9. In another embodiment, matching and Tx/Rx switch circuit 1520 may be configured using other, different matching and Tx/Rx switch circuitry configurations.

LC coil 1510, upon resonating with the primary coil, generates a local amplified Tx field based on an induced current in LC coil 1510. The induced current is generated by inductive coupling between LC coil 1510 and the primary coil. A magnitude of the induced current or a phase of the induced current is independently adjustable. The magnitude of the induced current or the phase of the induced current is configured to be varied over a range of magnitudes or phases respectively.

The matching and Tx/Rx switch circuit 1520, when operating in Rx mode, electrically connects LC coil 1510 with preamplifier 1530.

Magnitude/phase control component 1512 is configured to adjust the magnitude of the induced current or the phase of the induced current. In one embodiment, magnitude/phase control component 1512 is configured to, upon single-layer MRI RF coil array element 1500 operating in Tx mode, adjust the magnitude of the induced current or the phase of the induced current by shifting the first frequency of LC coil 1510 relative to the working frequency of the primary coil. For example, in one embodiment, magnitude/phase control component 1512 is configured to use a first approach to adjust a magnitude of the induced current or the phase of the induced current by shifting the MR coil's (e.g., LC coil 1510) resonant frequency from the working frequency of the WBC. Recall that the induced current $i_s$ may be expressed as:

$$i_s = \frac{-j\omega M\varepsilon}{\left(R_p R_s + \omega^2 M^2 + jR_p\left(\omega L_s - \frac{1}{\omega C_s}\right)\right)} \quad \text{(Eq. 4)}$$

where there is an additional term $$jR_p\left(\omega L_s - \frac{1}{\omega C_s}\right)$$

in the denominator.

If the coil frequency is same as the working frequency, this additional term is zero. Example embodiments adjust this new term by changing the frequency to either higher than the working frequency or lower than the working frequency. This facilitates adjusting the magnitude and phase of the induced current $i_s$ simultaneously. If the magnitude and phase of $i_s$ are changed, the magnitude and phase of the induced field is also changed. Thus we have a coil that is a pTx-equivalent coil. Eq. 4 changes magnitude and phase simultaneously. In some situations, it may be desirable to have additional freedom to control magnitude and phase independently. Embodiments facilitate controlling the magnitude and phase of the induced current independently.

In another embodiment, magnitude/phase control component 1512 is configured to use a second approach to adjust a coil's magnitude and phase by independently adding additional coil loss (i.e., resistance) when operating in Tx mode. For example, in one embodiment, the magnitude/phase control component 1512 is configured to, upon the single-layer MRI RF coil array element 1500 operating in Tx mode, adjust the magnitude of the induced current or the phase of the induced current by adding coil loss to the LC coil 1510. In this embodiment, the magnitude/phase control component 1512 comprises a resistor and a PIN diode connected in parallel with the at least one capacitor, where the single-layer MRI RF coil array element 1500 operates in Tx mode upon the injection of a DC bias into the PIN diode, where the DC bias forward biases the PIN diode.

Figure 16:
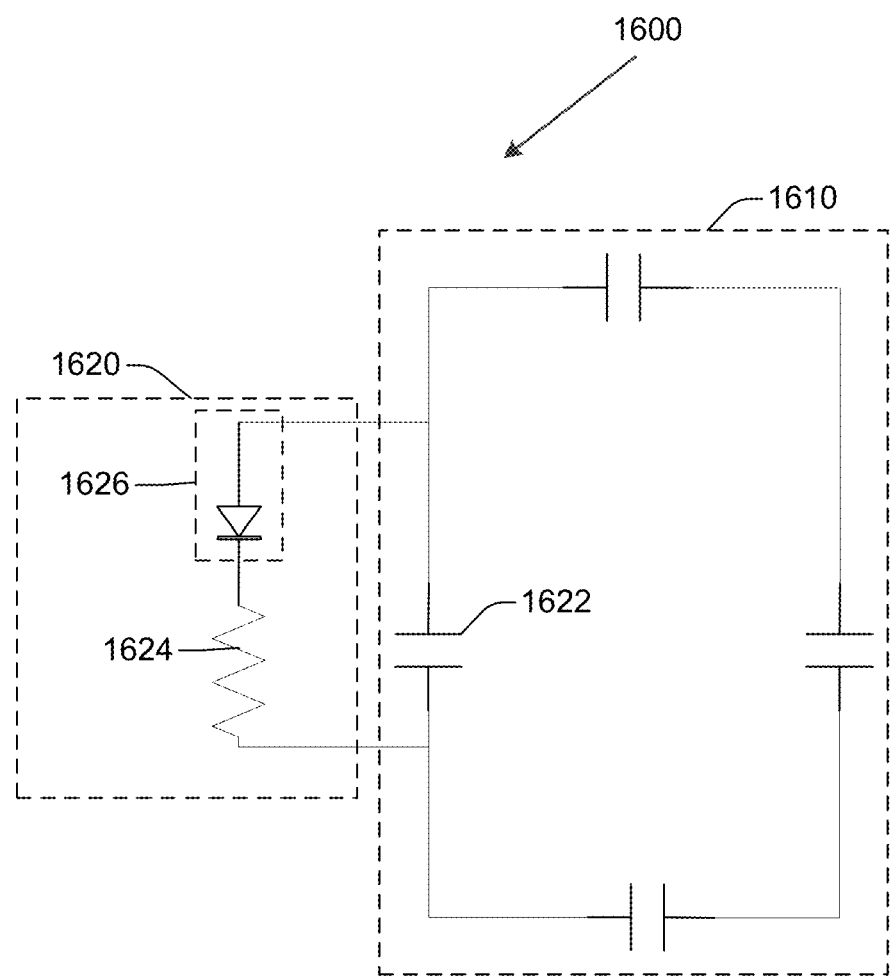
FIG. 16 illustrates an example single-layer MRI RF coil element.

This second approach includes increasing $R_s$ when operating in Tx mode. Increasing $R_s$ reduces the magnitude alone if the coil's resonant frequency is the same as the working frequency. Increasing $R_s$ reduces both magnitude and phase if the coil's resonant frequency and the working frequency are different. One example implementation of this second approach is illustrated in FIG. 16, which includes adding coil loss. In this embodiment, the single-layer MRI RF coil array element 1600 includes a magnitude/phase control component 1620, and LC coil 1610 that includes one or more breaking point capacitors 1622. A resistor 1624 is added in parallel to the capacitor 1622 through a PIN diode 1626. Matching and Rx/Tx switch circuit 1520 and preamplifier 1530 are not illustrated for clarity. The breaking point can also be a feeding point, i.e., a matching capacitor. In Tx mode the PIN diode 1626 is shorted and the resistor 1624 is in parallel with capacitor 1622, which causes $R_s$ to increase. The value of $R_s$ may be chosen to meet particular magnitude and phase requirements for imaging different anatomical regions. The resistor 1624 is configured to be powerful enough to take a high current in Tx mode. For example, resistors having resistance within the kilo-Ohms range may be employed to reduce current magnitude significantly. The smaller the resistor value, the lesser the current magnitude, and the lower the coil Q in Tx mode. In Rx mode the PIN diode 1626 is open, and the resistor 1624 is therefore not part of the coil resistance. This still results in a high Q receiving coil.

In another embodiment, the magnitude/phase control component 1512 is configured to, upon the single-layer MRI RF coil array element 1500 operating in Tx mode, adjust the magnitude of the induced current or the phase of the induced current by decreasing the induced current. In this embodiment, the magnitude/phase control component 1512 is configured to decrease the induced current by operating as a parallel resonant circuit when in Tx mode. In this embodiment, the magnitude/phase control component 1512 comprises an inductor and a PIN diode connected in parallel with a first member of the at least one capacitor, where the first member of the at least one capacitor has a higher capacitance than a second, different member of the at least one capacitor, where the single-layer MRI RF coil array element operates in Tx mode upon the injection of a DC bias into the PIN diode, where the DC bias forward biases the PIN diode. In one embodiment, the magnitude/phase control component 1512 introduces a blocking impedance of less than one-hundred Ohms to the LC coil when operating in Tx mode.

Figure 17:
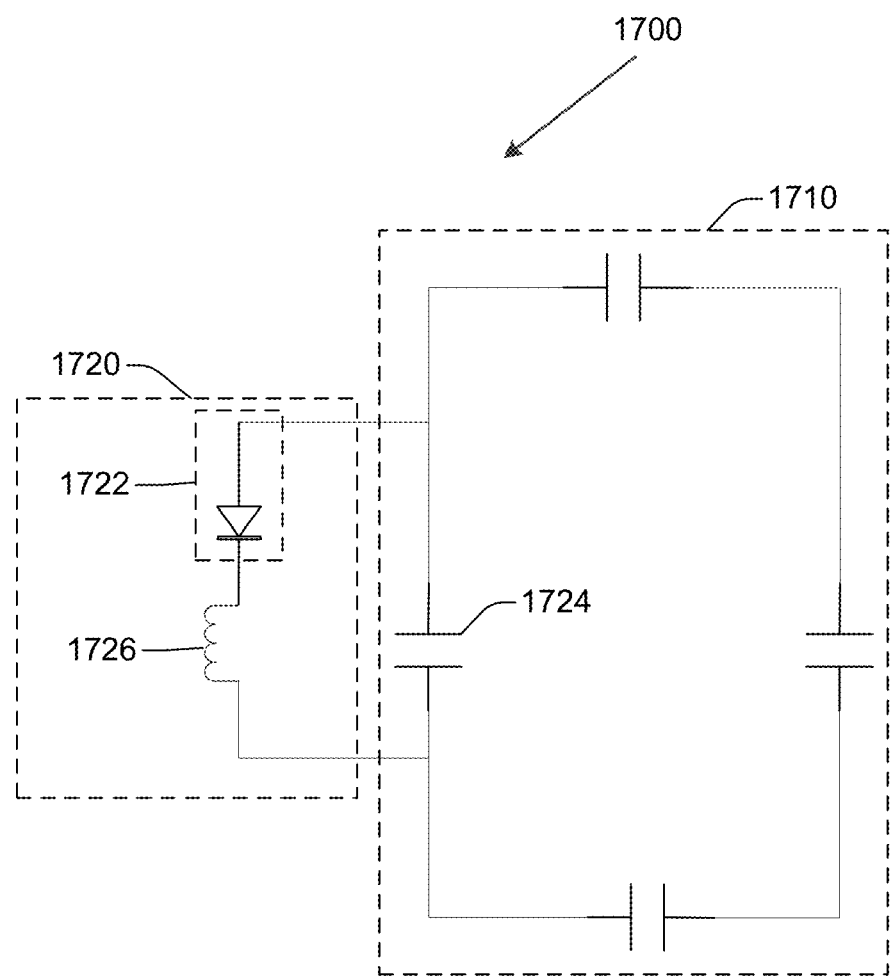
FIG. 17 illustrates an example single-layer MRI RF coil element.

For example, in one embodiment, magnitude/phase control component 1512 is configured to use a third approach that includes introducing a parallel resonant circuit in the coil when operating in Tx mode only. One example implementation of this third approach is illustrated in FIG. 17. FIG. 17 illustrates a single-layer MRI RF coil array element 1700 that includes LC coil 1710, and magnitude/phase control component 1720. Magnitude/phase control component 1720 is configured as an LC parallel resonant circuit. Magnitude/phase control component 1720 includes a PIN diode 1722 that controls magnitude/phase control component 1720 to minimize the induced current in a coil 1710 when operating in Tx mode. Typically, the blocking impedance of magnitude/phase control component 1720 when operating in Tx mode as an LC parallel resonant circuit is very large, e.g., several kOhm. This impedance almost completely eliminates the induced current in coil 1710. Example embodiments may still need to use the induced current. Thus, example embodiments may reduce current magnitude, but do not need to almost completely eliminate the current. Therefore example embodiments may employ a weak blocking impedance of several Ohms to tens of Ohms, instead of a strong blocking impedance of several kOhms. Example embodiments may use a capacitor 1724 having a large value of capacitance and inductor 1726 having a small value of inductance to resonate. This parallel resonant circuit 1720 can be installed anywhere in the coil 1710 to reduce the induced current in Tx mode only. Recalling that $$i_s = \frac{-j\omega M \varepsilon}{(R_p R_s + \omega^2 M^2)}$$

and Eq. 4, example embodiments thus facilitate controlling current magnitude by changing the value of $R_s$. In Rx mode the PIN diode 1722 is open. In one embodiment, example embodiments may reduce the current magnitude such that the single-layer MRI RF coil is operating in a non-amplified Tx mode.

Figure 18:
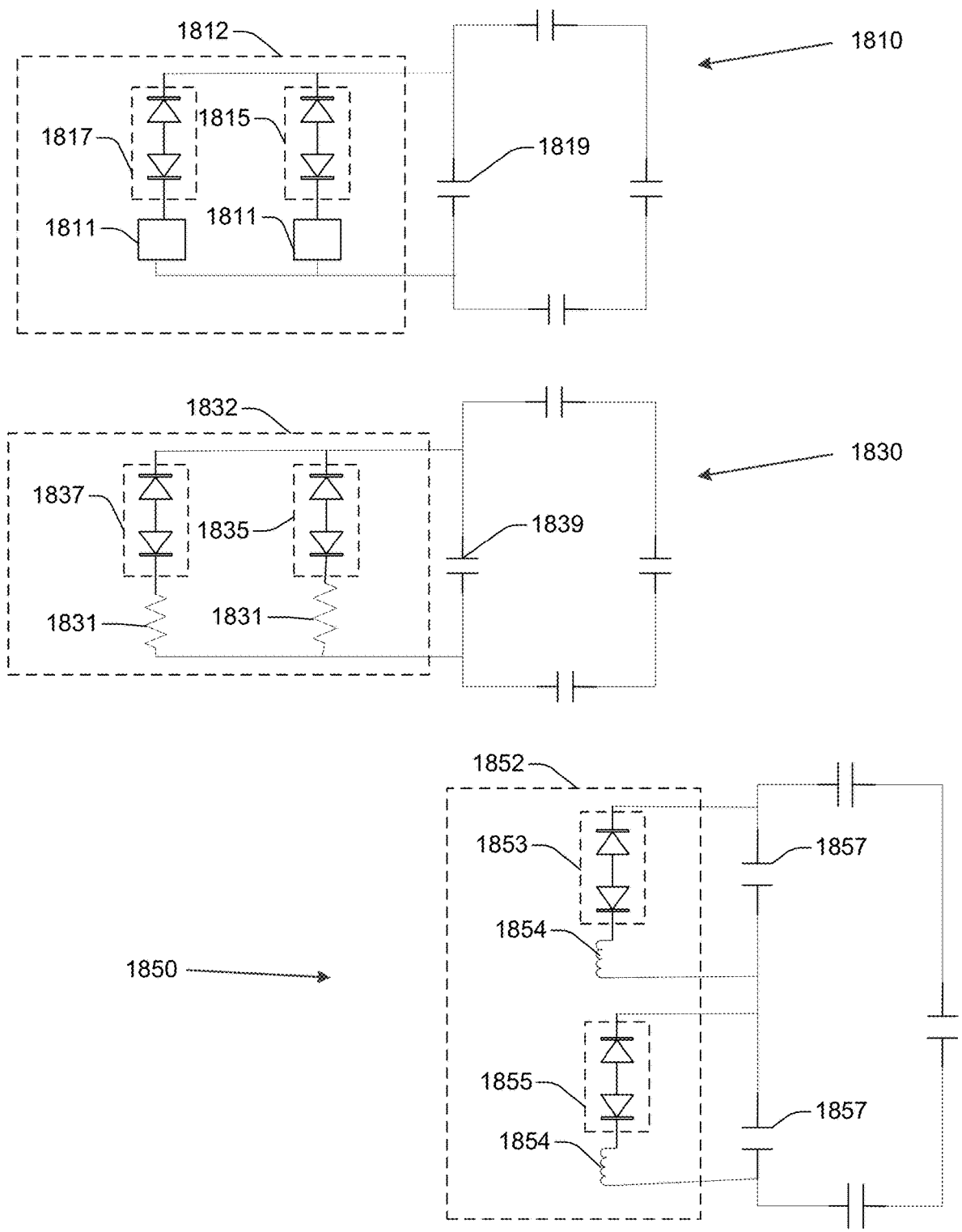
FIG. 18 illustrates example single-layer MRI RF coil elements.

The three approaches to adjust a coil's magnitude and phase described above may be employed together to create a mode selection approach for different induced current magnitudes and phases for the same coil in Tx mode. This approach is shown in FIG. 18. FIG. 18 illustrates single-layer MRI RF coil array elements 1810, 1830, and 1850. For clarity of illustration, FIG. 18 does not include matching and Tx/Rx switch circuitry or a preamplifier or other Rx electronics. FIG. 18 illustrates magnitude/phase control components 1812, 1832, and 1852 which are configured to provide two mode switching. Mode switching is conducted by applying a bias to PIN diode pairs 1815 and 1817, 1835 and 1837, or 1853 and 1855. Each of PIN diode pairs 1815 and 1817, 1835 and 1837, or 1853 and 1855 includes a pair of back-to-back PIN diodes. In other embodiments, three or more modes switching may be implemented by adding more back to back diodes into the path. The back to back diodes in PIN diode pairs 1815 and 1817, 1835 and 1837, or 1853 and 1855 have reverse polarization from each other. The PIN diodes' breakdown voltage may be greater than the induced voltage across the capacitor 1819, 1839, or 1857 respectively when operating in Tx mode. In Tx mode only one pair of diodes (e.g., either PIN diode pair 1815 or PIN diode pair 1817) will be ON (short). For example, PIN diode pair 1815 can be ON(short) and PIN diode pair 1817 can be OFF (open) or vice versa in Tx mode. The PIN diode pair 1815 pair path and the PIN diode pair 1817 pair path will have different induced magnitude and phase. These different magnitudes and phases may be used for different purposes depending on particular clinical scanning requirements. If one of the PIN diode pairs is not ON while the other one is ON, the breakdown voltage that is greater than the induced voltage across the capacitor will ensure the not-ON PIN diode pair path is not part of the coil and the pair of PIN diodes survives the currents generated when operating in Tx mode. The approach may be expanded to more than two modes, such as three modes, four modes, or more modes.

Magnitude/phase control component 1812 is configured to provide control of two different switchable magnitudes and phases by frequency shifting using reactance. Reactance components 1811 may include a capacitor or an inductor.

Magnitude/phase control component 1832 is configured to provide control of two different switchable magnitudes and phases using coil losses generated with the resistor-based approach described with respect to FIG. 16. Thus, magnitude/phase control component 1832 is similar to magnitude/phase control component 1812, but includes resistors 1831 instead of reactance components 1811.

Magnitude/phase control component 1852 is configured to provide control of two different switchable magnitudes and phases control using coil loss produced by LC parallel resonance. Magnitude/phase control component 1852 includes PIN diode pairs 1853 and 1855, and inductors 1854. One exemplary LC parallel resonance approach is described with respect to FIG. 17 which may be extended to the embodiment illustrated in FIG. 18.

Example embodiments thus provide circuits, components, means, apparatus, systems, or techniques to facilitate independent magnitude and phase control for an MRI RF coil by solving the magnitude and phase equation with the controllable variables as described above. Furthermore, example embodiments facilitate choosing more than one different magnitude and phase combination, i.e., more than one different Tx field pattern for different scanning or different anatomical region imaging requirements. In embodiments described herein, these approaches create Tx fields in Tx mode. In Rx mode, coils described herein operate as a phased array coil at the nominal working frequency.

Figure 19:
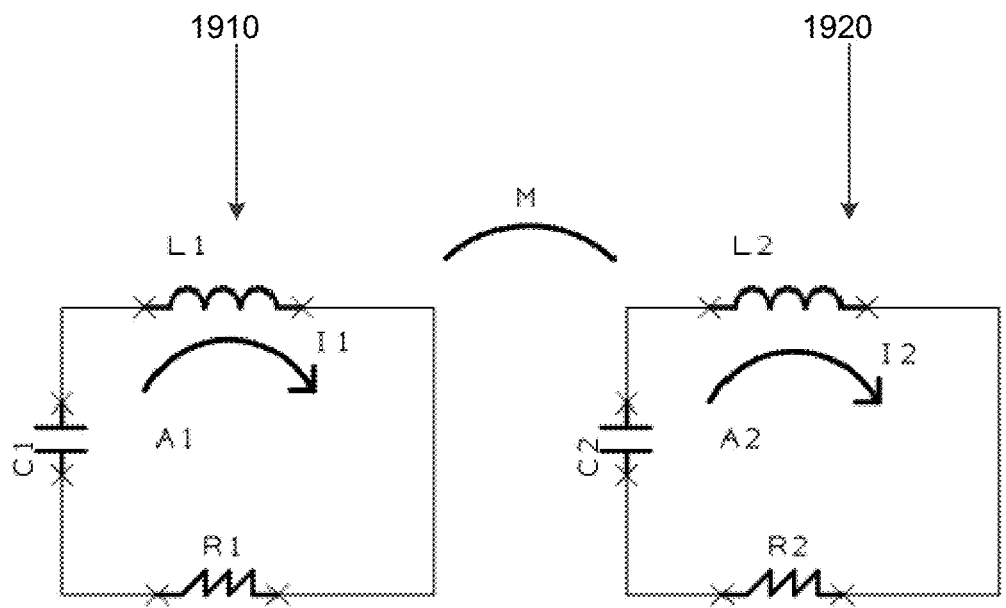
FIG. 19 illustrates inductively coupled resonant RF coils.

In addition to an induced current from a WBC field, an MRI RF coil array element as described herein may experience induced current from other MRI RF coil array elements due to non-trivial mutual inductance among the MRF RF coil array element and the other MRI RF coil array elements. FIG. 19 demonstrates this induced current. Two MRI RF coil array elements 1910 and 1920 are exposed in a uniform $B_1$ field of a WBC are shown in FIG. 19. In this example, the uniform $B_1$ field is perpendicular to MRI RF coil array elements 1910 and 1920. The two coil elements 1910 and 1920 have areas A1 and A2 respectively. The two coil elements 1910 and 1920 have non-trivial mutual inductance between them. The self inductances L1 and L2, capacitances C1 and C2, coil losses R1 and R2, current flow I1 and I2, and projected areas A1 and A2 for coil elements 1910 and 1920 respectively are illustrated as shown in FIG. 19.

From FIG. 19, equations 19 and 20 may be defined:

$$j\omega_0 B_1 A_1 = j\omega_0 L_1 I_1 + \frac{1}{j\omega_0 C_1} I_1 + R_1 I_1 + j\omega_0 M I_2 \quad \text{Eq. 19}$$

$$j\omega_0 B_1 A_2 = j\omega_0 L_2 I_2 + \frac{1}{j\omega_0 C_2} I_2 + R_2 I_2 + j\omega_0 M I_1 \quad \text{Eq. 20}$$

In one embodiment, assuming that both coil 1910 and coil 1920 also resonate at $\omega_0$ in Tx mode, then Eq. 19(3) and 20(4) can be simplified as below:

$$j\omega_0 B_1 A_1 = R_1 I_1 + j\omega_0 M I_2 \quad \text{Eq. 21}$$

$$j\omega_0 B_1 A_2 = R_2 I_2 + j\omega_0 M I_1 \quad \text{Eq.22}$$

Solving equations 21 and 22 results in:

$$I_1 = \frac{j\omega_0 B_1 A_1 - j\omega_0 B_1 A_2 \frac{j\omega_0 M}{R_2}}{\frac{(\omega_0 M)^2}{R_2} + R_1} \quad \text{Eq. 23}$$

$$I_2 = \frac{j\omega_0 B_1 A_2 - j\omega_0 B_1 A_1 \frac{j\omega_0 M}{R_1}}{\frac{(\omega_0 M)^2}{R_1} + R_2} \quad \text{Eq. 24}$$

If mutual inductance is not trivial, i.e., $\omega_0 M \gg R_1$ and $R_2$, and if the values $A_1$ and $A_2$ are not significantly different, then Eq. 23 and 24 can be simplified as:

$$I_1 \cong \frac{-j\omega_0 B_1 A_2 \frac{j\omega_0 M}{R_2}}{\frac{(\omega_0 M)^2}{R_2} + R_1} \qquad \text{Eq. 25}$$

$$I_2 \cong \frac{-j\omega_0 B_1 A_1 \frac{j\omega_0 M}{R_1}}{\frac{(\omega_0 M)^2}{R_1} + R_2} \qquad \text{Eq. 26}$$

Thus, $I_1$ is determined by the WBC induced voltage in coil 1920, that is, by its neighbor coil 1910 instead of itself coil 1920 itself, and vice versa. Consequently, the local mutual inductance coupled modes among local array coils are dominant if the mutual inductances are not trivial. Therefore, the final induced field of the array coils (e.g., 1910 and 1920) from the WBC is the sum of the WBC induced fields from coils with trivial mutual inductance from other elements and the local coupled modes among the coils having non-trivial mutual inductances. In particular the local coupled modes may have multiple different frequencies and different Tx field patterns. Depending on the application in which coil 1910 and coil 1920 are being employed, (e.g., for a first anatomy, for a second, different anatomy) the appropriate local coupled mode or modes may be adjusted in such a way that its or their frequencies must be close to or the same as the working frequency $\omega_0$.

Figure 20:
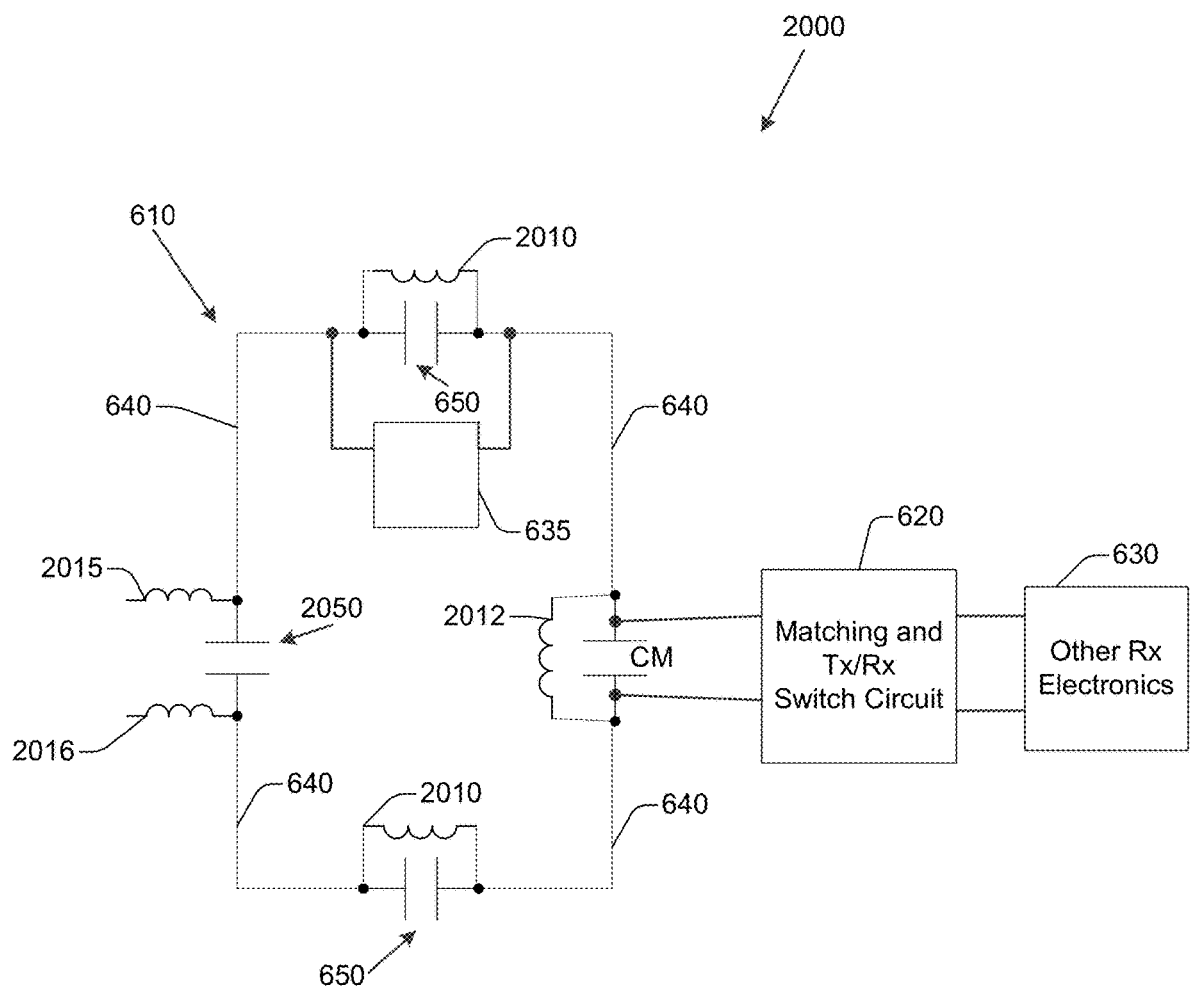
FIG. 20 illustrates an example single-layer MRI RF coil element with integrated $B_0$ shimming.

FIG. 20 illustrates a single-layer MRI RF coil array element 2000 that is similar to MRI RF coil element 600 but that includes additional details and elements. Single-layer MRI RF coil element 2000 is configured to operate in a Tx mode or in an Rx mode. Single-layer MRI RF coil element 2000 is further configured to provide integrated B0 field shimming. In one embodiment, single-layer MRI RF coil array element 2000 may be part of a single-layer MRI RF coil array. A single-layer MRI RF coil array comprises at least one RF coil element (e.g., single-layer MRI RF coil array element 2000).

Single-layer MRI RF coil array element 2000 includes an LC coil 610, a matching and Tx/Rx switch circuit 620 operably connected to the LC coil 610, a preamplifier 630 operably connected to the matching and Tx/Rx circuit 620, and a magnitude/phase control component 635 operably connected to the LC coil 610. LC coil 610 includes at least one inductor 640 and at least one capacitor 650. The at least one inductor 640 and the at least one capacitor 650 resonate at a first frequency (i.e., a resonant frequency). The at least one inductor 640 may be, for example, a co-axial cable, a copper wire, a copper foil soldered to a circuit board, or other conductor. Single-layer MRI RF coil element 2000 also includes at least one RF choke 2010.

The at least one RF choke 2010 is connected in parallel with the at least one capacitor 650. The at least one RF choke 2010 connected in parallel with the at least one capacitor 650, and the at least one inductor 640, provide a current path for a DC $B_0$ shimming current.

The LC coil 610 further includes an injection point capacitor 2050 having a first terminal and a second terminal. A first injection point RF choke 2015 is connected at a first end to the first terminal of injection point capacitor 2050. A second injection point RF choke 2016 is connected at a first end to the second terminal of injection point capacitor 2050. First injection point RF choke 2015 and second injection point RF choke 2016 are similar to RF chokes 2010 and RF choke 2012. First injection point RF choke 2015 and second injection point RF choke 2016 may be connected, at a second end, with a current source (not illustrated). First injection point RF choke 2015 and second injection point RF choke 2016 are configured to receive a DC $B_0$ shimming current from the current source.

The matching and Tx/Rx switch circuit 620, when operating in Tx mode, electrically isolates the LC coil 610 from the preamplifier 630 upon the LC coil 610 resonating with a primary coil. The primary coil has a working frequency. The LC coil 610, upon resonating with the primary coil, generates a local amplified Tx field based on an induced current in the LC coil 610. The induced current is generated by inductive coupling between the LC coil 610 and the primary coil. A magnitude of the induced current or a phase of the induced current is independently adjustable. The magnitude of the induced current or the phase of the induced current is configured to be varied over a range of magnitudes or phases respectively using techniques described herein.

The matching and Tx/Rx switch circuit 620, when operating in Rx mode, electrically connects the LC coil 610 with the preamplifier 630. In one embodiment, matching and Tx/Rx switch circuit 620 is a capacitive matching Tx/Rx switch circuit that uses capacitive matching. In this embodiment, RF choke 2012 is connected in parallel with matching capacitor CM. RF choke 2012 is similar to at least one RF choke 2010, and provides a current path for a DC $B_0$ shimming current.

Magnitude/phase control component 635 is configured to adjust the magnitude of the induced current or the phase of the induced current. Magnitude/phase control component 635 is configured to, upon single-layer MRI RF coil array element 2000 operating in Tx mode, adjust the magnitude of the induced current or the phase of the induced current by controlling a coil loss resistance of the primary coil, by controlling a coil loss resistance of single-layer MRI RF coil array element 2000, or by controlling a difference between the working frequency of the primary coil and the first frequency. The magnitude of the induced current or a phase of the induced current is a function of a coil loss resistance of the primary coil, a coil loss resistance of single-layer MRI RF coil array element 2000, or a difference between the working frequency of the primary coil and the first frequency. The magnitude/phase control component 635 is configured to adjust the magnitude of the induced current or the phase of the induced current by adjusting at least one of a coil loss resistance of the primary coil, a coil loss resistance of the at least one RF coil element, or a difference between the working frequency of the primary coil and the first frequency, according to techniques described herein.

First injection point RF choke 2015 and second injection point RF choke 2016 are configured to receive a DC $B_0$ shimming current from a current source. The at least one RF choke 2010, and RF choke 2012 provide a current path for the $B_0$ shimming current. The current path facilitates controlling the $B_0$ shimming current to pass the at least one capacitor 650 or matching capacitor CM. In this embodiment, upon a DC $B_0$ shimming current being injected into the LC coil 610 through the first injection point RF choke 2015 or the second injection point RF choke 2016, the DC $B_0$ shimming current flows through the LC coil 610. The DC $B_0$ shimming current flowing through the LC coil 610 generates a local $B_0$ magnetic field for $B_0$ field shimming. In one embodiment, the $B_0$ shimming current may be a pulsed current. In one embodiment, the current source may be a DC power supply.

In one embodiment, the at least one RF choke 2010 and RF choke 2012 provide an RF blocking impedance of at least 500 Ohm. In one example, part of capacitor 650 or capacitor CM may resonate with at least one RF choke 2010 or RF choke 2012 respectively, where at least one RF choke 2010 and RF choke 2012 act like a perfect choke in parallel with the rest capacitance of capacitor 650 or capacitor CM. In one embodiment, the first injection point RF choke 2015 and the second injection point RF choke 2016 provide a blocking impedance of at least 500 Ohm.

In one embodiment, the first injection point RF choke 2015 and the second injection point RF choke 2016 are large value inductors. For example, the first injection point RF choke 2015 and second injection point RF choke 2016 may provide blocking impedance of at least 500 Ohm at the working frequency. In another embodiment, first injection point RF choke 2015 and second injection point RF choke 2016 are smaller value inductors connected in parallel with capacitors such that first injection point RF choke 2015 and second injection point RF choke 2016 resonate with the capacitor to create a high value blocking impedance at the working frequency.

In one embodiment, the at least one RF choke 2010 and RF choke 2012 are inductors. In this embodiment, because the capacitors connected in parallel with them, such as 650 and CM, the capacitors may resonate with the inductors (e.g., at least one RF choke 2010 and RF choke 2012) to generate a large blocking impedance at the working frequency, at least one RF choke 2010 and RF choke 2012 may have values other than 500 Ohm, including smaller or larger values. In embodiments described herein, at least one RF choke 2010, RF choke 2012, first injection point RF choke 2015 and second injection point RF choke 2016 are configured such that they can take the $B_0$ shimming coil DC current rating requirement, i.e., their wire diameter is large enough to take the maximum DC current.

In one embodiment, the $B_0$ shimming current is less than 1 A. For example, the $B_0$ shimming current may have a value of 0.9 A, 0.5 A, 0.3 A, or other value less than 1 A. A conventional local coil with local $B_0$ shimming requires a shimming current of at least 4 A. 1 A is significantly less than the 4 A or greater current required for shims integrated with a gradient coil using a conventional approach. Embodiments thus improve on conventional $B_0$ shimming approaches in a measurable way, by reducing the required current for $B_0$ shimming. By requiring a smaller current for $B_0$ shimming, embodiments reduce the power consumption of an MRI system in which example embodiments are implemented.

Figure 21:
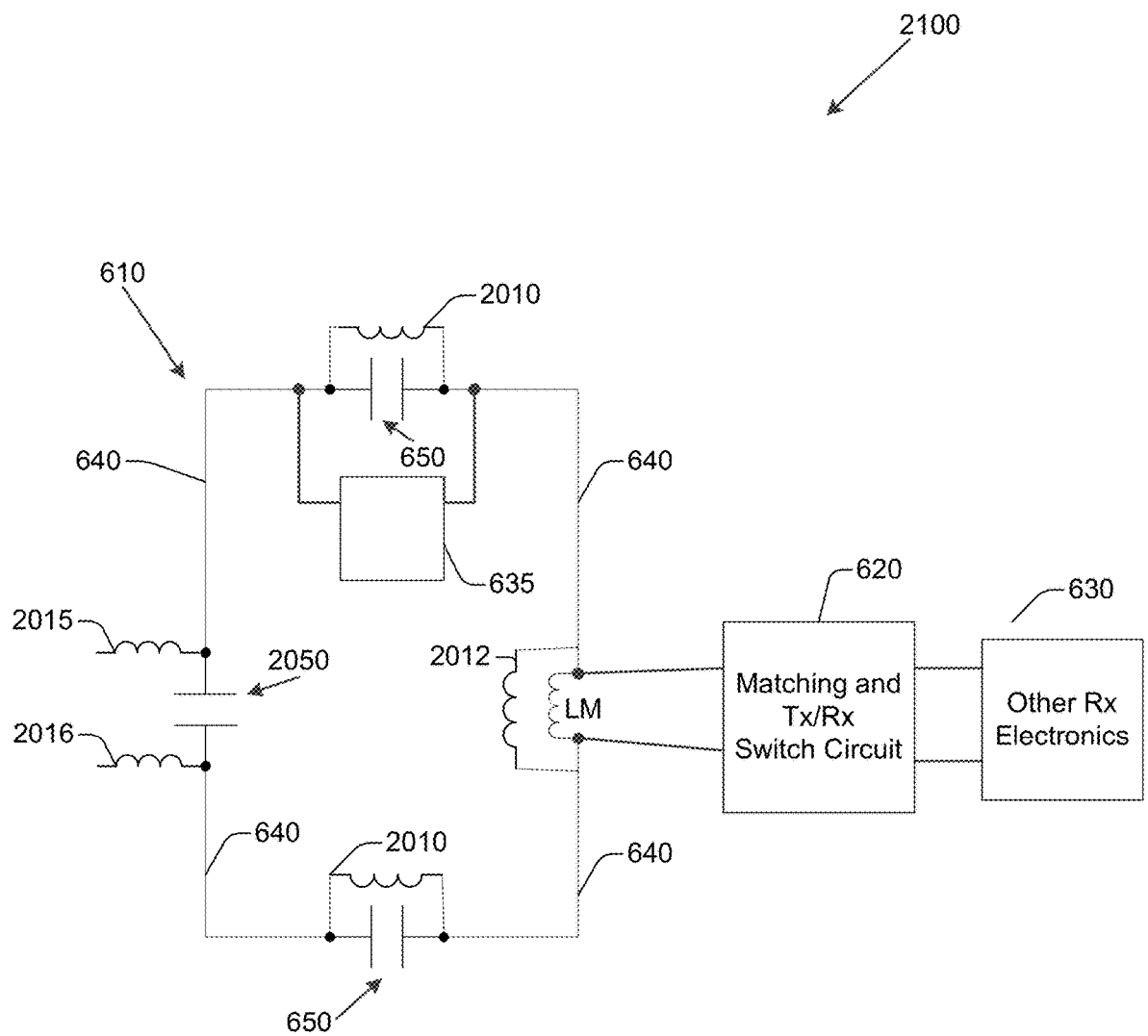
FIG. 21 illustrates an example single-layer MRI RF coil element with integrated $B_0$ shimming.

FIG. 21 illustrates a single-layer MRI RF coil array element 2100 that is similar to single-layer MRI RF coil array element 2000, but that includes additional elements and details. In the embodiment illustrated in FIG. 21, matching and Tx/Rx switch circuit 620 is an inductive matching Tx/Rx switch circuit that uses inductive matching. In the embodiment illustrated in FIG. 21, the LC coil 610 further comprises a matching inductor LM. In this embodiment, RF choke 2012 is connected in parallel with matching inductor LM. In another embodiment, MRI RF coil array element 2100 does not include RF choke 2012, because the matching inductor LM may itself provide a path for the DC $B_0$ shimming current.

Figure 22:
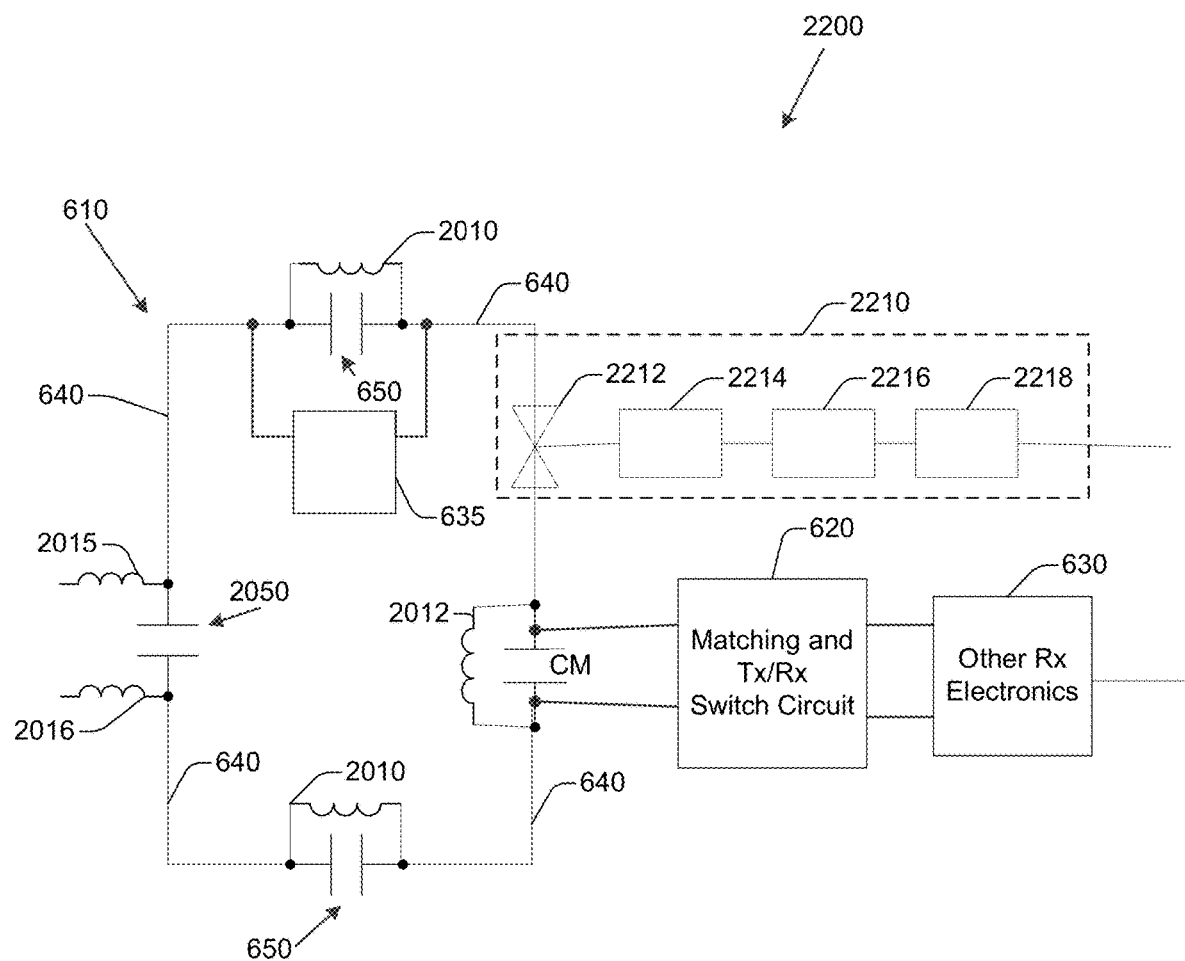
FIG. 22 illustrates an example single-layer MRI RF coil element with integrated $B_0$ shimming and transmit field hardware monitoring.

FIG. 22 illustrates a single-layer MRI RF coil array element 2200 that is similar to single-layer MRI RF coil array element 2000 and single-layer MRI RF coil array element 2100 but that includes additional elements and details. Single-layer MRI RF coil array element 2200 includes a Tx field monitoring component 2210. Tx field monitoring component 2210 is configured to provide hardware monitoring of the Tx field generated by single-layer MRI RF coil array element 2200 during Tx mode operation. Tx field monitoring component 2210 is configured to monitor induced current generated during Tx mode operation in a pickup loop that is disposed within a threshold distance of the single-layer MRI RF coil element 2000.

Tx field monitoring component 2210 is configured to, upon the single-layer MRI RF coil array element 2200 operating in Tx mode, monitor the strength of the local amplified Tx field (i.e., the $B_1$ field). Tx field monitoring component 2210 monitors the strength of the local amplified Tx field by monitoring an induced current generated in a pickup loop that is disposed within a threshold distance of the single-layer MRI RF coil element 2000. Tx field monitoring component 2210 is further configured to, upon detecting that the magnitude of the local amplified Tx field exceeds a threshold value, output a signal to terminate the Tx mode. For example, Tx field monitoring component 2210 may be operably connected to an MRI system that controls MRI RF coil array element 2200. Tx field monitoring component 2210, may, in this example, upon detecting that the strength of the local amplified Tx field exceeds a threshold value, output a signal that is received by the MRI system, and that instructs the MRI system to terminate transmission, or to otherwise terminate the Tx mode.

In one embodiment, Tx field monitoring component 2210 includes a pickup loop 2212, an attenuator 2214, an RF switch 2216, and a current/voltage monitor 2218. Pickup loop 2212 is disposed within a threshold distance of LC coil 610 so that pickup loop 2212 can pick up the local $B_1$ field of LC coil 610. The threshold distance may be determined based on the local $B_1$ field, the design of pickup loop 2212, or on other design or operating parameters of the single-layer MRI RF coil array element of which Tx field monitoring component is a part. A current or voltage may be induced in pickup loop 2212 by the $B_1$ field generated when MRI RF coil array element 2200 is operating in Tx mode. Pickup loop 2212 may output to current/voltage monitor 2214 a current, voltage, or signal. Pickup look 2212 may capture magnetic flux associated with a current flow through MRI RF coil array element 2200. Recall that a $B_1$ field generated by MRI RF coil array element 2200, and a current through MRI RF coil array element 2200, are related, as per their definition by Maxwell's equations.

In one embodiment pickup loop 2212 is a butterfly pickup loop. Pickup loop 2212 may be, for example, a butterfly loop having two loops in which current flows are opposite to each other. This allows pickup loop 2212 to capture most of the magnetic flux generated by a current if the current flows on the same plane as the pickup loop 2212 and along the mirror symmetry line of pickup loop 2212. The size of the pickup loop 2212 is determined so that its presence does not create a significant disturbance to LC coil 610's Q and frequency. In one embodiment, pickup loop 2212 may be a simple loop having one turn, or other type of loop. In another embodiment, pickup loop 2212 may be a solenoid. In another embodiment, pickup loop 2212 may include a capacitor. In this embodiment, Tx field monitoring component 2210 may be configured to measure a voltage across the capacitor, and to compute a magnitude or phase of the induced current in MRI RF coil array element 2200 based on the measured voltage using Ohm's Law.

In one embodiment, Tx field monitoring component 2210 includes an attenuator 2214. Attenuator 2214 is connected in series between pickup loop 2212 and RF switch 2216. Attenuator 2214 reduces the power of an induced current or voltage produced by pickup loop 2212. Attenuator 2214, by reducing the power of the induced current or voltage produced by pickup loop 2212, protects an MRI system to which MRI RF coil element 2200 or Tx field monitoring component 2210 may be connected. In one embodiment, attenuator 2214 is a 30 dB attenuator. In another embodiment, attenuator 2214 may reduce the power of an induced current or voltage produced by pickup loop 2212 by a different amount (e.g., 20 dB, 40 dB).

Tx field monitoring component 2210 also includes RF switch 2216. RF switch 2216 is connected in series between attenuator 2214 and current/voltage monitor 2218. RF switch 2216 is configured to activate pickup loop 2212 during transmission so that a connected MRI system can receive the pickup loop signal (e.g., when MRI RF coil element 2200 is operating in Tx mode). RF switch 2216 may include, for example, PIN diodes or an RF switch integrated circuit (IC). RF switch 2216 may be configured to be controlled by an MRI system, or by an MRI system control computer. For example, RF switch 2216 may receive a signal from an MRI system and, based on the signal, activate or deactivate pickup loop 2212.

Tx field monitoring component 2210 further includes current/voltage monitor 2218. Current/voltage monitor 2218 is configured to monitor an induced current or voltage induced in pickup loop 2212. Upon detecting that the induced current or voltage equals or exceeds a threshold value, current/voltage monitor 2218 may control an MRI system to which MRI RF coil element 2200 is connected, or may cause a signal to be sent to the MRI system, to terminate the transmission, or to shut down the MRI system. In one embodiment, current/voltage monitor 2218 may detect a fault in MRI RF coil element 2200 based, at least in part, on the value of the current or voltage, and may control the MRI system to short the DC current to ground, to terminate transmission, or to shut down the MRI system. In one embodiment, current/voltage monitor 2218 is configured to output a signal that is received by the MRI system indicating the value of the current or voltage, or indicating a detected fault. Current/voltage monitor 2218 may be, for example, an operational amplifier-based monitor or voltage/current comparator. Current/voltage monitor 2218 may be further configured to monitor the phase of the induced current or voltage induced in pickup loop 2212.

In one embodiment, Tx field monitoring component 2210 is further configured to monitor the phase of the induced current. The induced signal from the pickup loop 2212 is an AC signal. The induced signal thus already includes both magnitude and phase. To confirm that the B1 field is correct, or within acceptable parameters, or that the single-layer MRI RF coil array element is operating within acceptable parameters, embodiments may be configured to confirm that the magnitude or phase of the induced current are correct or within desired parameters. In this embodiment, Tx field monitoring component 2210 is configured to, upon detecting that the phase difference of the induced current exceeds a threshold phase difference, control an MRI system to which MRI RF coil element 2200 is connected, or may cause a signal to be sent to the MRI system, to terminate the transmission, or to shut down the MRI system.

Embodiments described herein include a single-layer MRI RF coil array. One embodiment includes a single-layer MRI RF coil array configured to operate in a Tx mode or in an Rx mode during an MRI procedure, and further configured to provide integrated $B_0$ field shimming. In this embodiment, the single-layer MRI RF coil array includes a plurality of single-layer MRI RF coil array elements (e.g., single-layer MRI RF coil array elements 2000, 2100, or 2200) configured to provide integrated $B_0$ field shimming. A single-layer MRI RF coil array element includes, in this embodiment, an LC coil, a matching and Tx/Rx switch circuit operably connected to the LC coil, a preamplifier operably connected to the matching and Tx/Rx circuit, and a magnitude/phase control component operably connected to the LC coil.

In this embodiment of the single-layer MRI RF coil array, the LC coil includes at least one inductor, at least one capacitor, and at least one RF choke. The at least one inductor and the at least one capacitor resonate at a first frequency. The at least one RF choke is connected in parallel with the at least one capacitor. The at least one RF choke connected in parallel with the at least one capacitor, and the at least one inductor, provide a current path for a DC $B_0$ shimming current.

In this embodiment of the single-layer MRI RF coil array, the LC coil further includes a first injection point capacitor having a first terminal and a second terminal, where a first injection point RF choke is connected at a first end to the first terminal, and a second injection point RF choke is connected at a first end to the second terminal.

In this embodiment of the single-layer MRI RF coil array, the matching and Tx/Rx switch circuit, when operating in Tx mode, electrically isolates the LC coil from the preamplifier upon the LC coil resonating with a primary coil. The primary coil has a working frequency. The matching and Tx/Rx switch circuit, when operating in Rx mode, electrically connects the LC coil with the preamplifier.

In this embodiment of the single-layer MRI RF coil array, the LC coil, upon resonating with the primary coil, generates a local amplified Tx field based on an induced current in the LC coil, the induced current generated by inductive coupling between the LC coil and the primary coil. A magnitude of the induced current or a phase of the induced current is independently adjustable. The magnitude of the induced current or the phase of the induced current is configured to be varied over a range of magnitudes or phases respectively.

In this embodiment of the single-layer MRI RF coil array, the magnitude/phase control component is configured to adjust the magnitude of the induced current or the phase of the induced current. The magnitude/phase control component may adjust the magnitude of the induced current or the phase of the induced current by, for example, adjusting at least one of a coil loss resistance of the primary coil, a coil loss resistance of the at least one single-layer MRI RF coil array element, or a difference between the working frequency of the primary coil and the first frequency, according to techniques described herein.

In this embodiment of the single-layer MRI RF coil array, upon a DC $B_0$ shimming current being injected into the LC coil through the first injection point RF choke or the second injection point RF choke, the DC $B_0$ shimming current flows in the LC coil. The DC $B_0$ shimming current flowing through the LC coil generates a local $B_0$ magnetic field for $B_0$ field shimming.

The first injection point RF choke, the second injection point RF choke, or the at least one RF choke provide an RF blocking impedance of at least 500 Ohm. The first injection point RF choke, the second injection point RF choke, or the at least one RF choke, may be, for example, a solenoid style inductor or toroidal style inductor.

In one embodiment of the single-layer MRI RF coil array, the single-layer MRI RF coil array element further comprises a Tx field monitoring component. The Tx field monitoring component is configured to, upon the single-layer MRI RF coil array element operating in Tx mode, monitor the strength of the local amplified Tx field. The Tx field monitoring component is further configured to, upon detecting that the strength of the local amplified Tx field exceeds a threshold value, output a signal to terminate the Tx mode.

In this embodiment, the Tx field monitoring component includes a pickup loop, an attenuator, an RF switch, and a current/voltage monitor. The pickup loop is inductively coupled to the LC coil. The local amplified Tx field induces a voltage or current in the pickup loop. The pickup loop outputs a signal based, at least in part, on the induced voltage or current. The attenuator is connected in series between the pickup loop and the RF switch. The attenuator reduces the power of an induced current or voltage produced by the pickup loop. The RF switch is connected in series between the attenuator and the current/voltage monitor. The RF switch controls the Tx field monitoring component to operate during Tx mode. The current/voltage monitor is configured to, upon determining that the induced voltage or current in the pickup loop exceeds a threshold level, generate a signal to terminate the Tx mode. The current/voltage monitor determines that the induced voltage or current exceeds a threshold level based, at least in part, on the signal output by the pickup loop.

Figure 23:
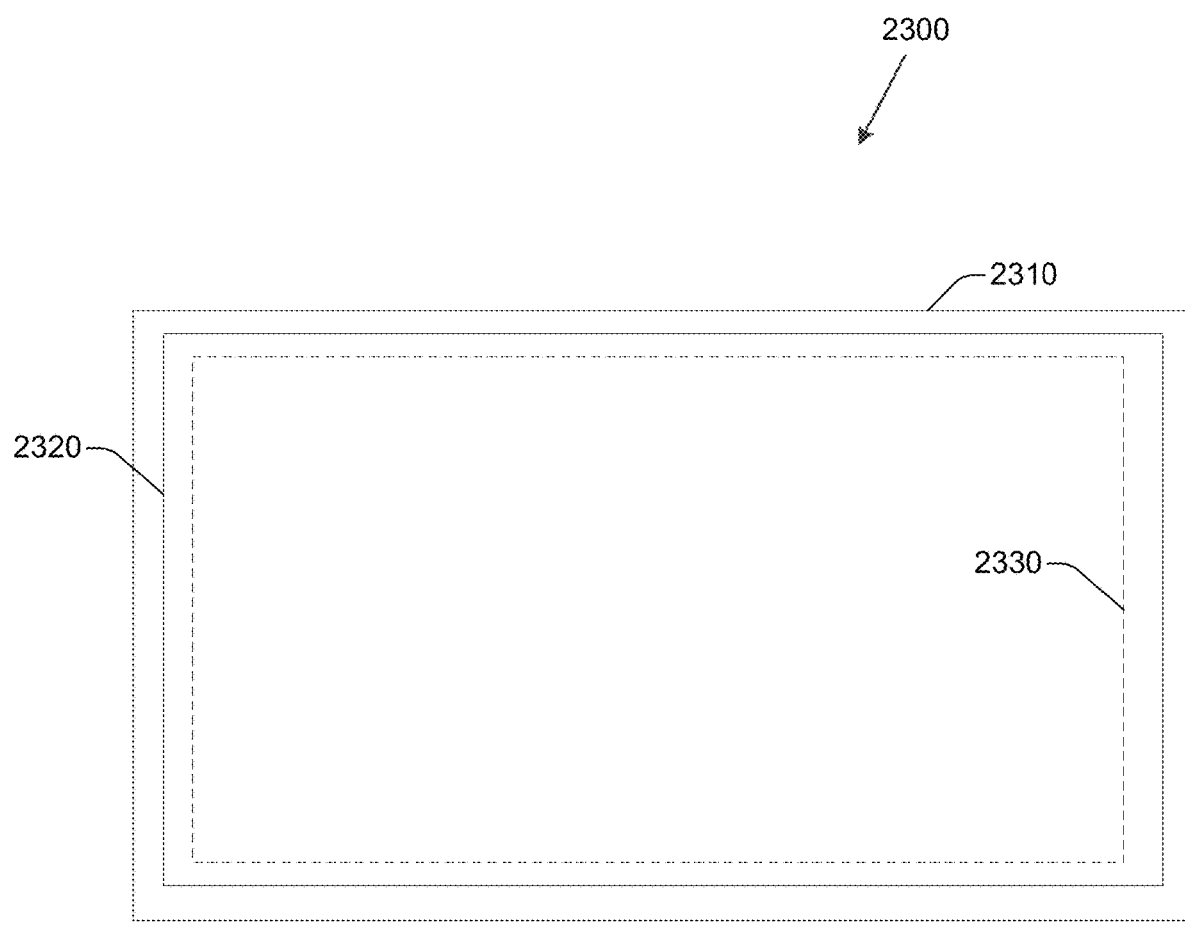
FIG. 23 illustrates an example MRI RF coil assembly.

Embodiments described herein include an MRI RF coil assembly configured to operate in a Tx mode or an Rx mode. FIG. 23 is a simplified illustration an example MRI RF coil assembly 2300 configured to operate in a Tx mode or an Rx mode. The MRI RF coil assembly 2300 illustrated in FIG. 23 is schematically simplified in this illustration as a rectangle. The MRI RF coil assembly 2300 includes a single-layer MRI RF coil array 2310, and a localized $B_0$ field shim set 2320. The MRI RF coil assembly 2300 is configured to operate in an MRI system, and may be placed within the bore of a basic field magnet that is part of the MRI system. MRI RF coil assembly 2300 defines a volume 2330 in which a region of tissue to be imaged may be placed.

In this embodiment, the single-layer MRI RF coil array 2310 includes at least one single-layer MRI RF coil array element. The at least one single-layer MRI RF coil array element may be, for example, single-layer MRI RF coil array element 600, 800, 900, 1000, 1100, 1200, 2000, 2100, or 2200. Upon the at least one single-layer MRI RF coil array element resonating with a primary coil, the single-layer MRI RF coil array 2310 generates a local amplified Tx field based on an induced current in the at least one single-layer MRI RF coil array element. The induced current is generated by inductive coupling between the at least one single-layer MRI RF coil array element and the primary coil.

The MRI RF coil assembly 2300 also includes a localized $B_0$ field shim set 2320. The localized $B_0$ field shim set 2320 is mounted within a housing of the single-layer MRI RF coil array 2310. The localized $B_0$ field shim set 2320 may be connected to a power supply configured to supply a DC $B_0$ shimming current (not illustrated). The localized $B_0$ field shim set 2320 is configured to generate a localized $B_0$ magnetic field upon injection of a DC $B_0$ shimming current into the localized $B_0$ field shim set 2320. In one embodiment, the DC $B_0$ shimming current has a value based on the design of the localized $B_0$ field shim set 2320. For example, if localized $B_0$ field shim set 2320 includes a 10 turn coil, then only 100 mA are required to achieve a 1 A equivalent shim coil.

Figure 24:
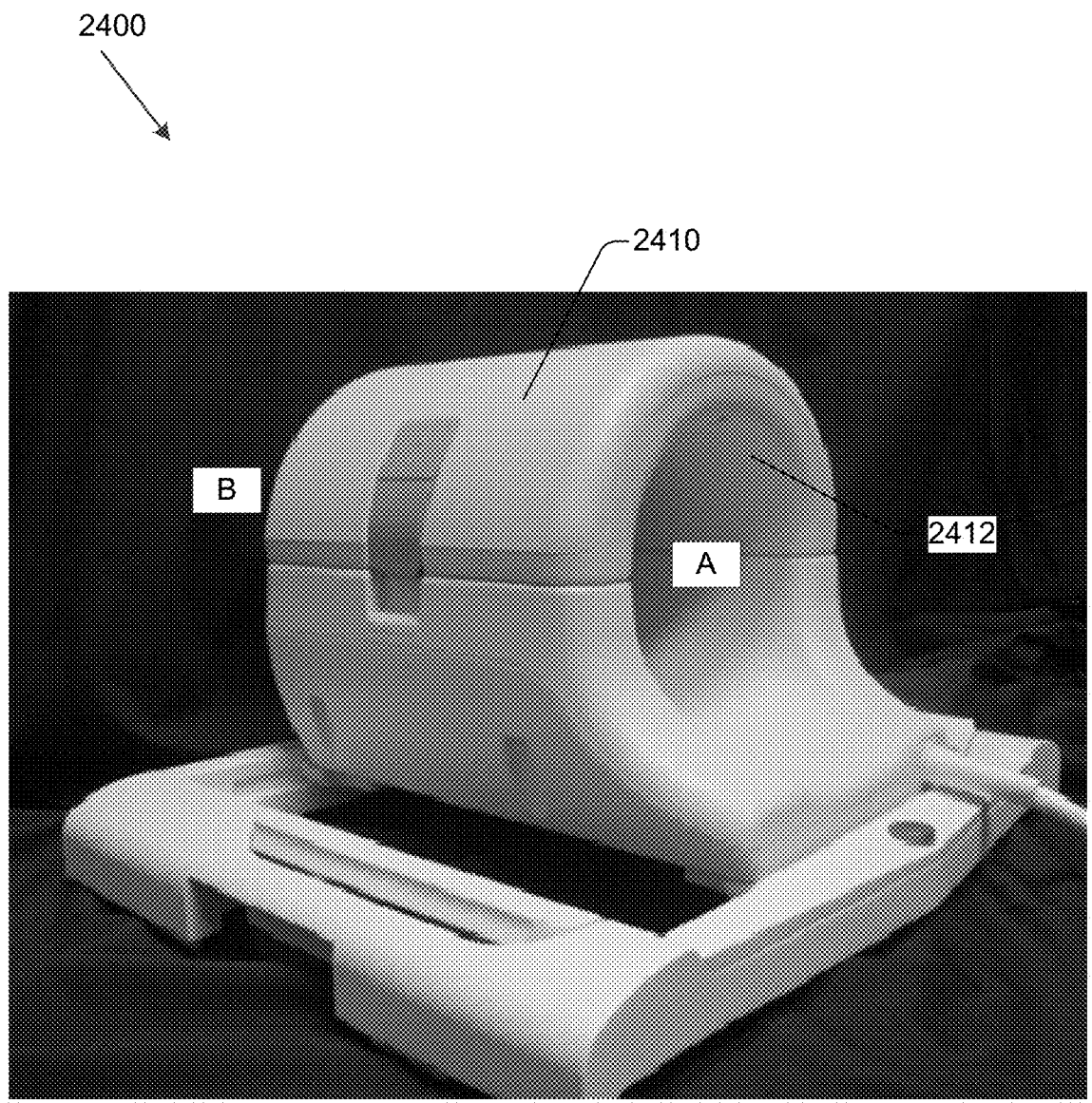
FIG. 24 illustrates an example MRI RF coil assembly.

In one embodiment of MRI RF coil assembly 2300, the housing has a substantially cylindrical shape having and inner surface and an outer surface. In this embodiment, the inner surface defines an inner circumference and the outer surface defines an outer circumference. A substantially cylindrical shape may include, for example, a cylindrical shape having a constant diameter. The housing may have other shapes. For example, the housing may include a truncated cone shape having a first diameter at a first end, and second, different diameter at a second, different end, where the ratio between the first diameter and the second diameter is, for example 1:0.9, or other ratio suitable for conforming to a region of tissue to be imaged. The housing may include, for example, a truncated elliptical shape having a first diameter at a first end, a second, larger diameter at the minor axis, and the first diameter at a second end. FIG. 24 illustrates an exemplary MRI RF coil assembly 2400 that demonstrates a housing having a substantially cylindrical shape. The housing has a first end A having a first diameter (e.g., X cm), and second end B that has a diameter that is the same as the first diameter (e.g., X cm). The housing has an outer surface 2410 and an inner surface 2412. The inner surface 2410 and the outer surface 2412 define a volume in which an MRI RF coil array (e.g. single-layer MRI RF coil array 2310) and a $B_0$ field shim set (e.g. $B_0$ field shim set 2320) may be housed. While the housing illustrated in FIG. 24 has a substantially cylindrical shape, embodiments described herein are not limited to the substantially cylindrical shape illustrated, and may include housings having other shapes configured to conform to different regions of human anatomy.

In one embodiment of MRI RF coil assembly 2300, the localized $B_0$ field shim set 2320 includes a plurality of shim coils having at least one order. For example, the localized $B_0$ field shim set 2320 may include first order, second order, or third order shim coils. A member of the plurality of shim coils has a number of turns. The magnitude of the DC shimming current may be based on the number of turns. In one embodiment, the localized $B_0$ field shim set 2320 is decoupled from the primary coil during Tx mode by at least one RF choke. The at least one RF choke effectively does not allow RF energy to flow through the shim coils during Tx mode, and thus prevents the localized $B_0$ field shim set 2320 from disrupting the spatial characteristics of the $B_1$ transmit field generated by single-layer MRI RF coil array 2310. In one embodiment, the at least one RF choke is a toroidal air core choke or solenoidal air core choke having a blocking impedance of at least 500 Ohm. In another embodiment, the at least one RF choke may have a different blocking impedance (e.g., 300 Ohm, 400 Ohm).

In one embodiment of MRI RF coil assembly 2300, the localized $B_0$ field shim set 2320 may be mounted on an outer surface of the single-layer MRI RF coil array 2310 without a spatial gap. In another embodiment, the localized $B_0$ field shim set 2320 may be mounted less than a threshold level of spatial gap from the outer surface of the single-layer MRI RF coil array 2310. For example, the localized $B_0$ field shim set 2320 may be mounted with a spatial gap of 1 mm, 2 mm, 3 mm, or other distance from the outer surface of the single-layer MRI RF coil array 2310. In another embodiment, the localized $B_0$ field shim set 2320 may be mounted on an inner surface of the single-layer MRI RF coil array 2310.

Figure 25:
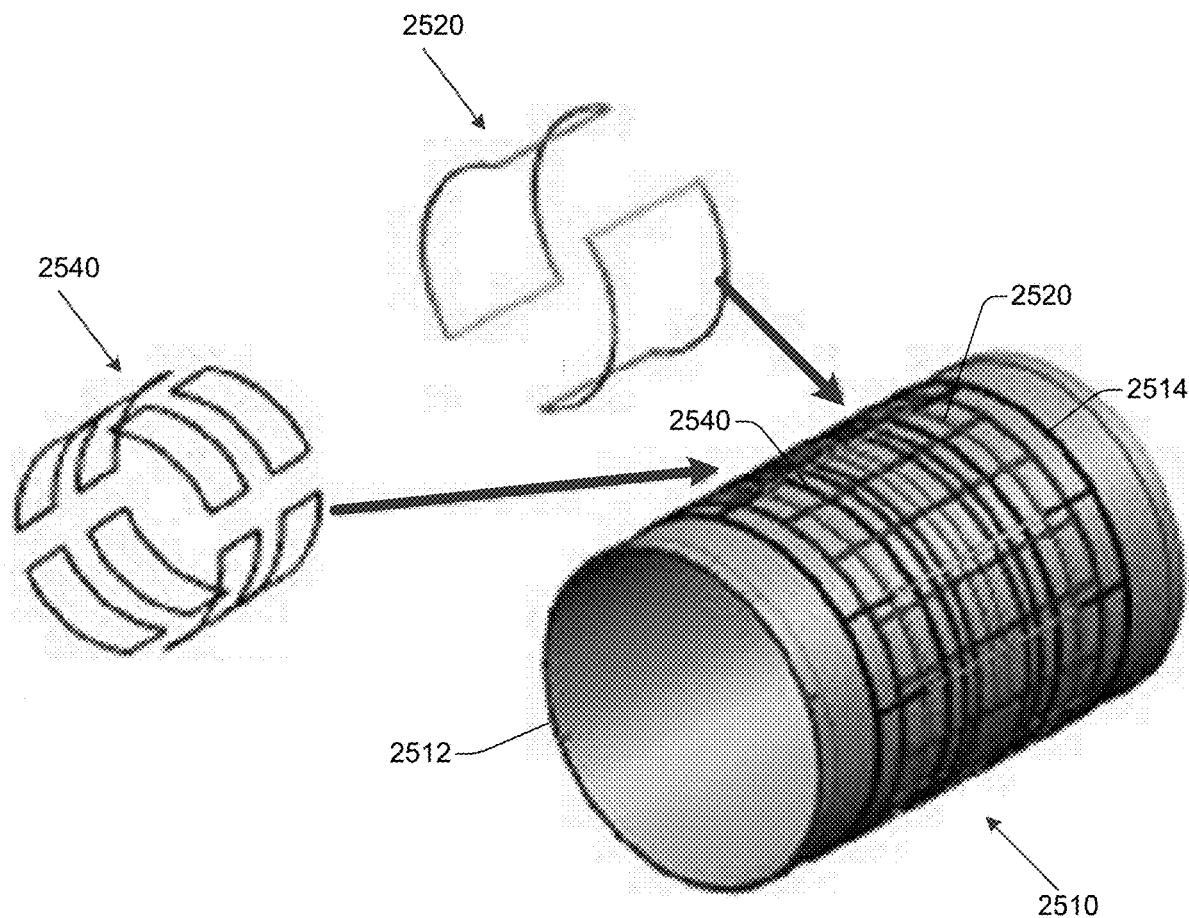
FIG. 25 illustrates an example single-layer MRI RF coil array configured with a localized $B_0$ field shim set.

FIG. 25 is an illustration of an example single-layer MRI RF coil array 2510 configured with a localized $B_0$ field shim set. In this example, single-layer MRI RF coil array 2510 includes a former 2512. In this example, former 2512 has a substantially cylindrical shape, while in other embodiments, former 2512 may have a different shape. Former 2512 may be configured to conform to a region of human anatomy (e.g., arm, leg, wrist). Single-layer MRI RF coil array 2510 also includes a plurality of single-layer MRI RF coil array elements 2514. Single-layer MRI RF coil array elements 2514 are disposed on the outer surface of former 2512. FIG.

25 also illustrates an $X^2-X^2$ type shim 2540 and a ZY type shim 2520. $X^2-X^2$ type shim 2540 and ZY type shim 2520 may form the localized $B_0$ field shim set. While $X^2-X^2$ type shim 2540 and ZY type shim 2520 are illustrated, embodiments may include other shim types, or other orders of shims, including, for example, Z, Z2, or Z3 type shims, or XY, YZ, or ZXY type shims. In one embodiment, elements of the $B_0$ field shim set (e.g., $X^2-X^2$ type shim 2540 and ZY type shim 2520) may be constructed from wire, ultrathin wire, or may be printed.

Figure 26:
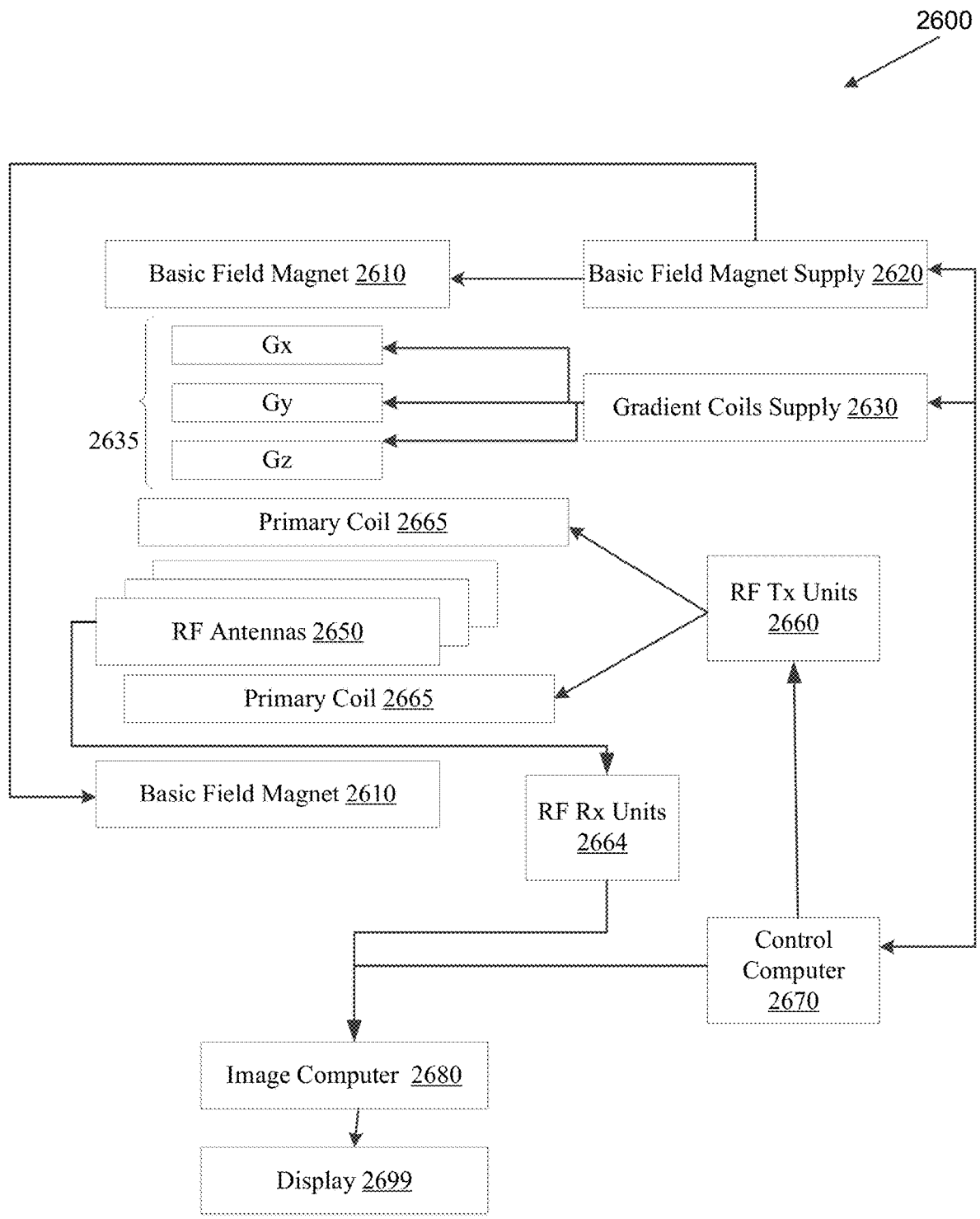
FIG. 26 illustrates an example MRI apparatus.

FIG. 26 illustrates an example MRI apparatus 2600 configured with a set of example single-layer MRI RF coils. Apparatus 2600 includes a basic field magnet(s) 2610 and a basic field magnet supply 2620. Ideally, the basic field magnets 2610 would produce a uniform $B_0$ field. However, in practice, the $B_0$ field may not be uniform (i.e., may have various inhomogeneities) and may vary over an object being imaged by the MRI apparatus 2600. MRI apparatus 2600 may include gradient coils 2635 configured to emit gradient magnetic fields like $G_x$, $G_y$ and $G_z$. The gradient coils 2635 may be controlled, at least in part, by a gradient coils supply 2630. In some examples, the timing, strength, and orientation of the gradient magnetic fields may be controlled, and thus selectively adapted during an MRI procedure.

MRI apparatus 2600 may include a primary coil 2665 configured to generate RF pulses. The primary coil 2665 may be a whole body coil. The primary coil 2665 may be, for example, a birdcage coil. The primary coil 2665 may be controlled, at least in part, by an RF transmission unit 2660. RF transmission unit 2660 may provide a signal to primary coil 2665.

MRI apparatus 2600 may include a set of RF antennas 2650 that are configured to inductively couple with primary coil 2665 and generate RF pulses and to receive resulting magnetic resonance signals from an object to which the RF pulses are directed. In one embodiment, a member of the set of RF antennas 2650 may be fabricated from flexible coaxial cable. The set of RF antennas 2650 may be connected with an RF receive unit 2664.

The gradient coils supply 2630 and the RF transmission units 2660 may be controlled, at least in part, by a control computer 2670. The magnetic resonance signals received from the set of RF antennas 2650 can be employed to generate an image, and thus may be subject to a transformation process like a two dimensional fast Fourier transform (FFT) that generates pixilated image data. The transformation can be performed by an image computer 2680 or other similar processing device. The image data may then be shown on a display 2699. RF Rx Units 2664 may be connected with control computer 2670 or image computer 2680. While FIG. 26 illustrates an example MRI apparatus 2600 that includes various components connected in various ways, it is to be appreciated that other MRI apparatus may include other components connected in other ways.

In one example, MRI apparatus 2600 may include control computer 2670. In one example, a member of the set of RF antennas 2650 may be individually controllable by the control computer 2670. A member of the set of RF antennas 2650 may be an example single-layer MRI RF coil element, or an example single-layer MRI RF coil array. A member of the set of RF antennas 2650 may be configured to provide integrated $B_0$ field shimming using techniques described herein. For example, single-layer MRI RF coil elements 600, 800, 900-1500, 2000, 2100, or 2200 may be implemented as part of RF antennas 2650 illustrated in FIG. 21. In another embodiment, RF antennas 2650 may include single-layer MRI RF coil assembly 2300. In another embodiment, the set of RF antennas 2650 may include other, different combinations of example embodiments of single-layer MRI RF coil elements or example embodiments of single-layer MRF RF coil arrays. The magnitude and phase of an induced current in members of RF antennas 2650, including individual coil array elements, may be independently adjustable according to embodiments described herein. Independently adjusting the magnitude and phase of an induced current in members of RF antennas 2650 facilitates adjusting the value of a Tx field generated by RF antennas 2650.

An MRI apparatus may include, among other components, a controller (e.g., control computer 2670) and an RF coil operably connected to the controller. The controller may provide the RF coil with a current, a voltage, or a control signal. The coil may be a whole body coil. The coil may inductively couple with an example single-layer MRI RF coil array element or single-layer MRI coil array, as described herein, including single-layer MRI RF coil element 600, 800, 900-1500, 2000, 2100, or 2200, or single-layer MRI coil assembly 2300. The control signal may, in one embodiment, control a power supply configured to provide a DC $B_0$ field shimming current to a member of RF antennas 2650 to provide $B_0$ field shimming.

The control signal may, in one embodiment, control a Tx field monitoring component (e.g., Tx field monitoring component 2210) to monitor the strength or phase of the local amplified Tx field. Upon detecting that the strength of the local amplified Tx field exceeds a threshold value, or upon detecting that the phase difference of the local amplified Tx field exceeds a threshold value, embodiments may control the MRI apparatus to terminate the Tx mode. Control computer 2670 may be configured to receive a signal from a Tx field monitoring component, or to control the operation of the Tx field monitoring component.

Circuits, apparatus, elements, MRI RF coils, arrays, assemblies, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the invention. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Circuit", as used herein, includes but is not limited to hardware, firmware, or combinations of each to perform a function(s) or an action(s), or to cause a function or action from another circuit, logic, method, or system. Circuit may include a software controlled microprocessor, a discrete logic (e.g., ASIC), an analog circuit, a digital circuit, a programmed logic device, a memory device containing instructions, and other physical devices. A circuit may include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

What is claimed is:

1. A single-layer magnetic resonance imaging (MRI) radio frequency (RF) coil array element configured to operate in a transmit (Tx) mode and a receive (Rx) mode, the single-layer MRI RF coil array element comprising:
   an LC coil;
   a matching and Tx/Rx switch circuit operably connected to the LC coil;
   a preamplifier operably connected to the matching and Tx/Rx circuit; and
   a magnitude/phase control component operably connected to the LC coil;
   where the LC coil includes:
      at least one inductor, at least one capacitor, and at least one RF choke, where the at least one inductor and the at least one capacitor resonate at a first frequency, and where the at least one RF choke is connected in parallel with the at least one capacitor, where the at least one RF choke connected in parallel with the at least one capacitor, and the at least one inductor, provide a current path for a DC $B_0$ shimming current;
      a first injection point capacitor having a first terminal and a second terminal, where a first injection point RF choke is connected at a first end to the first terminal, and where a second injection point RF choke is connected at a first end to the second terminal;
   where the matching and Tx/Rx switch circuit, when operating in Tx mode, electrically isolates the LC coil from the preamplifier upon the LC coil resonating with a primary coil, where the primary coil has a working frequency;
   where the LC coil, upon resonating with the primary coil, generates a local amplified Tx field based on an induced current in the LC coil, the induced current generated by inductive coupling between the LC coil and the primary coil;
   where a magnitude of the induced current or a phase of the induced current is independently adjustable;
   where the magnitude of the induced current or the phase of the induced current is configured to be varied over a range of magnitudes or phases respectively;
   where the matching and Tx/Rx switch circuit, when operating in Rx mode, electrically connects the LC coil with the preamplifier;
   where the magnitude/phase control component is configured to adjust the magnitude of the induced current or the phase of the induced current; and
   where, upon a DC $B_0$ shimming current being injected into the LC coil through the first injection point RF choke or the second injection point RF choke, the DC $B_0$ shimming current flowing through the LC coil generates a local $B_0$ magnetic field for $B_0$ field shimming.

2. The single-layer MRI RF coil array element of claim 1, where the first injection point RF choke, the second injection point RF choke, or the at least one RF choke provide an RF blocking impedance of at least 500 Ohm.

3. The single-layer MRI RF coil array element of claim 1, where the first injection point RF choke, the second injection point RF choke, or the at least one RF choke, is a large value inductor.

4. The single-layer MRI RF coil array element of claim 1, where the first injection point RF choke, the second injection point RF choke, or the at least one RF choke, is a small value inductor connected in parallel with a capacitor.

5. The single-layer MRI RF coil array element of claim 1, further comprising a Tx field monitoring component configured to:
   upon the single-layer MRI RF coil array element operating in Tx mode:
      monitor the strength or phase of the local amplified Tx field; and
      upon detecting that the strength of the local amplified Tx field exceeds a threshold value or that the phase difference of the phase of the local amplified Tx field exceeds a threshold value:
         output a signal to terminate the Tx mode.

6. The single-layer MRI RF coil array element of claim 5, where the Tx field monitoring component comprises:
- a pickup loop;
- an RF switch; and
- a current/voltage monitor;
- where the pickup loop is inductively coupled to the LC coil, where the local amplified Tx field induces a voltage or current in the pickup loop, where the pickup loop outputs a signal based, at least in part, on the induced voltage or current in the pickup loop;
- where the RF switch is connected in series between the pickup loop and the current/voltage monitor, where the RF switch controls the Tx field monitoring component to operate during Tx mode; and
- where the current/voltage monitor is configured to, upon determining that the induced voltage or current in the pickup loop exceeds a threshold level, or that the phase difference of the induced current in the pickup loop exceeds a threshold value, generate a signal to terminate the Tx mode, where the current/voltage monitor determines that the induced voltage or current in the pickup loop exceeds a threshold level, or that the phase difference of the induced current in the pickup loop exceeds a threshold value, based, at least in part, on the signal output by the pickup loop.

7. The single-layer MRI RF coil array element of claim 6, where the pickup loop is a butterfly pickup loop, a single turn loop, or an N turn solenoid loop, N being a number greater than zero.

8. The single-layer MRI RF coil array element of claim 6, the Tx field monitoring component further comprising an attenuator connected in series between the pickup loop and the RF switch.

9. The single-layer MRI RF coil array element of claim 1, where the magnitude/phase control component is configured to, upon the single-layer MRI RF coil array element operating in Tx mode, adjust the magnitude of the induced current or the phase of the induced current by controlling a coil loss resistance of the primary coil, a coil loss resistance of the single-layer MRI RF coil array element, or a difference between the working frequency of the primary coil and the first frequency.

10. The single-layer MRI RF coil array element of claim 9, where the magnitude of the induced current or a phase of the induced current is a function of a coil loss resistance of the primary coil, a coil loss resistance of the single-layer MRI RF coil array element, or a difference between the working frequency of the primary coil and the first frequency, and where the magnitude/phase control component is configured to adjust the magnitude of the induced current or the phase of the induced current by adjusting at least one of a coil loss resistance of the primary coil, a coil loss resistance of the single-layer MRI RF coil array element, or a difference between the working frequency of the primary coil and the first frequency.

11. The single-layer MRI RF coil array element of claim 1, where the matching and Tx/Rx switch circuit is a capacitive matching and Tx/Rx switch circuit.

12. The single-layer MRI RF coil array element of claim 1, where the matching and Tx/Rx switch circuit is an inductive matching and Tx/Rx switch circuit.

13. The single-layer MRI RF coil array element of claim 12, where the LC coil further comprises an RF choke connected in parallel across the inductive matching and Tx/Rx switch circuit, where the RF choke connected in parallel across the inductive matching and Tx/Rx switch circuit provides a current path for the DC $B_0$ shimming current.

14. The single-layer MRI RF coil array element of claim 1, where the LC coil includes at least one conductor, where the at least one conductor is a flexible co-axial cable.

15. A single-layer magnetic resonance imaging (MRI) radio frequency (RF) coil array configured to operate in a transmit (Tx) mode or in a receive (Rx) mode, the coil array comprising:
- a plurality of single-layer MRI RF coil array elements, a single-layer MRI RF coil array element comprising:
  - an LC coil;
  - a matching and Tx/Rx switch circuit operably connected to the LC coil;
  - a preamplifier operably connected to the matching and Tx/Rx circuit; and
  - a magnitude/phase control component operably connected to the LC coil;
  - where the LC coil includes:
    - at least one inductor, at least one capacitor, and at least one RF choke, where the at least one inductor and the at least one capacitor resonate at a first frequency, and where the at least one RF choke is connected in parallel with the at least one capacitor, where the at least one RF choke connected in parallel with the at least one capacitor and the at least one inductor provide a current path for a DC $B_0$ shimming current;
    - a first injection point capacitor having a first terminal and a second terminal, where a first injection point RF choke is connected at a first end to the first terminal, and a second injection point RF choke is connected at a first end to the second terminal;
  - where the matching and Tx/Rx switch circuit, when operating in Tx mode, electrically isolates the LC coil from the preamplifier upon the LC coil resonating with a primary coil, where the primary coil has a working frequency;
  - where the LC coil, upon resonating with the primary coil, generates a local amplified Tx field based on an induced current in the LC coil, the induced current generated by inductive coupling between the LC coil and the primary coil;
  - where a magnitude of the induced current or a phase of the induced current is independently adjustable;
  - where the magnitude of the induced current or the phase of the induced current is configured to be varied over a range of magnitudes or phases respectively;
  - where the matching and Tx/Rx switch circuit, when operating in Rx mode, electrically connects the LC coil with the preamplifier;
  - where the magnitude/phase control component is configured to adjust the magnitude of the induced current or the phase of the induced current; and
  - where, upon a DC $B_0$ shimming current being injected into the LC coil through the first injection point RF choke or the second injection point RF choke, the DC $B_0$ shimming current flowing through the LC coil generates a local $B_0$ magnetic field for $B_0$ field shimming.

16. The single-layer MRI RF coil array of claim 15, where the first injection point RF choke, the second injection point RF choke, or the at least one RF choke provide an RF blocking impedance of at least 500 Ohm.

17. The single-layer MRI RF coil array element of claim 16, where the first injection point RF choke, the second injection point RF choke, or the at least one RF choke, is a large value solenoidal or toroidal inductor, or a small value inductor connected in parallel with a capacitor which resonates with the inductor at the working frequency.

18. The single-layer MRI RF coil array of claim 15, where the single-layer MRI RF coil array element further comprises a Tx field monitoring component configured to, upon the single-layer MRI RF coil array element operating in Tx mode:
  monitor the strength or phase of the local amplified Tx field; and
  upon detecting that the strength of the local amplified Tx field exceeds a threshold value, or that the phase difference of the local amplified Tx field exceeds a threshold value:
    output a signal to terminate the Tx mode.

19. The single-layer MRI RF coil array of claim 18, where the Tx field monitoring component comprises:
  a pickup loop;
  an RF switch; and
  a current/voltage monitor;
  where the pickup loop is inductively coupled to the LC coil, where the local amplified Tx field induces a voltage or current in the pickup loop, where the pickup loop outputs a signal based, at least in part, on the induced voltage or current;
  where the RF switch is connected in series between the pickup loop and the current/voltage monitor, where the RF switch controls the Tx field monitoring component to operate during Tx mode; and
  where the current/voltage monitor is configured to, upon determining that the induced voltage or current in the pickup loop exceeds a threshold level, or that the phase difference of the induced voltage or current in the pickup loop exceeds a threshold level, generate a signal to terminate the Tx mode, where the current/voltage monitor determines that the induced voltage or current, or phase difference, exceeds a threshold level based, at least in part, on the signal output by the pickup loop.

20. The single-layer MRI RF coil array of claim 19, where the Tx field monitoring component further comprises an attenuator connected in series between the pickup loop and the RF switch.

21. A magnetic resonance imaging (MRI) radio frequency (RF) coil assembly comprising:
  a single-layer MRI RF coil array configured to operate in a transmit (Tx) mode or a receive (Rx) mode, the single-layer MRI RF coil array comprising at least one single-layer MRI RF coil array element, where, upon the at least one single-layer MRI RF coil array element resonating with a primary coil, the at least one single-layer MRI RF coil array element generates a local amplified Tx field based on an induced current in the at least one single-layer MRI RF coil array element, where the induced current is generated by inductive coupling between the at least one single-layer MRI RF coil array element and the primary coil; and
  a localized $B_0$ field shim set arranged within a housing of the single-layer MRI RF coil array;
  where the localized $B_0$ field shim set is configured to generate a localized $B_0$ magnetic field upon injection of a DC shimming current into the localized $B_0$ field shim set.

22. The MRI RF coil assembly of claim 21, the housing having a substantially cylindrical shape having an inner surface and an outer surface, where the inner surface defines an inner circumference and the outer surface defines an outer circumference.

23. The MRI RF coil assembly of claim 21, where the localized $B_0$ field shim set includes a plurality of shim coils having at least one order.

24. The MRI RF coil assembly of claim 23, where the localized $B_0$ field shim set is decoupled from the primary coil during Tx mode by at least one RF choke.

25. The MRI RF coil assembly of claim 24, where the at least one RF choke is a toroidal air core choke having a blocking impedance of at least 500 Ohm.

26. The MRI RF coil assembly of claim 21, where the localized $B_0$ field shim set is mounted on an outer surface of the single-layer MRI RF coil array without a spatial gap, or within less than a threshold spatial gap from the outer surface of the single-layer MRI RF coil array.

27. The MRI RF coil assembly of claim 21, where the DC shimming current has a value of less than 1 A.

28. The MRI RF coil assembly of claim 21, where the at least one single-layer MRI RF coil array element includes a Tx field monitoring component configured to, upon the single-layer MRI RF coil array element operating in Tx mode:
  monitor the strength or phase of the local amplified Tx field; and
  upon detecting that the strength or phase difference of the local amplified Tx field exceeds a threshold value:
    output a signal to terminate the Tx mode.

29. A magnetic resonance imaging (MRI) apparatus, comprising:
  a controller;
  a primary coil connected to the controller; and
  a single-layer MRI radio frequency (RF) coil array operably connected to the controller, where the single-layer MRI RF coil array is configured to operate in a transmit (Tx) or a receive (Rx) mode, where the MRI RF coil array includes at least one RF coil element;
  where the controller provides the primary coil with a current, a voltage, or a control signal, and
  where a member of the at least one RF coil element comprises:
    an LC coil;
    a matching and Tx/Rx switch circuit operably connected to the LC coil;
    a preamplifier operably connected to the matching and Tx/Rx circuit; and
    a magnitude/phase control component operably connected to the LC coil;
    where the LC coil includes:
      at least one inductor, at least one capacitor, and at least one RF choke connected in parallel with the at least one capacitor, where the at least one inductor and the at least one capacitor resonate at a first frequency, where the at least one RF choke connected in parallel with the at least one capacitor and the at least one inductor provide a current path for a DC $B_0$ shimming current;
      a first injection point capacitor having a first terminal and a second terminal, where a first injection point RF choke is connected at a first end to the first terminal, and a second injection point RF choke is connected at a first end to the second terminal;
    where the matching and Tx/Rx switch circuit, when operating in Tx mode, electrically isolates the LC coil from the preamplifier upon the LC coil resonating with a primary coil, where the primary coil has a working frequency;

where the LC coil, upon resonating with the primary coil, generates a local amplified Tx field based on an induced current in the LC coil, the induced current generated by inductive coupling between the LC coil and the primary coil;

where a magnitude of the induced current or a phase of the induced current is independently adjustable;

where the magnitude of the induced current or the phase of the induced current is configured to be varied over a range of magnitudes or phases respectively;

where the matching and Tx/Rx switch circuit, when operating in Rx mode, electrically connects the LC coil with the preamplifier;

where the magnitude/phase control component is configured to adjust the magnitude of the induced current or the phase of the induced current; and where, upon a DC $B_0$ shimming current being injected into the LC coil through the first injection point RF choke or the second injection point RF choke, the DC $B_0$ shimming current flowing through the LC coil generates a local $B_0$ magnetic field for $B_0$ field shimming.

30. The MRI apparatus of claim 29, where a member of the at least one RF coil element further comprises:

a Tx field monitoring component operably connected to the LC coil, where the Tx field monitoring component is configured to:

upon the member of the at least one RF coil element operating in Tx mode:

monitor the strength or phase of the local amplified Tx field; and upon detecting that the strength of the local amplified Tx field exceeds a threshold value or that the phase difference of the local amplified Tx field exceeds a threshold value:

control the MRI apparatus to terminate the Tx mode.

* * * * *